US012073044B2

(12) United States Patent
Lee

(10) Patent No.: US 12,073,044 B2
(45) Date of Patent: Aug. 27, 2024

(54) TO EXTRACT MULTIPLE SIGNAL LINES FROM MULTIPLE SWITCH GROUPS SIMULTANEOUSLY USING ONE DECODER

(71) Applicant: Sung Ho Lee, Seogwipo-si (KR)

(72) Inventor: Sung Ho Lee, Seogwipo-si (KR)

(73) Assignee: Sung Ho Lee, Seogwipo-si (KR)

( * ) Notice: Subject to any disclaimer, the term of this patent is extended or adjusted under 35 U.S.C. 154(b) by 0 days.

(21) Appl. No.: 18/232,826

(22) Filed: Aug. 11, 2023

(65) Prior Publication Data

US 2023/0384890 A1 Nov. 30, 2023

Related U.S. Application Data

(63) Continuation of application No. PCT/KR2022/001318, filed on Jan. 25, 2022.

(30) Foreign Application Priority Data

Feb. 13, 2021 (KR) .................. 10-2021-0019570

(51) Int. Cl.
G06F 3/041 (2006.01)
G06F 3/044 (2006.01)

(52) U.S. Cl.
CPC ........ *G06F 3/04166* (2019.05); *G06F 3/0412* (2013.01); *G06F 3/04164* (2019.05); *G06F 3/0443* (2019.05); *G06F 3/0446* (2019.05); G06F 2203/04107 (2013.01)

(58) Field of Classification Search
CPC ............. G06F 3/04166; G06F 3/0412; G06F 3/04164; G06F 3/0443; G06F 3/0446; G06F 2203/04107; G06F 3/041; G06F 3/044; H03K 17/96
See application file for complete search history.

(56) References Cited

U.S. PATENT DOCUMENTS 9,448,664 B2 * 9/2016 Kim .................. G06F 3/0443
9,507,467 B2 * 11/2016 Lee ..................... G06F 3/045
2012/0319966 A1 * 12/2012 Reynolds ............ G06F 3/04164
345/173

(Continued)

FOREIGN PATENT DOCUMENTS

JP 2018-101281 A 6/2018
KR 10-1085086 B1 11/2011
(Continued)

OTHER PUBLICATIONS

WIPO, International Search Report and International Written Opinion for International Application No. PCT/KR2022/001318, May 4, 2022., 10 pages.

(Continued)

*Primary Examiner* — Amy Onyekaba
(74) *Attorney, Agent, or Firm* — Nicholas Park

(57) ABSTRACT

The present invention operates multiple capacitors to minimize the fluctuation of voltage detected on the CDA signal line 200, thereby enhancing the resolution of the ADC. The object capacitance (Cobj) generated between the CDA 100 and the object 20 due to the appearance of the object 20 is detected in the form of voltage. By analyzing with an ADC of improved resolution, it is possible to detect the presence of the object 20 more reliably.

23 Claims, 32 Drawing Sheets

(56) References Cited

U.S. PATENT DOCUMENTS

| | | | |
|---|---|---|---|
| 2013/0181946 A1* | 7/2013 | Lee | G06F 3/0445 345/174 |
| 2014/0152621 A1* | 6/2014 | Okayama | G06F 3/04182 345/174 |
| 2015/0123933 A1* | 5/2015 | Jang | G06F 3/04166 345/174 |
| 2016/0054846 A1* | 2/2016 | Lee | G06F 3/04164 345/174 |
| 2016/0170529 A1* | 6/2016 | Lee | G06F 3/044 345/174 |
| 2016/0202820 A1* | 7/2016 | Ito | G06F 3/0412 345/173 |
| 2017/0168612 A1* | 6/2017 | Lee | G06F 3/04164 |
| 2017/0168650 A1* | 6/2017 | Lee | G06F 3/04166 |
| 2017/0285814 A1* | 10/2017 | Katsuta | G06F 3/04166 |
| 2019/0018541 A1* | 1/2019 | Han | H10K 59/40 |
| 2019/0384457 A1* | 12/2019 | Fujiyoshi | G06F 3/0446 |

FOREIGN PATENT DOCUMENTS

| | | |
|---|---|---|
| KR | 10-2013-0033562 A | 4/2013 |
| KR | 10-2014-0130970 A | 11/2014 |
| KR | 10-1566939 B1 | 11/2015 |
| KR | WO2016140456 * | 9/2016 |
| KR | 10-2018-0136800 A | 12/2018 |
| KR | 10-1963317 B1 | 3/2019 |
| KR | 10-2044476 B1 | 11/2019 |

OTHER PUBLICATIONS

Korean Intellectual Property Office, Office Action for Korean Application No. 10-2021-0019570, Jul. 30, 2021., 10 pages.
Korean Intellectual Property Office, Notice of Allowance for Korean Application No. 10-2021-0019570, May 31, 2022., 3 pages.
Korean Intellectual Property Office, Office Action for Korean Application No. 10-2021-0019570, Mar. 17, 2022., 4 pages.

* cited by examiner

FIG. 2

| Vd1 | Vd2 | Cd | Cprs | Ccm | Vp2-Vp1 |
|---|---|---|---|---|---|
| 0 | 5 | 13 | 8 | 1 | 2.955 |
| 0 | 5 | 14 | 10 | 2 | 2.692 |
| 0 | 5 | 15 | 12 | 1 | 2.679 |
| 0 | 5 | 16 | 14 | 2 | 2.500 |
| 0 | 5 | 17 | 8 | 1 | 3.269 |
| 0 | 5 | 18 | 10 | 2 | 3.000 |
| 0 | 5 | 19 | 12 | 1 | 2.969 |
| 0 | 5 | 20 | 14 | 2 | 2.778 |
| 0 | 5 | 21 | 8 | 1 | 3.500 |
| 0 | 5 | 22 | 10 | 2 | 3.235 |
| 0 | 5 | 23 | 12 | 1 | 3.194 |
| 0 | 5 | 24 | 14 | 2 | 3.000 |
| 0 | 5 | 25 | 8 | 1 | 3.676 |
| 0 | 5 | 26 | 10 | 2 | 3.421 |
| 0 | 5 | 27 | 12 | 1 | 3.375 |
| 0 | 5 | 28 | 14 | 2 | 3.182 |
| 0 | 5 | 29 | 8 | 1 | 3.816 |
| 0 | 5 | 30 | 10 | 2 | 3.571 |
| 0 | 5 | 31 | 12 | 1 | 3.523 |
| 0 | 5 | 32 | 14 | 2 | 3.333 |
| 0 | 5 | 33 | 8 | 1 | 3.929 |
| 0 | 5 | 34 | 10 | 2 | 3.696 |
| | | | | min | 2.500 |
| | | | | max | 3.929 |
| | | | | Δ≈ | 1.429 |

FIG. 13A

| Vd1,Vcin1 | Vcin2 | Vd2 | Cd | Cin_sd | Ccm | Cobj | Bi-direction Driving | | | One direction Driving | | |
|---|---|---|---|---|---|---|---|---|---|---|---|---|
| | | | | | | | Vp2-Vp1 | Vobj | ΔV | Vp2-Vp1 | Vobj | ΔV |
| 0 | 5 | 5 | 13 | 8 | 1 | 0.2 | 4.773 | 4.730 | 0.043 | 2.955 | 2.928 | 0.027 |
| 0 | 5 | 5 | 14 | 10 | 2 | 0.2 | 4.615 | 4.580 | 0.035 | 2.692 | 2.672 | 0.021 |
| 0 | 5 | 5 | 15 | 12 | 1 | 0.2 | 4.821 | 4.787 | 0.034 | 2.679 | 2.660 | 0.019 |
| 0 | 5 | 5 | 16 | 14 | 2 | 0.2 | 4.688 | 4.658 | 0.029 | 2.500 | 2.484 | 0.016 |
| 0 | 5 | 5 | 17 | 8 | 1 | 0.2 | 4.808 | 4.771 | 0.037 | 3.269 | 3.244 | 0.025 |
| 0 | 5 | 5 | 18 | 10 | 2 | 0.2 | 4.667 | 4.636 | 0.031 | 3.000 | 2.980 | 0.020 |
| 0 | 5 | 5 | 19 | 12 | 1 | 0.2 | 4.844 | 4.814 | 0.030 | 2.969 | 2.950 | 0.018 |
| 0 | 5 | 5 | 20 | 14 | 2 | 0.2 | 4.722 | 4.696 | 0.026 | 2.778 | 2.762 | 0.015 |
| 0 | 5 | 5 | 21 | 8 | 1 | 0.2 | 4.833 | 4.801 | 0.032 | 3.500 | 3.477 | 0.023 |
| 0 | 5 | 5 | 22 | 10 | 2 | 0.2 | 4.706 | 4.678 | 0.028 | 3.235 | 3.216 | 0.019 |
| 0 | 5 | 5 | 23 | 12 | 1 | 0.2 | 4.861 | 4.834 | 0.027 | 3.194 | 3.177 | 0.018 |
| 0 | 5 | 5 | 24 | 14 | 2 | 0.2 | 4.750 | 4.726 | 0.024 | 3.000 | 2.985 | 0.015 |
| 0 | 5 | 5 | 25 | 8 | 1 | 0.2 | 4.853 | 4.825 | 0.028 | 3.676 | 3.655 | 0.021 |
| 0 | 5 | 5 | 26 | 10 | 2 | 0.2 | 4.737 | 4.712 | 0.025 | 3.421 | 3.403 | 0.018 |
| 0 | 5 | 5 | 27 | 12 | 1 | 0.2 | 4.875 | 4.851 | 0.024 | 3.375 | 3.358 | 0.017 |
| 0 | 5 | 5 | 28 | 14 | 2 | 0.2 | 4.773 | 4.751 | 0.022 | 3.182 | 3.167 | 0.014 |
| 0 | 5 | 5 | 29 | 8 | 1 | 0.2 | 4.868 | 4.843 | 0.025 | 3.816 | 3.796 | 0.020 |
| 0 | 5 | 5 | 30 | 10 | 2 | 0.2 | 4.762 | 4.739 | 0.023 | 3.571 | 3.555 | 0.017 |
| 0 | 5 | 5 | 31 | 12 | 1 | 0.2 | 4.886 | 4.864 | 0.022 | 3.523 | 3.507 | 0.016 |
| 0 | 5 | 5 | 32 | 14 | 2 | 0.2 | 4.792 | 4.772 | 0.020 | 3.333 | 3.320 | 0.014 |
| 0 | 5 | 5 | 33 | 8 | 1 | 0.2 | 4.881 | 4.858 | 0.023 | 3.929 | 3.910 | 0.019 |
| 0 | 5 | 5 | 34 | 10 | 2 | 0.2 | 4.783 | 4.762 | 0.021 | 3.696 | 3.680 | 0.016 |
| | | | | | | min | 4.615 | 4.580 | 0.020 | 2.500 | 2.484 | 0.014 |
| | | | | | | max | 4.886 | 4.864 | 0.043 | 3.929 | 3.910 | 0.027 |
| | | | | | | Δ= | 0.271 | 0.284 | 0.023 | 1.429 | 1.425 | 0.013 |

FIG. 17

| DAC_r1c1 | DAC_r1c2 | DAC_r1c3 | DAC_r1c4 |
| --- | --- | --- | --- |
| DAC_r2c1 | DAC_r2c2 | DAC_r2c3 | DAC_r2c4 |
| DAC_r3c1 | DAC_r3c2 | DAC_r3c3 | DAC_r3c4 |

TO EXTRACT MULTIPLE SIGNAL LINES FROM MULTIPLE SWITCH GROUPS SIMULTANEOUSLY USING ONE DECODER

CROSS-REFERENCE TO RELATED APPLICATION

This application is a US Bypass Continuation Application of International Application No. PCT/KR2022/001318, filed on Jan. 25, 2022, which claims priority to and the benefit of Korean Patent Application No. 10-2021-0019570, filed on Feb. 13, 2021, the disclosure of which is incorporated herein by reference in its entirety.

BACKGROUND

Technical Field

The present invention relates to a device and method for detecting the capacitance added to a capacitive detection area connected to a sensing signal line by applying a driving signal simultaneously to a detection switch group and a driving switch group with a single decoder output and connecting and outputting multiple driving signal lines.

Furthermore, the invention involves a device that uses only one decoder to reduce decoder input signals and achieves the same effect as configuring multiple loaders that output detection signals from this device into one. This innovative approach minimizes the number of signal lines exchanged between the decoder or loader embedded in the display device and the semiconductor IC outside of the display device, simplifying the configuration of the display device module.

Background Art

In the past, a mechanical button was used to press a phone number on a mobile phone, but recently, input devices are changing from mechanical to electronic, such as entering a phone number just by lightly touching a finger on the display part of the mobile phone. As an example of the input device, a capacitive type of input device is mainly used.

The capacitive type of input device detects a change in capacitor that occurs when a finger or pen is adjacent to or in contact with the "capacitor detect area" placed on the upper surface of the display part and determines that the input of the corresponding position is valid as if a mechanical button is pressed.

FIG. 1 is an embodiment of the present invention related to modeling of a capacitive type of input device.

Referring to FIG. 1, Cd is "inter-line capacitor", and Cprs is "internal parasitic capacitor" formed between the detection (or Sensing) signal line and the semiconductor substrate inside the Semiconductor IC or the Sensing Signal Line and other signal lines, and Ccm is the "Common Electrode Capacitor" formed by facing the capacitor detect area and the display part, and one side of these three capacitors is connected in parallel to the point P indicated by the equivalent circuit of the Sensing Signal Line.

At this time, Vprs, the voltage supplied to the other side of "internal parasitic capacitor", is DC power, which is the potential of the semiconductor substrate, or AC potential due to noise from other coupled signal lines, and Vcm, which is a voltage supplied to the other side of "common electrode capacitor", is a pixel voltage, which is a DC voltage having some amplitude, and Vd, the voltage supplied to the other side of Cd is a driving voltage that changes in amplitude from Vd1 to Vd2 or from Vd2 to Vd1.

The voltage when the point P is stabilized by the voltages supplied to the three capacitors is defined as Vp, and the current flowing through Cd by the voltage Vd supplied to the inter-line capacitor Cd is defined as id, and defining that the current flowing through Cprs by the voltage Vprs supplied to the internal parasitic capacitor Cprs is iprs, and the current flowing through Ccm by the voltage Vcm supplied to the common electrode capacitor Ccm is icm, according to the Kirchhoff current law, id=iprs+icm.

Since it is $$id = Cd*(Vd-Vp), iprs = Cprs*(Vp-Vprs), icm = Ccm*(Vp-Vcm),$$

so is.

$$Cd*(Vd-Vp) = Cprs*(Vp-Vprs) + Ccm*(Vp-Vcm).$$

If this equation is arranged for Vp, it is $$Vp = \frac{Cd*Vd + Cprs*Vprs + Ccm*Vcm}{Cd + Cprs + Ccm}.$$

In the above equation, if the voltage Vd supplied to the inter-line capacitor Cd is replaced with Vd1, the voltage at the point P when Vd1 is applied is $$Vp1 = \frac{Cd*Vd1 + Cprs*Vprs + Ccm*Vcm}{Cd + Cprs + Ccm},$$

and the voltage at the point P when Vd2, which is a voltage greater than Vd1, is supplied to the inter-line capacitor Cd is $$Vp2 = \frac{Cd*Vd2 + Cprs*Vprs + Ccm*Vcm}{Cd + Cprs + Ccm}.$$

Therefore, Vp2−Vp1 detected at the connection point P when voltages of different amplitudes Vd1 and Vd2 are applied to the inter-line capacitor Cd is expressed by [Equation 1].

$$Vp2 - Vp1 = \frac{(Vd2 - Vd1)*Cd}{Cd + Cprs + Ccm} \quad \text{[Equation 1]}$$

FIG. 2 is a virtual data for verifying [Equation 1].

Referring to FIG. 2, it is Vd1=0V, Vd2=5V, and the inter-line capacitor Cd is set to increase from 13 pF to 34 pF. The internal parasitic capacitance Cprs is 8 to 14 pF cross-used, and the common electrode capacitance Ccm is 1 to 2 pF cross-used. When Vp2−Vp1 is calculated by substituting the data in FIG. 2 into [Equation 1], it can be seen that Max=3.929V and Min=2.5V, Max-Min=1.429V, as shown in FIG. 2.

Since it is appropriate to use a 10-bit ADC with a detection range of 1.6V to detect a voltage with a voltage range of 1.429V, if ADC_top and ADC_btm, which are bias voltages, of the ADC are 3V and 1.4V, respectively, the resolution of 10-bit ADC with a detection range of 1.6V is 1.6V/1024 bit, which is 1.56 mV/bit.

Referring to the lowermost data of One Direction Driving case of FIGS. 13A and 13B to be described later, when the size of the object capacitor Cobj formed by the object is 0.2 pF, the difference between the First Voltage and the Second Voltage detected at the point P is 16 mV, which is about 10 code with an ADC resolution of 1.56 mV/bit.

10 code is about 1% of 1024 code which is the total resolution of ADC, and in general, considering that it is difficult to discriminate a signal within 2-3% of a detection signal due to noise, it is difficult to discriminate a real signal with a signal level of about 1%.

SUMMARY

Technical Problem

The present invention is proposed to address the aforementioned issues in conventional technology. It concerns a device and method that interconnect terminals with the same output components across multiple loaders, applying an enable signal to just one loader to give the impression of a singular operating loader. It further introduces a strategy of situating the sensing signal line adjacent to the driving signal line, employing one detection switch group and multiple driving switch groups, thereby reducing the control signal line of the switch group and simplifying the extraction of the sensing signal line and the driving signal line.

Moreover, the invention provides a capacitance detection device and method that enhances sensitivity by minimizing the size of fixed capacitors, which in turn improves the detection sensitivity of added capacitance. This method reconfigures the internal parasitic capacitance (Cprs) that is non-responsive to applied driving voltage into a device that can apply driving voltage, thereby boosting sensitivity.

Furthermore, by applying driving voltages of varying magnitudes for each capacitance, the detection signal reliability is enhanced by establishing the operational amplifier's operation point at a stable position.

Lastly, the invention provides a capacitance detection device and method that is valuable as an input method for mobile devices or laptops sensitive to consumption current. This is achieved by blocking noise intrusion into the sensing signal line with the shielding area of the present invention, thereby improving the signal-to-noise ratio (SNR) of the sensed signal and reducing the driving voltage lower than conventional methods to minimize consumption current.

Technical Solution

To achieve the aforementioned objectives, an embodiment of the present invention includes a plurality of Capacitor (or Capacitive) Detect Areas (CDAs) arranged in the transverse and longitudinal direction, installed in a display device; a) multiple signal lines connected to the plurality of CDAs; b) multiple CDAs configured in the longitudinal direction among the multiple CDAs and a CDA column formed by the multiple signal lines connected thereto; c) detection switch groups installed for each of the CDA columns in b) and multiple driving switch groups; d) sensing signal lines outputted from the detection switch groups in c) and multiple driving signal lines outputted from the multiple driving switch groups in c); e) multiple on/off control signal lines and multiple on/off control signals outputting from a decoder; In a single CDA column as described in b), multiple signal lines from a) are connected to all detection switch groups and multiple drive switch groups in c), and when a turn-on signal is formed on one of the on/off control signal lines outputted from the decoder in e), both the detection signal lines and the multiple drive signal lines adjacent to the detection signal lines in d) are outputted simultaneously, and a driving voltage is then applied to the multiple drive signal lines to detect the additional capacitance applied to the CDA connected to the detection signal lines.

Also, the detection switch groups and multiple driving switch groups in c) include multiple internal switches, and one internal switch on/off control terminal selected for each of the detection switch groups and multiple driving switch groups in c) are interconnected and connected consecutively.

Furthermore, the on/off control signal lines in e) are consecutively connected to the on/off control terminals of the interconnected internal switches.

Additionally, when the nth CDA is outputted as a detection signal line from the detection switch groups in d), the driving signal lines in d) are outputted according to the following relationship. "CDA(n, ±m), 1, 2, . . . m. m is a positive integer". CDAn is the number of the detection signal line located at the nth row, the row number of the pair of driving signal lines is [CDA(n±m), m=1 to m], and m is the number of pairs of driving signal lines.

Also, a) the plurality of signal lines is connected based on the order to the input terminals of c) the detection switch groups. Here, a) the plurality of signal lines is shifted by one order to the left when connected to one of the input terminals in c) the plurality of drive switch groups. Meanwhile, they are shifted by one order to the right when connected to another input terminal in c) the plurality of drive switch groups.

Moreover, A loader is installed for each column group consisting of a plurality of CDA columns of b), and a plurality of detection signals outputted one for each CDA column in the same column group are input to the loader installed for each column group.

Additionally, Multiple loader outputs installed in multiple column groups are interconnected by the same output component, and an enable signal is applied to only one of the multiple loaders, and only the detection signal inputted to the loader with the enable signal is outputted.

Also, e) the plurality of on/off control signal lines are outputted from a single decoder and are connected to all switch group on/off control terminals of the column groups.

In addition, the detection signal lines outputted from the loaders are connected to the AMP input signal line selection part and the AMP input signal line selection part sequentially selects one to be inputted into one side of the input terminals of the operational amplifier.

Furthermore, the other input terminal of the operational amplifier is connected to the DAC outputted the operational amplifier outputs the difference in voltage between the DAC output and the voltage formed on the sensing signal line.

Also, the DAC output is the same size as the voltage detected on the detection signal line when there is no added capacitance to the CDA connected to the detection signal line.

Furthermore, the plurality of drive signal lines in e) are connected together, and the same driving voltage is applied.

Additionally, the amplitude of the driving voltage applied to the drive signal line and the drive voltage applied to the shielding area are different.

Also, "Start Clock" and "Clock" are inputted into e) the decoder and in response to the "Start Clock" and "Clock" signals, one of the on/off control signals, which are outputted similarly to the operation of the shift register, sequentially outputs the turn-on state voltage.

Furthermore, the detection switch group, drive switch group, loader, AMP input signal line selection part, or decoder is installed in the display device.

Moreover, the detection switch group, drive switch group, loader, or AMP input signal line selection part includes an internal switch, and the included internal switch uses the same switching element that outputs pixel data of the display device.

Also, the amplitude of the turn-on and turn-off voltages for the on/off control terminals of the internal switch included in the detection switch group, drive switch group, loader, or AMP input signal line selection part is the same as the amplitude of the turn-on and turn-off voltages outputted from the Gate Drive IC of the display device.

In addition, the signal provided to e) the decoder input control signal or the loader's enable terminal is outputted from the semiconductor IC, inputted into the level shifter installed in the display device and the level shifter converts the input signal into a high level or low level voltage of the same amplitude as used in the switching element of the display device, and outputs it and the output of the converted level shifter is inputted into e) the decoder or the loader's enable terminal.

Also, the high-level voltage and low level voltage outputted from the decoder are the same as the high level voltage and low level voltage outputted from the Gate Drive IC of the display device.

Moreover, when the loader is installed inside the display device and the AMP input signal line selection part is installed inside the semiconductor IC, the loader's output is transmitted to the AMP input signal line selection part through a connection material and the number of loader output signals passing through the connecting material is at least the same as the number of columns included in the column group.

Furthermore, the On/Off control signal lines output from the decoder or the output-component-wise connection signal lines from the loader are patterned using the transverse metal or Gate Metal of the display device, and the multiple signal lines output from the loader and input into the AMP input detection signal line selection section use the vertical metal or Source metal of the display device.

Furthermore, a plurality of capacitance detection areas arranged in the vertical and horizontal directions in the display device; multiple signal lines connected to the capacitance detection areas and to input terminals of an AMP input detection signal line selection section with multiple inputs and a single output; a operational amplifier inside the semiconductor IC; signal lines sequentially selected by the AMP input signal line selection section and connected to one input terminal of the operational amplifier; a DAC connected to the other input terminal of the operational amplifier; and when a driving voltage is applied to multiple capacitors connected to the signal line connected to the operational amplifier, the amplitude of the voltage output from the operational amplifier is measured by an ADC to detect the added capacitance.

Furthermore, the value of the DAC connected to the other side of the operational amplifier is set such that the amplitude of the signal measured by the ADC is 0 (zero) when no capacitance is added to the capacitance detection area on the extension line of the signal line connected to one side of the operational amplifier.

Furthermore, the extracted DAC value is stored in memory, and whenever the capacitance added to the capacitance detection area connected to the signal line is detected, it is recalled from the memory and used in the operational amplifier.

Preferably, a capacitance detection method is provided, which includes the steps of: a) a sensing signal line being selected by a turn-on signal formed on one of the plurality of On/Off control signal lines output from the decoder, and multiple drive signal lines adjacent to the selected sensing signal line being selected in the drive switch group, with the selected sensing signal line and multiple driving signal lines being output simultaneously; b) applying a driving voltage to the multiple drive signal lines selected in step a) in order to detect the capacitance added to the selected detection signal line; c) a sensing signal line being selected for each column belonging to the column group where processing to detect the added capacitance is being carried out, and the multiple selected sensing signal lines being input to loaders installed one for each column group; and d) A step in which an enable signal is applied to only one of multiple loaders interconnected by the same output component, and only all detection signals entered into the loader for which the enable signal is applied are output.

BRIEF DESCRIPTION OF THE DRAWINGS

FIG. 2 is a virtual data for verifying [Equation 1].

FIG. 13A is a virtual data for verifying [Equation 3].

FIG. 17 is an embodiment of the present invention related to a memory for storing the DAC.

DETAILED DESCRIPTION

Figure 1:
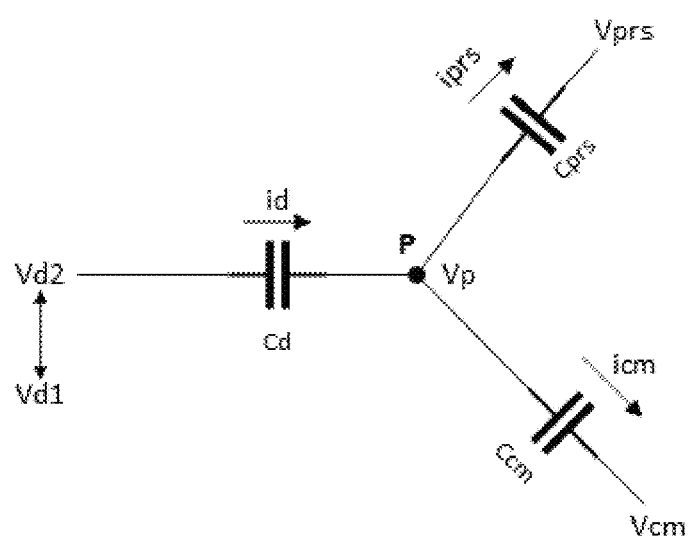
FIG. 1 is an embodiment of the present invention related to modeling of a capacitive type of input device.

The terms used in the present invention have been selected as currently widely used general terms as possible while considering the functions in the present invention, which may vary depending on the intention or precedent of a person skilled in the art or the emergence of new technology. In addition, in a specific case, a term arbitrarily selected by the applicant is used, and in this case, the meaning will be described in detail in the description of the corresponding invention. Therefore, the term used in the present invention should be defined based on the meaning of the term and the overall content of the present invention, rather than the name of a simple term.

In addition, the size and thickness of each component shown in the drawings are arbitrarily indicated for convenience of description, and the present invention is not necessarily limited to the illustrated embodiment.

In order to clearly express the various layers and areas in the drawing, the thickness or width is exaggerated in figures such as relative enlargement and relative reduction. When a part of a layer, region, etc. is said to be "on" or "upper" or "above" or "over" of another part, this is not only when it is "directly above" another part, but also when there is another part in between. Also "under" or "below" or "lower" has the same meaning.

In the entire invention, when a part "includes" a certain element, this means that other elements may be further included, rather than excluding other elements, unless otherwise stated. In addition, terms such as " . . . unit" and "module" described in the invention mean a unit that processes at least one function or operation, which may be implemented as hardware or software, or a combination of hardware and software.

Definition of Terms

In this invention, "capacitance" and "capacitor" are used interchangeably.

In addition, a finger or a pen that opposes the CDA 100 and forms a capacitor is designated as an object 20.

In addition, a signal line for detecting a voltage (or sensing a signal) based on the equation provided in the present invention among the plurality of CDA signal lines 200 is denoted as a Sensing Signal Line (or Detection signal line), and the CDA 100 connected to the Sensing Signal Line is denoted as Sensing CDA (or, Detection CDA). The Driving Signal Line forms an inter-line capacitor adjacent to the Sensing Signal Line, and a driving voltage is applied to the Driving Signal Line.

In addition, other signal lines, such as Logic Signal Line, Oscillator Signal Line, Power Line, etc., required for operation inside the Semiconductor IC 400 other than the CDA signal line 200 connected to the CDA 100 are indicated by a "Different Signal Line" to be distinguished from the CDA signal line 200 of the present invention.

In addition, a capacitor element code is used in two meanings indicating a reference number of the capacitor and the capacitance. For example, Cprs is a capacitor as a reference symbol indicating a capacitance formed by a Sensing Signal Line and a substrate of a semiconductor inside a Semiconductor IC and may be a capacitance having a predetermined size. If the meaning is confused, it is divided into capacitor or capacitance.

In addition, although the CDA 100 and the Sensing Signal Line 200 connected thereto are geometrically separated, they have the same electrical meaning. Therefore, the meaning of "extracting the signal from the Sensing Signal Line 200" is the same as the meaning of "extracting the signal from the CDA 100 connected to the Sensing Signal Line 200".

Also, in this invention, the output voltage of the Operational Amplifier that outputs the difference between "the first sensing signal" and "the second sensing signal" is denoted as "V1".

In addition, a DAC is a device that outputs an analog voltage in response to a given input code. In this invention, the analog voltage output for "DAC code" is referred to as "DAC voltage" or "DAC output". When only the DAC is used, it may be a DAC device including both the DAC code and the DAC voltage or may mean only one of the DAC code or the DAC voltage.

In addition, the standard of distance such as far/short-distance is based on the Semiconductor IC 400, and the long-distance is far from the Semiconductor IC and the short-distance is close to the Semiconductor IC 400.

In addition, one column formed by a set of CDA is called a CDA Column, and if it is clear from the context, it is indicated as a Column.

Also, a plurality of CDA columns is gathered to form a "Column Group". Group is indicated when the context is clear.

Hereinafter, with reference to the accompanying drawings, a person of ordinary skill in the art to which the present invention pertains will be described in detail so that the embodiment of the present invention can be easily practiced. However, the present invention may be implemented in several different forms and is not limited to the embodiments described herein. And in order to clearly explain the present invention in the drawings, parts irrelevant to the description are omitted, and similar reference numerals are used for similar parts throughout the invention.

Figure 3:
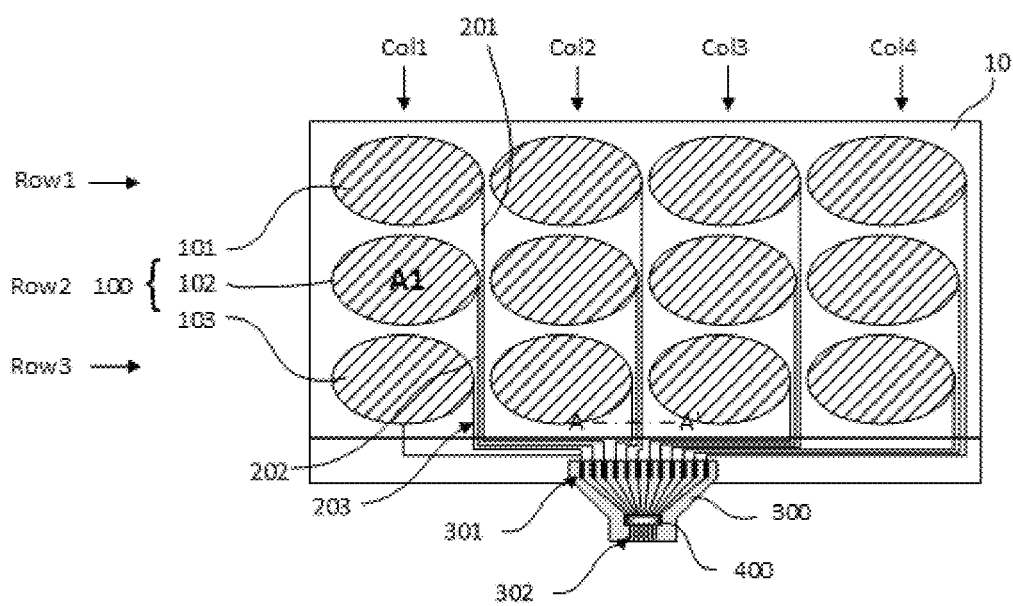
FIG. 3 is an embodiment of the present invention and is a display module in which a capacitor detection device is placed.

FIG. 3 is an embodiment of the present invention and is a display module in which a capacitor detection device is placed. The Capacitor Detect Area 100, hereinafter, referred to as a CDA of the capacitor detection device is formed of a conductor, placed inside the display part 10 or on the upper surface of the display part 10, and connected to the Signal Detector 410 of the Semiconductor IC 400 by the CDA signal line 200 connected to one side.

The CDA 100 placed on the upper surface of the display part is covered with tempered glass, plastic, or film so as to be protected from the object 20 or external foreign substances. The CDA 100 has a geometric shape such as a circle, a square, or a triangle having a predetermined area, and is mostly made of the same or similar geometric shape. When an object such as a human finger or a pen appears on the upper surface of the CDA 100 and faces each other, an object capacitor Cobj is formed according to the mutual clearance distance and the opposing area.

Also, the CDA signal line 200 connected to one side of the CDA 100 electrically connects the Semiconductor IC 400 located outside the display part 10 and the CDA 100, and the CDA signal line 200 is the Connecting Material 300, Material for connection is connected to the Semiconductor IC 400.

The display part 10 is an LCD or OLED. LCD is a VA (Vital Alignment) series or IPS (In Plane Switching) series, and a-Si, LTPS, and oxide type TFT are all used. LCD is made by bonding TFT Glass with pixels of display part and Color Filter Glass. In VA mode LCD, a common voltage is supplied to the common electrode layer formed on the upper color filter glass, and IPS mode LCD is a common voltage is applied to the common electrode layer formed on the TFT Glass under the LCD.

When the display part 10 is an organic light emitting diode (OLED), a cathode is positioned on the upper layer, and the OLED is encapsulated with an encapsulator made of glass or polyimide-based thin film. The display part 10 of the present specification is not limited to LCD or OLED. In the present invention, most of the examples using LCD are described, but the upper surface of the LCD is used in the same meaning as the upper surface of the OLED, and the elements of the present invention embedded in the display part are manufactured on the TFT substrate of the LCD or the OLED substrate.

The object capacitor Cobj is formed by the distance "d" and the opposing area "s" between the capacitor detect area CDA 100 and the object 20, and the formed object capacitance Cobj is Cobj=ε S/d. ε is the permittivity of the material existing between the CDA 100 and the object 20, and the composite dielectric constant due to the protective layer 7 such as glass or film and air (when the object is floating in the air) is applied.

The location of the CDA 100 in the display part is as follows.
  a) In case of LCD 1: It is formed on the upper side of the color filter glass where the color filter glass and the polarizer are bonded, or it is formed on the lower or upper side of the polarizer, or it is placed on the lower surface of the protective layer 7.
  b) In case of LCD 2: It is formed instead of the common electrode of the TFT substrate and performs two roles of the common electrode and the CDA 100.
  c) In case of LCD 3: It is formed on the bottom layer of the TFT substrate, and after CDA formation and passivation application, the process of gate metal or source metal begins. The devices connected to the CDA signal line 200 are formed of switching devices manufactured in the LCD process and embedded in the TFT substrate or located inside the Semiconductor IC 400.
  d) In case of OLED 1: Passivation is applied to the upper surface of the cathode and then formed on the upper surface of the passivation. The device elements such as a Switch Group connected to the CDA signal line 200 or a Loader 450 or a Decoder 436 are formed in an OLED manufacturing process and are embedded in an OLED substrate or located inside the Semiconductor IC 400.
  e) In case of OLED 2: It is formed on the upper surface of the PI (Polyimide) series thin film, which is the encapsulation substrate of OLED, or the upper or lower surface of the encapsulation glass. The devices connected to the CDA signal line are located inside the Semiconductor IC.

The CDA 100 set in FIG. 3 consists of 3 rows and 4 columns, and the area A1 in FIG. 3 has the coordinates of Row 2 and Column 1, and the location is indicated by R2C1.

The CDA 100 set in FIG. 3 is shown with 3 rows and 4 columns for convenience, but in reality, depending on the size of the display part 10, 15 Row×20 Column or 20×25 or 25×20, etc. can be used in various forms.

In this invention, a direction in which the number of signal lines increases is defined as a column. In FIG. 3, since the number of signal lines increases from 1 to 3 in the direction from the upper side to the lower side, the upper and lower directions can be defined as "Column." In addition, the column direction and the orthogonal direction are defined as "Row". In FIG. 3, one column is composed of CDA 100 corresponding to 3 rows. The CDA R1C1 in the top row is called CDA 1, and the CDA R2C1 in the second row is CDA 2 or the second row. It is called the CDA of the 3rd or 4th CDA, etc.

Since the CDA 100 formed on the LCD or OLED faces the common electrode layer of the LCD or the Cathode layer of the OLED with a predetermined distance and a predetermined area, a common electrode capacitance with Ccm=εs/d capacitance formed between the CDA 100 and the display part.

Figure 4:
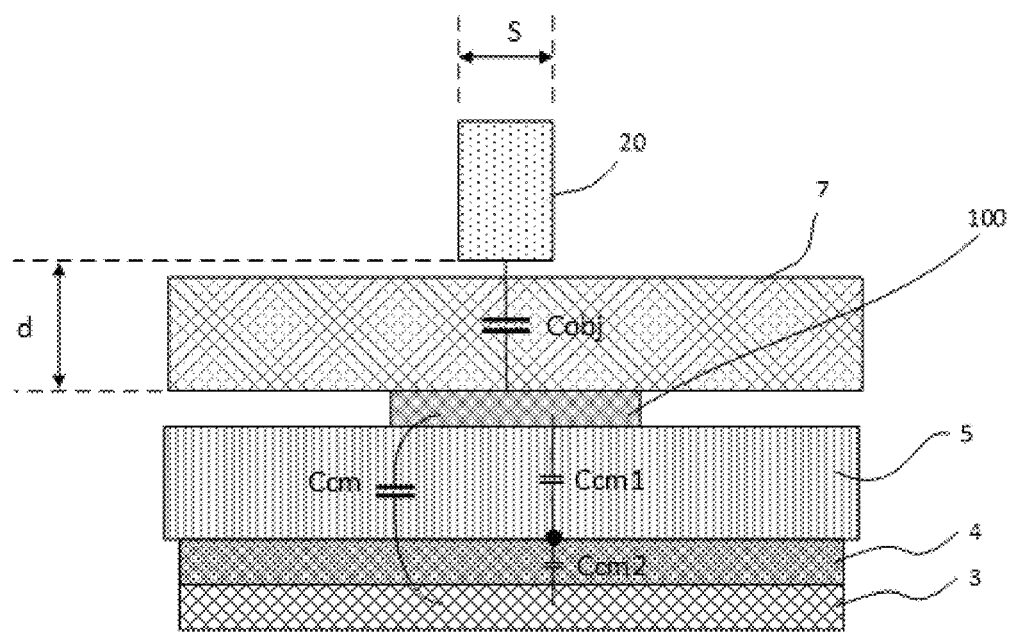
FIG. 4 is an embodiment of the present invention related to the formation of the common electrode capacitor Ccm.

FIG. 4 is an embodiment of the present invention related to the formation of a common electrode capacitor Ccm and the display part is an LCD.

Referring to FIG. 4, the CDA 100 is located on the upper surface of the color filter glass 5. The color layer 4 of R/G/B is located in the lower part of the color filter glass 5, and the common electrode 3 is located in the lower part of the color layer 4.

Since the permittivity of Color Filter Glass 5 and the permittivity of Color Layer are different from each other, a capacitor Ccm1 based on the permittivity of glass and a capacitor Ccm2 based on the permittivity of Color Filter Glass 4 are formed in series between CDA 100 and Color Filter Glass 5. Therefore, the common electrode capacitor Ccm formed between the CDA 100, and the common electrode 3 is a composite capacitor formed by serial connection of Ccm1 and Ccm2.

On the other hand, although not illustrated in FIG. 4, since the CDA signal line 200 is also a part of the CDA 100, since the common electrode capacitor is formed between the CDA signal line 200 and the common electrode 3, the common electrode capacitor Ccm by the CDA 100 should be added.

If it is assumed that FIG. 4 is an OLED rather than an LCD, symbol 5 is an encapsulation substrate, symbol 3 is a cathode, and symbol 4 can be replaced by passivation on the upper surface of the cathode, so even when OLED is used as a display part, Ccm1 and Ccm2 are formed in the same way as in the LCD embodiment, and it is possible to calculate the size of Ccm using this.

A fixed voltage of a certain level is supplied to the common electrode of LCD (or cathode of OLED), and voltage fluctuations are not allowed to display a normal screen. Therefore, the common electrode voltage Vcm connected to the common electrode capacitor Ccm cannot apply driving voltages of different levels, so the common electrode capacitor Ccm cannot be located in the numerator of [Equation 1]. Therefore, the common electrode capacitor Ccm is a capacitor that cannot apply a driving voltage in the present invention related to a device for detecting an added capacitor by driving a plurality of capacitors. As will be described later, a method of applying a driving voltage to Ccm by changing the LCD process to form a "Ccm driving layer" on the upper surface of the common electrode 3 and applying a driving voltage to the Ccm driving layer is proposed.

Since the CDA 100 on the upper surface of the display part 10 has a difference in area depending on the position in the column, and the CDA signal line 200 also has a different length depending on the position of the CDA 100, the common electrode capacitor Ccm has various distribution values according to the location of the CDA 100 in the display part 10. By substituting these various distribution values into [Equation 1] and calculating, Vp2−Vp1 shows values of various distributions as the size of the common electrode capacitor Ccm varies. When the distribution of the calculated values according to [Equation 1] is widened, the resolution of the ADC becomes worse, so preferably the common electrode capacitor regardless of the position of the CDA 100 in the display part 100. It is desirable to keep the size of Ccm constant.

As described above, the size of the common electrode capacitor Ccm formed between the CDA 100 and the CDA signal line 200 and the common electrode 3 has correlation with the area "s" of the CDA 100 and the opposite distance "d" of the common electrode 3 of the display part. Among them, the opposite distance "d" is a value determined in the manufacturing process of the display part and is an item that cannot be changed.

Therefore, a possible method for maintaining the amplitude of the common electrode capacitor Ccm regardless of the position of the CDA 100 in the display part 100 is to keep the areas "s" of all CDA 100 and CDA signal lines 200 as same as possible.

The CDA 101, R1C1 located in the long-distance of the display part 10 have a long CDA signal line 201, and the short-range CDA 103, R3C1 have a short signal line 203. It is assumed that the sum of the area of the long-distance CDA 101 and the area of the signal line 201 connected thereto is 100%, and the sum of the areas of the CDA 103 and the signal line 203 connected thereto is 80%. At this time, it is more advantageous to reduce the area of the CDA 101 and the signal line 201 of the long-distance to make the sum of the areas 80 rather than increasing the area of the short range CDA 103 and the signal line.

Figure 5:
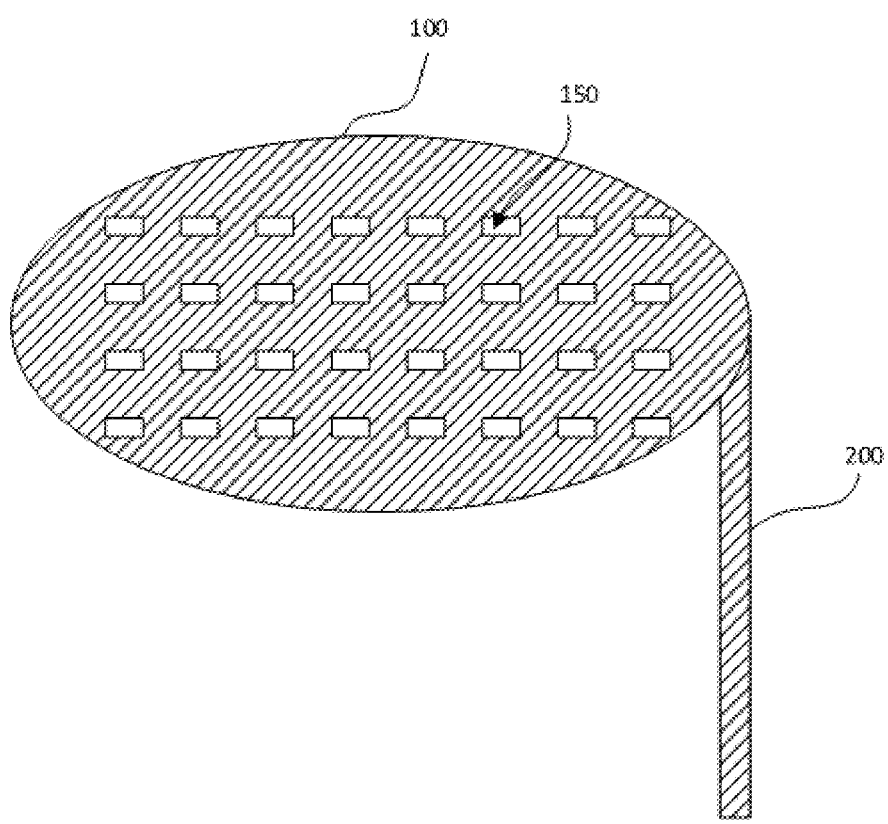
FIG. 5 is an embodiment of the present invention for a method of reducing the area of the CDA facing the common electrode.

FIG. 5 is an embodiment of the present invention for a method of reducing the area of the CDA 100 facing the common electrode 3.

Referring to FIG. 5, a portion of the CDA 100 is an empty area 150, or empty space, and a portion of the conductor forming the CDA 100 is peeled off. By adjusting the ratio of the effective space and the empty space 150 in the CDA 100, it is possible to adjust the area of the CDA 100 facing the common electrode 3. In the embodiment of FIG. 5, the empty space 150 is formed in a quadrangle, but is formed in various geometric shapes such as a circle, a triangle, a rhombus, or a shape including a concave-convex portion in which "W" is continuously connected and repeated. In addition, in order to avoid a problem that can be visually recognized, the peeled shape from one CDA 100 and all CDAs 100 of the present device should have the same shape. For example, if the peeled shape is a circle type, all the peeled shapes in one-unit CDA 100 are circular, and the peeled shapes in all CDAs of the present device are also circular.

In addition, if the density of the empty space in one CDA 100 is different, the presence of the CDA 100 in the display part 10 may be visually recognized due to a difference in density, which serves to lower the quality of the screen displayed on the display part, and thus the density of the empty space 150 in one CDA 100 should be constant. In addition, in order to reduce the visual recognition problem, it is preferable that the difference in density of the empty space 150 from the peripheral CDA 100 is within 5% as much as possible.

Because, if there are 25 CDAs 100 in one column and the difference in density of empty spaces between the upper and lower CDAs is 5%, the first CDA 100 and the 25th CDA 100 have at least 70% of empty space 150 occurs, and for this reason, the upper CDA and the lower CDA can be visually recognized by the density difference in the empty space, and when the number of CDA is further increased, it may not be possible to design to maintain the density difference.

The empty space 150 may also be placed in the CDA signal line 200, but when the width of the signal line is narrowed by the empty space, the resistance of the CDA signal line 200 is increased, and thus the empty space 150 is preferably not formed in the CDA signal line 200.

In order to maintain the area of the CDA 100 of FIG. 5 at 80%, 20% of the total area of the CDA 100 may be maintained as an empty space 150. When the empty space 150 is placed in the CDA 100 by calculating the area of the CDA 100 and the CDA signal line 200 and the sum of the effective areas excluding the empty space 150 is the same or similar, each CDA 100 has a common electrode capacitor Ccm.

As described above, in this invention, when the sum of the areas of the CDA 100 and the CDA signal line 200 placed at an arbitrary position of the display part 10 is different, the ratio of the empty spaces 150 peeled from the CDA 200 is adjusted so that the sum of the areas of all CDA 100 and CDA signal lines 200 is the same or similar.

In accordance with this principle, when designing and manufacturing CDA 100, the error range of the inter-group area with 10 adjacent CDAs 100 as one group is within the range of ±20%. In addition, the difference between the absolute area of the empty space 150 peeled from the long-distance CDA 101 and the absolute area of the empty space 150 peeled from the short-distance CDA 103 is at least 20%.

In the CDA 100, the empty space 150 is used not only for maintaining the same area between the CDA 100 and the CDA signal line 200, but also for reducing the size of the common electrode capacitor Ccm, thereby improving the detection sensitivity of the object capacitor Cobj.

The method for achieving this purpose is to reduce the effective part of the CDA 100, and the ratio of the empty space 150 peeled from the CDA 100 may be the same for all CDA 100, but the part of the empty space 150 peeled is desirably 50% or more. In addition, it is desirable to limit the sum of the peeling ratios applied equally to all CDA 100 and the peeling ratios applied differently for each CDA 100 to within 90% of any CDA 100 area for the equality of the mutual area between CDA 100. This is because it is possible to detect the object capacitor Cobj only when 10% or more of the total area of the CDA 100 is maintained.

Generally, under the influence of a plurality of CDA signal lines 200 belonging to one column, the area of the CDA 100 decreases as it descends to a short-distance, and the long-distance signal line 201 has a case where the signal line width is widened to lower the line resistance. For this reason, since the area of the CDA 100 and the CDA signal line 200 is different for each CDA 100, the common electrode capacitor Ccm is different for each CDA 100.

Due to the different common electrode capacitor Ccm for each CDA 100, a deviation of the detection voltage based on [Equation 1] occurs, which causes a decrease in the resolution of the ADC. A method to compensate for this problem is a method of supplying electric charge by driving a common electrode capacitor Ccm.

In FIG. 4, since the voltage of the common electrode capacitor Ccm should not be changed, the method of driving the common electrode capacitor Ccm is to install a new driving layer between the CDA 100 and the common electrode 3, and a driving voltage is applied to the new driving layer.

Figure 6:
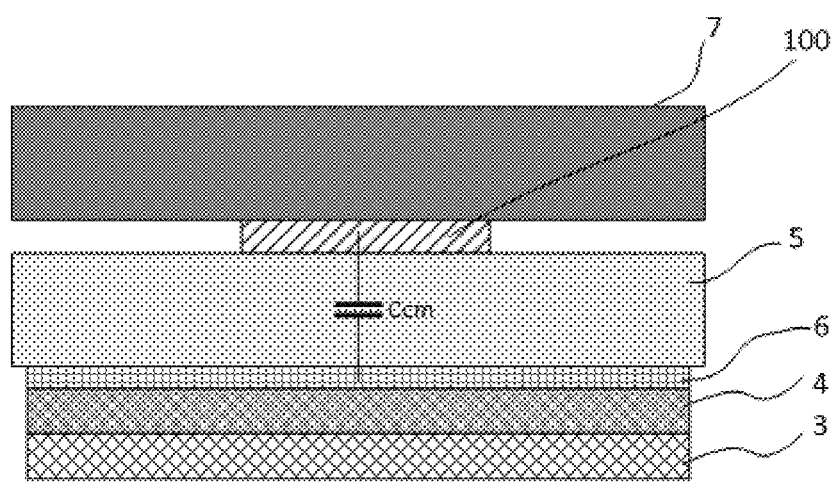
FIG. 6 is an embodiment of the present invention in which a new driving layer is placed between the CDA and the common electrode.

FIG. 6 is an embodiment of the present invention in which a new driving layer is placed between the CDA 100 and the common electrode 3. Referring to FIG. 6, a new Ccm driving layer 6 is formed on the upper surface of the color layer 4 of the LCD, and the Ccm driving layer 6 is made of a conductive transmissive material such as indium tin oxide (ITO) or metal mesh. When the display part 10 is an LCD, the Ccm driving layer 6 may be provided anywhere between the CDA 100 and the common electrode 6. In addition, when the display part 10 is an OLED, an insulating layer may be placed on the upper surface of the cathode, and a Ccm driving layer 6 may be formed on the upper surface of the insulating layer.

A Driving Signal Line 201 for applying a driving voltage is placed in the Ccm driving layer 6. In the case of LCD, a driving voltage may be applied to the Ccm driving layer 6 using a metal paste from a short point, which is an electrical signal junction between the TFT substrate and the Color Filter substrate, or a driving voltage applying method using a conductive ball may be used. In the case of OLED, the Ccm driving layer 6 may be connected to a Driving Signal Line using a metal and a contact point on the lower side to apply a driving voltage.

When driving voltages of Vcm1 and Vcm2 (however, Vcm2>Vcm1 are applied to the Ccm driving layer 6, [Equation 1] is transformed as in [Equation 2].

$$Vp2 - Vp1 = \frac{(Vd2 - Vd1) * Cd + (Vcm2 - Vcm1) * Ccm}{Cd + Cprs + Ccm} \quad \text{[Equation 2]}$$

In [Equation 2], since the Ccm driving layer 6 is driven compared to [Equation 1] and Ccm is positioned in the molecule, the result of Vp2–Vp1 generated by the deviation of the common electrode capacitor Ccm has an advantage in that the deviation is reduced compared to [Equation 1], and thus the resolution of ADC is increased. Vcm1 and Vcm2 are applied from the Driving Unit 420 and follow the driving voltage application method of FIG. 14.

The following is an embodiment of a method of forming the inter-line capacitor Cd and applying a driving voltage to the inter-line capacitor Cd.

Figure 8:
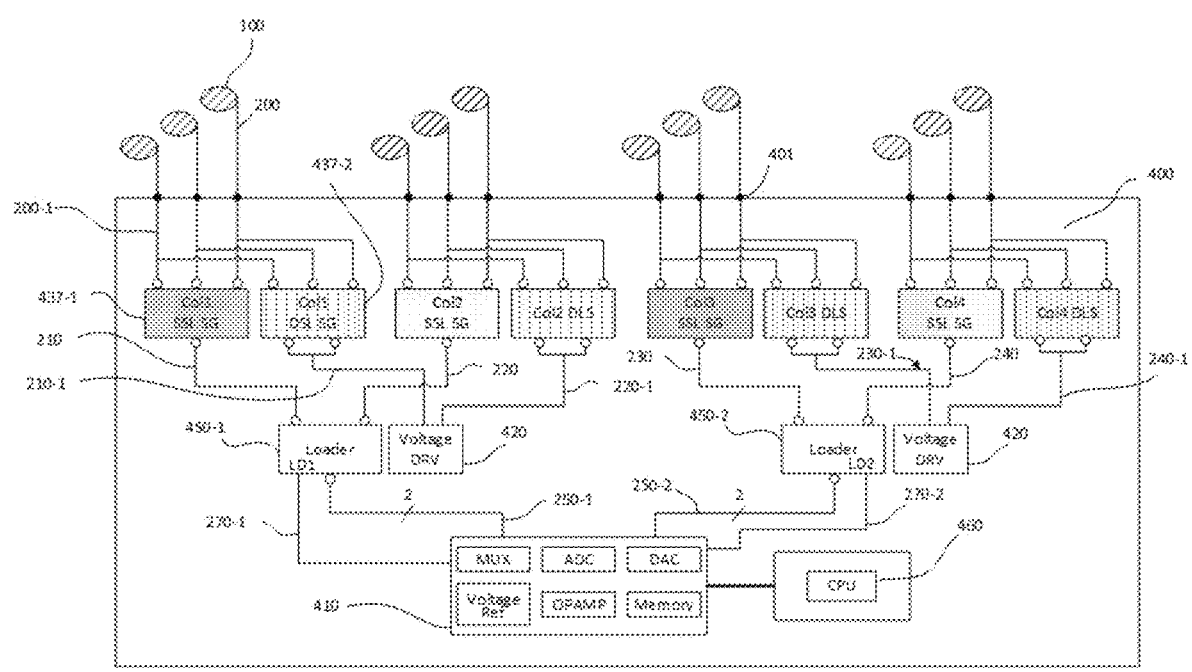
FIG. 8 is an embodiment of the present invention related to the configuration of a Semiconductor IC.

When detecting the object capacitor Cobj in the CDA 102, R2C1 of FIG. 3, the CDA signal line 202 connected to the A1 CDA 102, R2C1 is connected to the Signal Detector 410 of the Semiconductor IC 400, and the CDA signal lines 201,203 adjacent to the CDA signal line 202 of FIG. 8 are connected to the driving unit 420. A CDA signal line connected to the Signal Detector to detect the object capacitor Cobj is referred to as a Sensing Signal Line, and a signal line connected to a driving unit adjacent to the Sensing Signal Line and to which a driving voltage is applied is referred to as a Driving Signal Line. In the present invention, the CDA signal line is represented by reference numeral 200, but the Sensing Signal Line is represented by reference numeral 202 and the Driving Signal Line is represented by reference numeral 201.

Figure 7A:
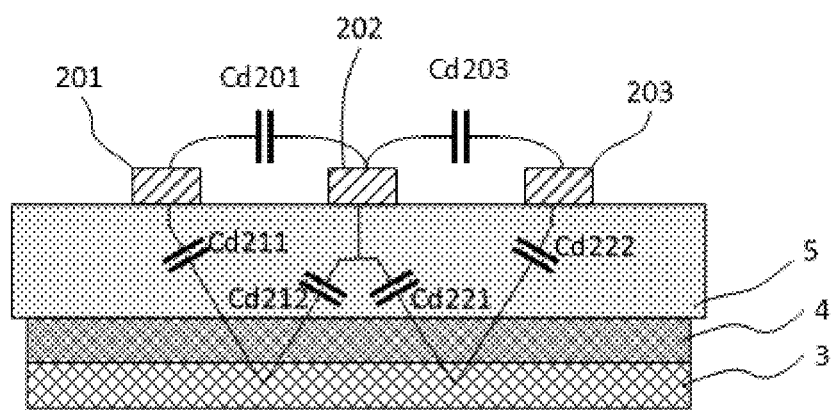
FIG. 7A is an embodiment of the present invention relating to the formation of a capacitor formed between one signal line and two adjacent signal lines.
Figure 7B:
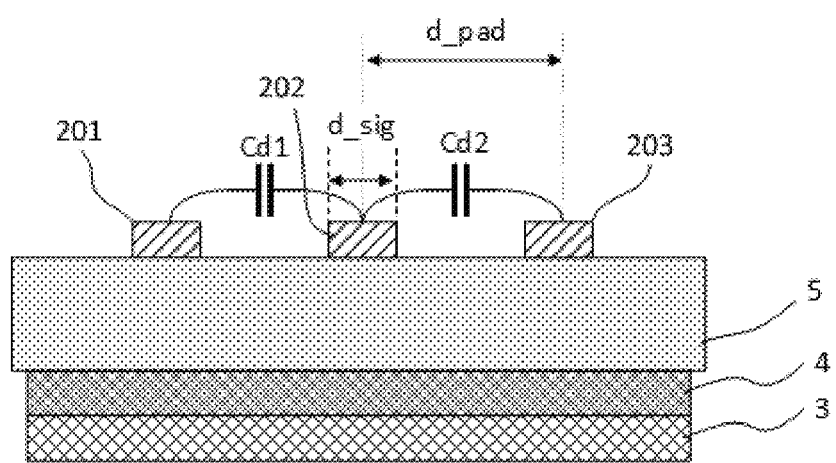
FIG. 7B is an embodiment of the present invention related to the equivalent circuit of FIG. 7A.

Inter-line capacitor is formed between the Sensing Signal Line 202 and the Driving Signal Line 201 of CDA R1C1, and between the Sensing Signal Line 202 and the CDA R3C1 Driving Signal Line 203, as shown in FIG. 7A and FIG. 7B.

FIG. 7A is a view showing a cross section A-A' in FIG. 3, and the present invention relates to the formation of an inter-line capacitor between the Sensing Signal Line 202 and the two Driving Signal Lines 201, 203 adjacent to the Sensing Signal Line 202, and FIG. 7B is an embodiment of the present invention related to the equivalent circuit of FIG. 7A.

Referring to FIG. 7A and FIG. 7B, Driving Signal Lines 201, 203 adjacent to the left and right sides of the Sensing Signal Line 202 are separated by a predetermined interval d_pad and have an area facing each other, so a capacitor Cd201 having a size of "es/d" is generated between the two. In addition, in the same manner, a capacitor Cd203 is formed between the Sensing Signal Line 202 and the Driving Signal Line 203 adjacent to the right.

Meanwhile, since the Sensing Signal Line 202 faces the common electrode 3 with the width of "d_sig(um)" and is spaced apart by the thickness of the color filter glass 5 and the thickness of the color layer 4, the capacitance Cd211 of "es/d" is formed.

In addition, a capacitor Cd212 is formed between the Sensing Signal Line 202 and the common electrode 3 in the same manner. When the driving voltage is applied to the Driving Signal Line 201, the voltage of the Driving Signal Line 201 rises higher than the Sensing Signal Line 202, and the charge supplied to the Driving Signal Line 201 moves to the Sensing Signal Line 202 through Cd201 or along a capacitor path of Cd211 and Cd212.

Due to the charge paths of Cd211 and Cd212, Cd211 and Cd212 operate as a capacitor connected in series, and this capacitor operates as a capacitor connected in parallel with Cd201, which is another charge transfer path. Accordingly, it is possible to consider that one equivalent capacitor, Cd1, is formed between the Driving Signal Line 201 to which the driving voltage is applied, and the Sensing Signal Line 202 as shown in FIG. 7B.

In the same way, when a driving voltage is applied to the Driving Signal Line 203 on the right side to detect a signal in the Sensing Signal Line 202, capacitor formed between the Sensing Signal Line 202 and the Driving Signal Line 203 on the right side may be equally displayed by Cd2 of FIG. 7B.

Referring to [Equation 6] to be described later, as the size of the interline capacitance Cd decreases, the detection sensitivity of the object capacitance Cobj is improved. Therefore, the smaller the capacitance of Cd1 or Cd2 in FIG. 7B, the better. In order to reduce the capacitance of Cd1 or Cd2, the wider the distance d_pad between the Sensing Signal Line 202 and the Driving Signal Line, the narrower the line width d_sig between the Sensing Signal Line 202 and the Driving Signal Line, the better.

However, if the line-to-line interval d_pad is too wide, the occupied area due to the CDA signal lines 200 increases, reducing the width of the CDA 100 detecting the object 20, and forming a dead zone by the occupied area of the CDA signal line 200, resulting in a detection error. In addition, as the signal line width d_sig becomes narrower, the resistance of the CDA signal line 200 increases, and thus the time for detecting the signal increases.

To solve this problem, the long-distance CDA signal line width is lengthened, and the signal line width is narrowed as it descends to a short distance. This manufacturing method serves to reduce the variation in resistance according to the length of the signal line by reducing the size of the line resistance per unit length of the long-distance signal line and increasing the length of the line resistance per unit length of the short distance.

In order to reduce the time constant RC in the RC circuit formed of the resistor R and the capacitor C, it is important to reduce the size of the capacitance C in addition to reducing the size of the resistor R. The longer the signal line, the larger the inter-line capacitor, and the shorter the distance, the smaller the inter-line capacitor. Therefore, if the inter-line spacing d_pad of the signal line increases as the distance increases, and the interval between the signal lines decreases as the short-distance decreases, the size of the inter-line capacitor per unit length becomes different, it is possible to reduce the variation in inter-line capacitor.

Figure 12A:
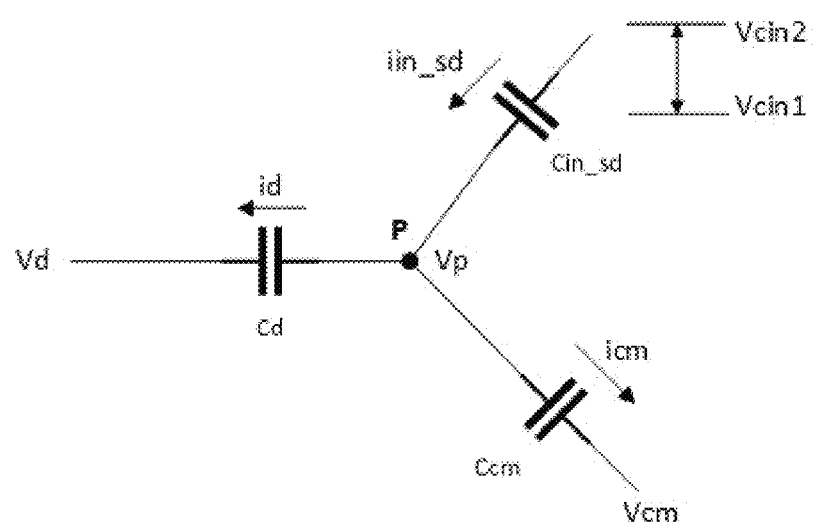
FIG. 12A is an embodiment of the present invention for applying a driving voltage to the Shielding Capacitor Cin_sd.
Figure 12B:
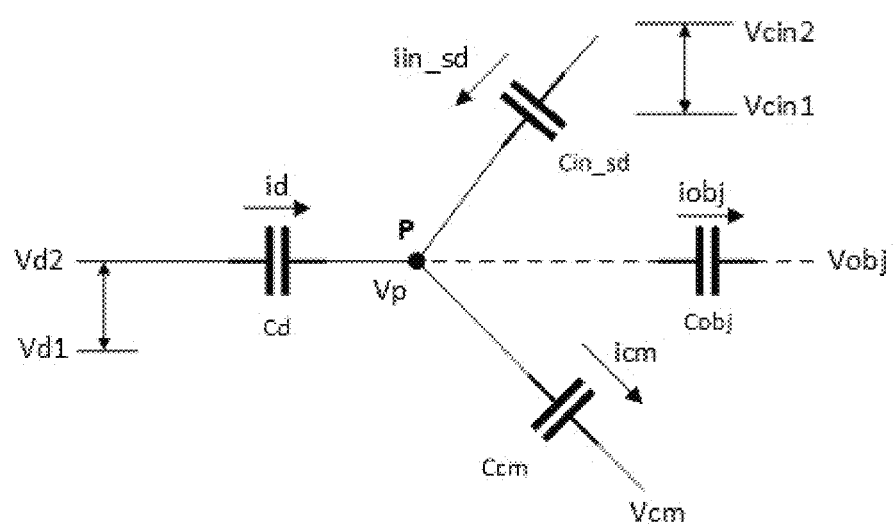
FIG. 12B is an embodiment of the present invention for detecting a voltage when an object capacitor is added.

If the same driving voltage is applied to the left Driving Signal Line 201 and the right Driving Signal Line 203, Cd1 and Cd2 are considered as one capacitor connected in parallel, that is, the capacitor represented by Cd in FIG. 1 or in FIGS. 12A and 12B. Accordingly, even if the Driving Signal Line is driven in two directions on the left and right sides of one Sensing Signal Line 202, it is possible to model equivalently that charges flow to one capacitor Cd, and thus [Equation 3] and [Equation 4] to be described later can be established. For this effect, two Driving Signal Lines 201 and 203 adjacent to one Sensing Signal Line 202 are interconnected to apply the same driving voltage.

Meanwhile, in order to apply the driving voltage to the above-described inter-line capacitor Cd, a plurality of Driving Signal Lines 201 adjacent to the Sensing Signal Line 202 must be selected as a pair and the same driving voltage must be applied to the interconnected Driving Signal Lines 202. In the embodiment of FIG. 3, one pair of Driving Signal Lines adjacent to the Sensing Signal Line 202 are selected, but to reduce the saturation time of the Driving Signal Lines 201,203, a large number of Driving Signal Lines may be selected to apply a driving voltage. The pair is a Driving Signal Line adjacent to the Sensing Signal Line left and right or up and down, and one Driving Signal Line on each left and right of the Sensing Signal Line is "a pair of drive signal lines", and "two drive signal lines" on each left and right.

Figure 7C:
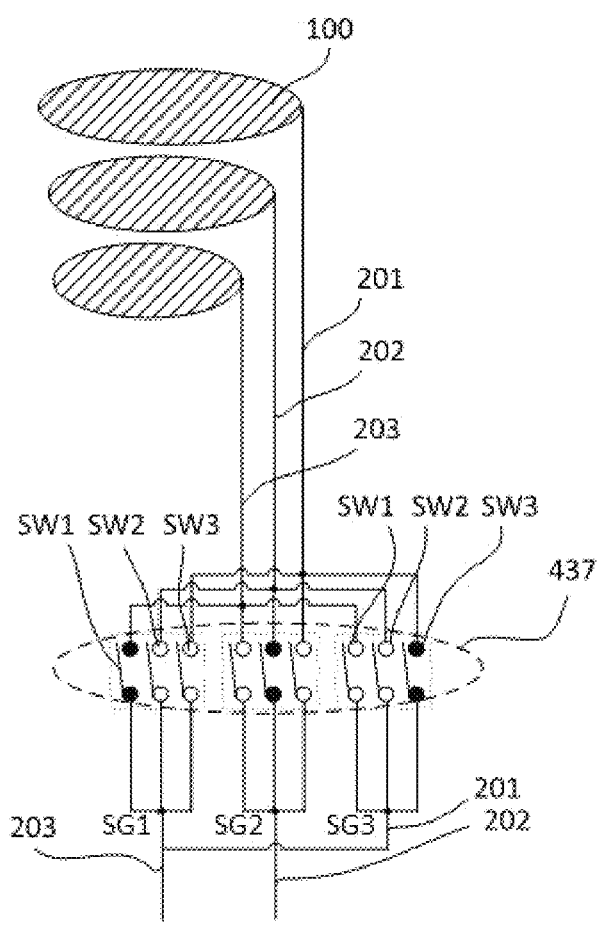
FIG. 7C is an embodiment of the present invention relating to a method for simultaneously selecting Driving Signal Lines and a Sensing Signal Line.

FIG. 7C is an embodiment of the present invention relating to a method for simultaneously selecting Driving Signal Lines 201,203 and Sensing Signal Line 202.

Referring to FIG. 7C, a Sensing/Driving Signal Line switch group 437, hereinafter, a Sensing/Driving Switch Group or sensing/Driving Switch Group composed of a plurality of switch groups SG1 to SG3 is placed in one column. "SG1", which is one of the switch groups constituting the Sensing/Driving Switch Group 437 is a Driving Signal Line switch group 437-2, hereinafter Driving Switch Group that selects one Driving Signal Line 203 adjacent to the Sensing Signal Line 202, and "SG2" is a Sensing Signal Line switch group 437-1, hereinafter Detection Switch Group that selects the Sensing Signal Line 202, and "SG3" is a Driving Switch Group 437-2 that selects the Driving Signal Line 201 adjacent to the right side of the Sensing Signal Line 202.

Each switch group SG1 to SG3 is composed of the same or a smaller number of inner switches 438, SW1 to SW3 than the CDA 100 included in one column. The inner switch 438 constituting the Sensing/Driving Switch Group 437 consists of a transistor, a CMOS, a TFT of LCD, a PMOS or NMOS of OLED, or a combination of PMOS and NMOS. In addition, turn-on or turn-off is determined by the amplitude of the on/off voltage applied to the Gate or Base, which is an on/off control terminal. The configuration method of these switches applies to all switches in this invention.

The Driving Switch Group 437-2 may be placed more than the two illustrated in FIG. 7B. As described above, as more Driving Signal Lines 201 such as two or three pairs of Driving Signal Lines 201 other than one pair are selected, the Driving Switch Group 437-2 is also placed in the same number. For example, if three pairs of Driving Signal Lines are selected, seven switch groups, including six Driving Switch Groups 437-2, including one Detection Switch Group 437-1, are placed.

The CPU 460 or the logic unit inside the Semiconductor IC 400 outputs an on/off control signal line and an on/off control signal for controlling the turn on/off of the inner switch 438 in the switch group. The on/off control signal line is connected to a base or a gate, which is an on/off control terminal of the inner switch 438, and a turn-on or turn-off state of the inner switch 438 is determined using an on/off control signal applied to the control signal. In addition, one Sensing Signal Line 202 connected to the inner switch 438 is selected by the turn-on of the inner switch 438.

The following is an embodiment of simultaneously selecting one Sensing Signal Line 202 and a plurality of Driving Signal Lines 201 adjacent to the Sensing Signal Line 202 in one column.

FIG. 7C illustrates one column composed of a plurality of CDAs 100, and one column includes 20 or more CDAs 100. All CDAs 100 included in one column are connected to both a Detection Switch Group 437-1 and a plurality of Driving Switch Groups 437-2.

In FIG. 7C, to select the Sensing Signal Line 202, the turn-on voltage is applied to the on/off control terminal of SW2 connected to the Sensing Signal Line 202 among the three inner switches 438 of the Detection Switch Group SG2. Then, turn-off voltage is applied to the on/off control terminals of SW1 and SW3 to turn off switches SW1 and SW3. For this reason, in the Detection Switch Group SG2, the Sensing Signal Line 202 connected to the turned-on SW2 is selected, and a signal is output through SW2.

Also, SW3 of the Driving Switch Group SG3 is turned on and SW1 and SW2 are turned off to select the Driving Signal Line 201 on the right side of the Sensing Signal Line, SW1 of the Driving Switch Group SG1 is turned on and SW2 and SW3 are turned off to select the Driving Signal Line 203 on the left side of the Sensing Signal Line 202. As a result, the Driving Signal Line 203 is selected in the Driving Switch Group SG1, and the Driving Signal Line 201 is selected in the Driving Switch Group SG3. The selected Driving Signal Lines 201 and 203 are interconnected and connected to the Driving Unit 420 inside the Semiconductor IC 400.

In the case of one embodiment, the number of CDA 100 included in one column may be 20 to 25 or more. In the present invention, if 25 CDAs are assumed, at least 25 inner switches 438 are required for one switch group, so the on/off control signal for inner switch 438 of three switch groups SG1, SG2, SG3, at least 75 lines are required. If the number of on/off control signal lines increases, there is a problem that the layout becomes complicated.

Figure 7D:
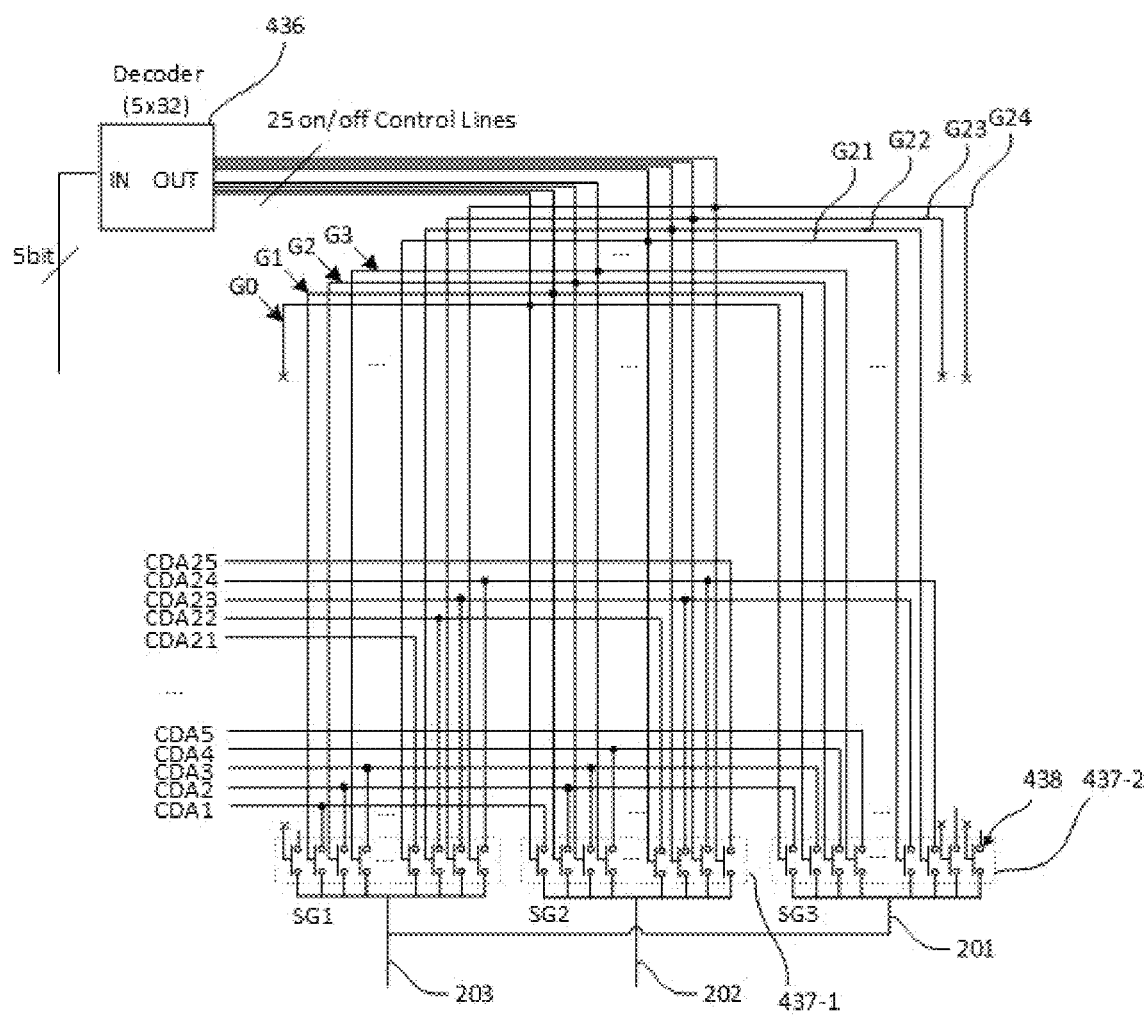
FIG. 7D is an embodiment of the present invention for reducing the number of switch control signal lines.

FIG. 7D is an embodiment for solving the above problem and is an embodiment of the present invention for reducing the number of switch control signal lines.

The embodiment of FIG. 7D relates to a Sensing/Driving Switch Group 437 included in each column and is composed of one Detection Switch Group 437-1 and two Driving Switch Groups 437-2. It is assumed that 25 CDAs 200 are located in the column, and all CDAs 100 are connected to all Sensing/Driving Switch Groups 437.

An embodiment of the present invention for reducing the number of on/off control signal lines in a switch group is to use a Decoder 436. Decoder is a device that outputs "2ⁿ" number of signal lines for "n" number of input signal lines, and outputs only one of the output signal lines as Enable state of High state or Low state.

Although only one Decoder is displayed in FIG. 7D, one Decoder may be positioned for each switch group. The Decoder of 5×32 5 inputs, 32 outputs 25 enable signals to turn on by selecting one of 25 inner switches 438 with 5 Decoder input signal lines. Therefore, since 5 Decoder input signal lines can produce the same effect as the existing 25 on/off control signal lines, there is an effect of reducing 20 signal lines.

Therefore, when one Decoder is positioned for each switch group SG1, SG2, SG3 of FIG. 7D, the existing 75 on/off control signal lines are reduced to 15 control signal lines.

Another embodiment is to apply one Decoder 436 to all switch groups 437.

Referring to FIG. 7D, the Decoders individually located in the three switch groups SG1, SG2, SG3 require 15 input signals. If one Decoder 436 can perform the role of three Decoders, 15 input signals will be reduced to 5.

The on/off control signal of 25ea output from one Decoder 436 is connected to the on/off control terminal of three inner switches 438 in switch groups 437-1,437-2, one inner switch 438 is turned on for each of the three switch groups 437-1, 437-2 by one turn-on voltage output from Decoder 436. If one sensing signal output and two Driving Signal Lines can be selected using an inner switch turned on for each switch group, it is possible to perform the same role as three Decoders with one Decoder.

When the Decoder 436 is inside the Semiconductor IC 400, the signal level indicating High or Low input to the Decoder is the same as the signal level used by the CPU 460 or the logic unit. However, when the Decoder 436 is placed in the display part 10, the signal level of the switching device used for the Decoder is different from that of the Semiconductor IC 400, it is necessary to change the logic level of a signal output from the Semiconductor IC 400 and input to the Decoder 436 of the display part 10 through a level shifter 439 in the middle.

In one embodiment, when the turn-off voltage output level from the Semiconductor IC 400 is 0V and the turn-off voltage level of the Decoder 436 or the inner switch 438 placed in the display part is −6V, and when the turn-on voltage output level from the Semiconductor IC is 3V and the turn-on voltage level of the Decoder 436 or inner switch 438 placed in the display part 10 is 10V, the 0V voltage is converted to −6V by the level shifter 439, and the 3V voltage output from the Semiconductor IC 400 is changed to 10V by the level shifter 439.

The Decoder 436 outputs on/off control signal lines as many as the number of CDAs 100 included in the column, and a switch turn-on signal is applied to only one signal line among the output signal lines. In the embodiment of FIG. 7D, 25 signals corresponding to G0 to G24 are output to correspond to 25 inner switches 438, and only one of the 25 signals outputs a voltage capable of turning on the inner switch 438.

The inner switch 438 of each switch group is co-connected with the on/off control terminal for each switch of the same order. In addition, the output of Decoder 436 is sequentially connected to the on/off control terminal of each co-connected inner switch 438.

Referring to an embodiment of FIG. 7D, the on/off control terminal of the first inner switch of each switch group is co-connected and connected to the G0 address of the Decoder 436, and the on/off control terminal of the second inner switch of each switch group is also co-connected to the G1 address of the Decoder, and the on/off control terminal of the inner switch 438 is co-connected and the output of the Decoder is sequentially connected from G0 to G25.

Even when the number of switch groups 437 is increased, such as 5ea or 7ea, not 3ea, as in the embodiment of FIG. 7D, on/off control terminals of inner switches in the same order are co-connected in all switch groups, and the output of one Decoder 436 is sequentially connected to the on/off terminal of the co-connected inner switch 438.

The number of output signal lines of Decoder 436 is 25ea, but if the number of required output signal lines is less than 25ea, only the required number of output signal lines is used. In an embodiment of FIG. 7D, 25 signals are output from Decoder 436, but only 24 signals are used in switch group 1 SG1, 25 signals are used in SG2, and only 23 signals are used in SG3.

Referring back to FIG. 7C, the present invention is characterized in that only the CDA signal line 200 adjacent to the Sensing Signal Line 202 is selected as Driving Signal Lines 201 and 203. Among a plurality of CDAs 100 belonging to one column, long-distance CDA 100 is referred to as number 1 CDA, and when the order of CDA is determined in ascending order as it approaches a short distance from long-distance, Sensing Signal Lines and Driving Signal Lines are combined as follows.

<Combination of Detection and Driving Signal Lines>

(CDA1, CDA2), (CDA1, CDA2, CDA3), (CDA2, CDA3, CDA4), . . . , (CDA n−2, CDA n−1, CDA n), (CDA n−1, CDA n)

In the first CDA1 and CDA2, CDA1 is Sensing Signal Line 202 and CDA2 is Driving Signal Line. Below, the middle of parentheses is the Sensing Signal Line and the Driving Signal Line on the left and right sides. In the last CDA number (n−1, n), n−1 is the Driving Signal Line and n is the Sensing Signal Line.

In order to obtain such a combination, 1 the number of switch groups is required as much as the number of CDA signal lines 200 to be selected, 2 The number of the CDA signal line 200 selected for the on/off control signal line of the same address output from the Decoder 436 is, in one of the Driving Switch Groups, when the nth Sensing Signal Line is selected in the Detection Switch Group, the n−1th Driving Signal Line is selected and n+1 must be selected in one of the other Driving Switch Groups. Since the output of Decoder 436 is connected equally to all switch groups, one CDA 100 is selected from all switch groups for one Enable signal output from Decoder 436, thereby simultaneously outputting Sensing Signal Lines and Driving Signal Lines.

If the Driving Signal Line should be selected as multiple pairs or more, rather than a pair, the Driving Signal Line of "CDAn+1, CDAn+2, CDAn+3 . . . CDAn+m, m=1, 2, . . . , m is the number of pairs" is selected for the nth CDA selected in the Detection Switch Group.

In order to make such a selection, based on the CDA signal line 200 connected to the Detection Switch Group, one number must be shifted to Left in one of the Driving Switch Groups and one number must be shifted to Right in the other Driving Switch Group. Whenever a Driving Signal Line is added, shift m times to the left and right by m pairs added. For example, if two pairs of Driving Signal Lines are required, in addition to the existing pair, the second pair shifts two times in the left direction and two times in the right direction based on the CDA signal line 200 connected to the Detection Switch Group.

Referring to FIG. 7D, the output G2 of the Decoder 436 is connected to the on/off control terminal of the inner switch 438 of the Detection Switch Group SG2, and the CDA3 is connected to the input terminal of the inner switch 438. In Driving Switch Group SG1, the CDA number shifted one number to the right compared to the detection switch SG2, and CDA2 is connected to the input terminal of the inner switch 438 using the same Decoder output G2.

In the other Detection Switch Group SG3, one number is shifted to the left compared to the Detection Switch Group SG2, and CDA4 is connected to the input terminal of the inner switch 438 using the same Decoder output G2.

Since the CDA signal line 200 is not connected to the first or last inner switch 438 as it is shifted left or right in the Driving Switch Group 437-2, the inner switch 438 of the Driving Switch Group is reduced by the number to be shifted.

When Decoder is not used, 75ea control signal lines are required for three switch groups, but when one Decoder 436 is used for each switch group, it is reduced to 15ea control signal lines, and when one Decoder according to an embodiment of this invention is used, the same effect may be achieved with five control signal lines. When the Sensing/Driving Switch Group 437 and the Decoder 436 are placed in the display part 10, the number of signal lines transmitted from the Semiconductor IC 400 via the connecting material 300 is drastically reduced due to a decrease in the signal line as described above, and the area of the Semiconductor IC 400 and the connecting material 300 are reduced, and there is an advantage such as convenience of layout due to a decrease in the signal line in the display part 10.

Referring back to FIG. 3, the connecting material 300 is manufactured by a flexible printed circuit (FPC), a chip on film (COF), a tape carrier package (TCP), or the like, the Semiconductor IC 400 is positioned on one side of the connecting material 300. An attached part 301 on one side of the connecting material 300 is bonded to the display part 10, is connected to the PCB or the like (not shown) through a connection part formed on the other side, and a signal required from the PCB or the like to the Semiconductor IC 400 is input through the connection part 302.

The Semiconductor IC 400 may be directly mounted in the form of a chip one glass (COG) on one side of an upper surface of the display part 10 or on the same layer on which a display drive IC (DDI) of the display part is mounted. In this case, an external signal is input to the Semiconductor IC 400 through the connecting material 300 on which the Semiconductor IC 400 is not mounted.

In another embodiment, the Semiconductor IC 400 is mounted on a PCB or FPC other than the display part 10 or the connecting material 300, and it is also possible to connect to the display part 10 through the connecting material.

In another embodiment, the Semiconductor IC 400 may be integrated with a display drive IC (DDI) for driving the display part 10 and located inside the DDI.

FIG. 8 is an embodiment of the present invention related to the configuration of the Semiconductor IC 400.

Referring to FIG. 8, there are four CDA columns composed of three CDA 200, and the CDA signal line 200 connected to the CDA 100 is connected to the signal line input pin 401 of the Semiconductor IC 400. The signal line 200 connected to the signal line input Pin 401 is simultaneously connected to the Detection Switch Group 437-1 and the Driving Switch Group 437-2.

Although the Driving Switch Group 437-2 is illustrated as one, it may be composed of two switch groups SG1 and SG3 as in the embodiment of FIG. 7D or may be composed of four or more switch groups.

Since single Sensing Signal Line 202 is selected through a dedicated Detection Switch Group 437-1 in one column, four column Sensing Signal Lines 210 to 240 are selected in four columns. And Driving Signal Lines 210-1 to 240-1 is selected from the dedicated Driving Switch Group 437-2 for each column and are input to the driving unit 420. In the embodiment of FIG. 8, the driving unit is indicated as being divided into two, but this is for the convenience of drawing, and may be divided into one or more driving units.

In the embodiment of FIG. 8, components such as the Sensing/Driving Switch Group 437 or the Loader 450 or the AMP Input Signal Line Selection Unit 430 connected to the Loader 450 are embedded in the display part. In this case, the Sensing Signal Line 202 output from the component built into the display part 10 is connected to the signal line input Pin 401.

The Sensing Signal Lines 210 to 240 selected in each column are input to the first group Loader 450-1 and the second group Loader 450-2. The Loader is a device that outputs all signals input by the "LD" enable signal generated by the logic unit or CPU 460 of the Signal Detector 410.

Preferably, one Loader 450 is placed for each column group. The Loader 450 includes as many switches as the number of "CDA columns" included in the column group.

The Loader 450 is manufactured by a combination of PMOS, NMOS, or CMOS in the Semiconductor IC 400. In addition, when the Loader of the present invention is placed in the display part 10, it is composed of a-SI or oxide used as a pixel switching element of the display part 10, or PMOS or NMOS of LTPS TFT or OLED, and a combination thereof, and is composed of the same switching element as the switching element used in the display part.

The switch used for the Loader 450, or the Sensing/Driving Switch Group 437 is a switch that transmits an input signal without loss and is referred to as a "transfer switch" in the present invention.

One of the methods of outputting all signals input to the Loader 450 by the enabled "LD" signal is that the LD signal is connected to the on/off terminals of all switches constituting the Loader 450, and when all switches of the Loader 450 are turned on at the same time by the LD Enable signal, all the signals input to the Loader 450 are simultaneously output.

A column set composed of a plurality of CDA columns constitutes a plurality of meaningful combinations. As in the embodiment of FIG. 8, it can be divided into two groups, such as a "Left Side Group" and a "Right Side Group", or divided into two groups, such as an "Odd Group" consisting of only odd column and an "Even Group" consisting of only even column, which embodiments may be divided into groups of three repeats or four or more repeats.

The embodiment divided into the left group and the right group in FIG. 8 included only two columns on the left and two columns on the right for convenience, but in actual use, 10 or more columns may be included in each group.

A plurality of Sensing Signal Lines output from a plurality of columns in the same group are gathered and connected to a dedicated Loader 450 of the corresponding group. Referring to FIG. 8, two column signal lines 210, 220 of the left group consisting of two columns are connected to the first group Loader 450-1, and two column signal lines 230, 240 of the right group are connected to the second group Loader 450-2. If it is assumed that the number of columns included in the left group is 10 lines, 10 Sensing Signal Lines are connected to the first group Loader 450-1 dedicated to the left group.

The Semiconductor IC 400 of the present invention uses an ADC and a DAC to detect the object capacitor Cobj in the form of voltage. A plurality of ADCs or DACs may be used, and preferably, one DAC and one ADC are used. When one DAC and one ADC are used, processing is performed in a time division method for a plurality of groups. For example, when the left group is processed, the right group does not process, and when the processing of the left group is completed, the right group starts processing, and when the processing of the right group ends, the processing of the left group starts again. Single ADC and single DAC operate only in a group in which processing proceeds, which is called a time division method.

Although Sensing Signal Lines of all columns included in the device may be simultaneously processed, as the number of columns increases, the operating time of the time-divided ADC and DAC increases, and thus discharge occurs in the Sensing Signal Line of the slow-processed column, causing distortion of the detected signal.

Therefore, it is a good way to prevent signal distortion due to the discharge of the Sensing Signal Line by dividing as many column groups as possible, processing only the limited Sensing Signal Lines in the column group, and then processing the next group. The more groups the better, but it is generally better to separate within the range of 2 or 4 because it takes a lot of time to prepare for signal detection.

As described above, the device of the present invention is divided into a plurality of groups consisting of a set of columns including a plurality of CDA 100, and the processing start time for detecting the object capacitor Cobj is different for each group.

All Sensing Signal Lines 250 simultaneously output from the Loader 450 are transmitted to the Signal Detector 410. Inside the Signal Detector 410, there is an Operational Amplifier or an "AMP Input Signal Line Selection Unit 430-2" or ADC or DAC, and the input "Sensing Signal Line 250" is sequentially selected to extract the object capacitor Cobj by the time division method.

The Signal Detector 410 detects the voltage defined in [Equation 1] or [Equation 4], the detected voltage is digitized by the ADC and stored in the memory, and the data stored in the memory is transmitted to the CPU 460. After that, whether the object appears or the position of the object is calculated by the CPU, and the calculated information is transmitted to the Host CPU located outside the Semiconductor IC 400. The CPU 460 inside the Semiconductor IC 400 and the memory for storing ADC data may be located outside the Semiconductor IC 400, and the Host CPU may replace the CPU of the Semiconductor IC 400.

Meanwhile, the Semiconductor IC 400 includes a logic unit for controlling components used in the device, such as a CPU 460 or memory or switch group/Decoder/Loader/ "AMP input signal line detection unit", etc. or all devices mentioned in this invention for implementing the device, such as a power terminal or an oscillator or a level shift 439. In addition, general circuit elements used for signal analysis or software to operate the CPU 460 may be included.

In the Semiconductor IC 400, multi-layered insulating layers and multi-layered conductive layers having specific patterns are stacked on a substrate 461, and a plurality of devices having electrical characteristics and a plurality of wirings are included. For example, a SOURCE metal layer or a GATE metal layer or a power layer or a GND layer or an arbitrary signal constitutes a signal layer. Since this signal layer is patterned with conductive metal, it is separated by an insulator in order to avoid short circuit with the signal layer adjacent to each other.

Figure 9:
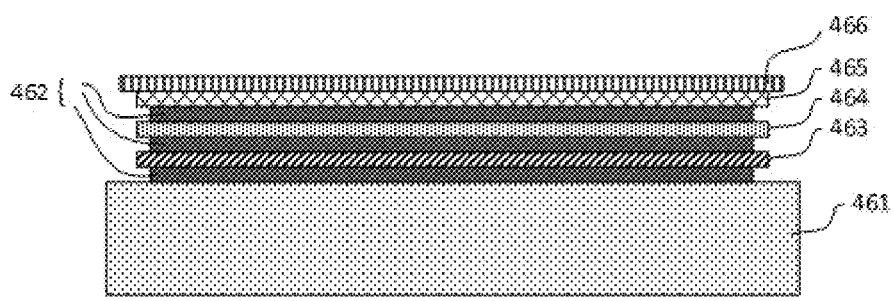
FIG. 9 is an embodiment of the layer configuration of the Semiconductor IC.

FIG. 9 is an embodiment of the layer configuration of the Semiconductor IC 400. Referring to FIG. 9, an insulating layer 462 is positioned on an upper surface of a semiconductor silicon substrate 461, and a first signal layer 463, a second signal layer 464, and a third signal layer 465 are positioned on an upper surface of the insulating layer. Each signal layer is patterned with a metal line, and the patterned line transmits a signal, supplies power, or acts as a ground. Although three signal layers are exemplified in this embodiment, three or more signal layers may be used.

Referring back to FIG. 8, the Sensing Signal Line 202 of the present invention is divided into several different names according to positions inside the Semiconductor IC 400 and is a Pin Input Signal Line 200-1, column Sensing Signal Lines 210 to 240, and group Sensing Signal Lines 250-1 and 250-2. The Pin Input Signal Line is a Sensing Signal Line 200-1 of a path through which the CDA signal line 200 connected to the input pin 401 is input to the Detection Switch Group 437-1, a Sensing Signal Line of a path output from the Detection Switch Group 437-1 and input to the Loader 450 is a column Sensing Signal Line, and a Sensing Signal Line output from the Loader 450 is called a group Sensing Signal Line.

In the case of a general embodiment, these three types of Sensing Signal Lines are placed in a specific pattern at arbitrary positions in the first signal layer 463 to the third signal layer 465. In this case, the three types of Sensing Signal Lines 200-1, 210-240, 250-1/250-2 form the capacitance of $$Cprs1 = \varepsilon \frac{S1}{d1}$$

according to the facing distance d1 and the facing area S1 with the lower semiconductor substrate 461. In addition, a capacitance of $$Cprs2 = \varepsilon \frac{S2}{d2}$$

is formed in accordance with the facings distance d2 and the facings part S2 of the upper layer, and an IC internal capacitance Cprs with the parallel capacitance Cprs1+Cprs2 is formed.

Since the internal capacitor Cprs is formed by the IC internal signal lines 200-1, 210-240, 250-1/250-2, which are extensions of the Sensing Signal Line 202, in the embodiment of FIGS. 12A and 12B, the detection signal can be represented as a circuit having one end connected to the point P and the other end connected to the power source Vprs connected to the semiconductor substrate 461 or "Other Signal Line".

There are two problems with this IC internal capacitor Cprs, the first of which is a detection error due to signal interference.

"Other signal lines" inside the Semiconductor IC 400 are logic signals synchronized with the clock or power, oscillators or analog signals.

Among the input/output signal lines of the internal signals of the plurality of IC 400, a logic signal line or a clock signal line or an oscillator signal line and a CDA Sensing Signal Line 200-1, 210-240, 250-1/250-2 face each other in this case, noise is introduced by coupling through the internal parasitic capacitor Cprs1 or Cprs2, and these noises are transferred to the CDA Sensing Signal Line 200-1, 210 to 240, 250-1/250-2, and this may cause signal distortion in the Sensing Signal Lines 200-1, 210-240, 250-1/250-2, resulting in a signal detection error.

In order to solve this problem, an upper side or a lower side of the IC internal CDA Sensing Signal Lines 200-1, 210-240, 250-1/250-2 may avoid layout of "other signal lines" causing noise, but this degrades the degree of freedom in patterning design and increases development difficulty.

A second problem due to IC internal capacitor Cprs occurs because the lengths of the paths 200-1, 210-240, 250-1/250-2 reaching the signal line input Pin 401 to the Signal Detector 410 of FIG. 8 are different for each Sensing Signal Line, due to the path length difference, the size of the internal parasitic capacitor Cprs is different for each Sensing Signal Line, and thus, the result value of [Equation 1] is deviated, thereby degrading the resolution of ADC.

In the present invention, in order to solve the above problems, a conductive shielding area is disposed on the upper layer or lower layer of the signal lines 200-1, 210 to 240, 250-1/250-2 inside the IC and, a driving voltage is applied to the disposed shielding area to reduce a deviation of the output voltage of [Equation 1] due to a difference in the internal parasitic capacitor Cprs formed in the Sensing Signal Lines 200-1, 210-240, 250-1/250-2 in the Semiconductor IC 400.

Preferably, the IC internal Sensing Signal Lines 200-1, 210-240, 250-1/250-2 are disposed on the uppermost surface of the Semiconductor IC 400, and a conductive shielding area is disposed under the signal line to further reduce the Shielding Capacitor Cin_sd, and a driving voltage is applied to this shielding area to detect a signal.

Figure 10:
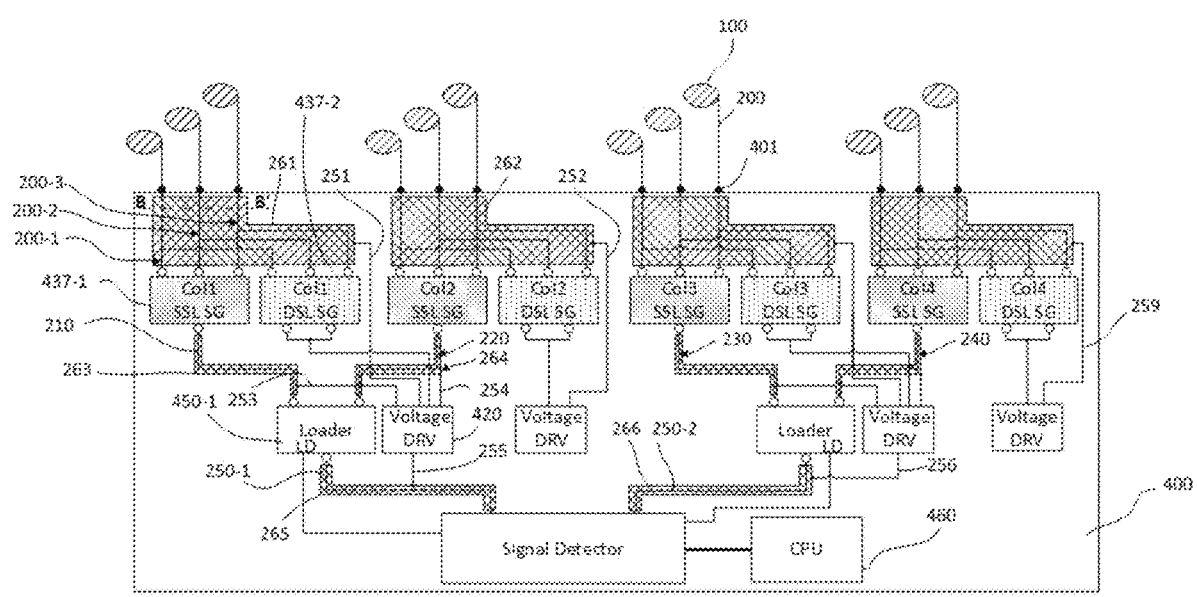
FIG. 10 is an embodiment of the present invention in which shielding areas are added to signal lines inside the Semiconductor IC.
Figure 11A:
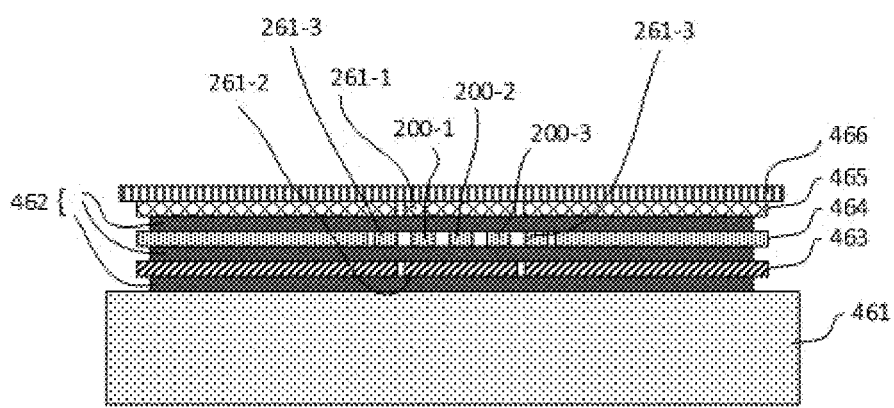
FIG. 11A is a cross-sectional view of FIG. 10 B-B'.

FIG. 10 is an embodiment of the present invention in which shielding areas are added to Sensing Signal Lines 200-1, 210-240, and 250-1/250-2 inside the Semiconductor IC 400, FIG. 11A is a cross-sectional view of B-B' located in column 1 of FIG. 10.

Referring to FIG. 10 and FIG. 11A, "a column 1 first shielding area" 261 is disposed in an upper signal layer 465 and a lower signal layer 463 of the signal layer 464 patterned with the Pin Input Signal Line 200-1 of column 1.

In addition, "column 2 first shielding area" 262 is disposed on the upper and lower signal layers of the Pin Input Signal Line 200-1 input to column 2, and "column 3 first shielding area" and "column 4 first shielding area" are similarly disposed in the remaining column 3 and column 4.

Referring to FIG. 11A, which is a cross-sectional view of B-B' of the column 1 first shielding area 261, the Pin Input Signal Lines 200-1 to 200-3 are disposed on the second signal layer 464, which is an intermediate layer of the Semiconductor IC 400 signal layer and, the upper shielding area 261-1 of the column 1 first shielding area 261 is disposed above the three signal lines 200-1 to 200-3 disposed on the second signal layer 464 and, a lower shielding area 261-2 of the column 1 first shielding area 261 is disposed on the lower side, that is, the column 1 first shielding area 261 is divided into an upper shielding area 261-1 and a lower shielding area 261-2, and is disposed above and below the Sensing Signal Lines 200-1 to 200-3.

The upper shielding area 261-1 and the lower shielding area 261-2 are electrically connected to a contact point at an arbitrary point and are connected to the column 1 first shielding area Driving Signal Line 251. The column 1 first shielding area Driving Signal Line 251 is connected to the Driving Unit 420 to apply a driving voltage to the column 1 first shielding area 261.

When a stable DC voltage is applied to the Column 1 first shielding area 261 disposed above and below the Sensing Signal Lines 200-1 to 200-3, coupling by capacitor formed between the Sensing Signal Line 200-1 and (exist on the upper and lower sides of the shielding area) the "other signal line" of (not illustrated) another signal layer is blocked by the first shielding area 261 and, noise interference due to coupling between the Sensing Signal Line 200-1 and the "other signal line" does not occur, and when a driving voltage is applied to the first shielding area, a deviation of a voltage detected by the Sensing Signal Line 202 is reduced as described below, thereby improving a resolution of ADC.

In addition, since there are "other signal lines" on the left and right sides of the Sensing Signal Line 200-1, it is desirable to apply a DC voltage or a Driving Voltage by disposing the shielding area 261-3 on the left and right sides of the Sensing Signal Line 200-1. In this case, the shielding area 261-3 located on the left and right sides of the Sensing Signal Line 200-1 is connected to the column 1 first region Driving Signal Line 251 or the upper shielding area 261-1 or the lower shielding area 261-2 using a short point technique of the semiconductor manufacturing process at any point. All column Sensing Signal Lines 210/220/230/240 are also disposed in the intermediate layer 464 of the semiconductor signal (or metal) layer, and second shielding area 263, 264 are placed at the upper side 465, the lower side 453 signal layer, and the left and right sides.

In addition, a "Group 1 third shielding area" 265 and a "Group 2 third shielding area" 266 are placed on the upper and lower layers and left and right of the "Group 1 Sensing Signal Line" 250-1 and the "Group 2 Sensing Signal Line" 250-2. In addition, a "Driving signal line" of shielding area is placed in each shielding area and connected to the driving unit 420.

In the embodiment of the present invention, the first shielding area, the second shielding area, and the third shielding area are virtual areas introduced to describe the embodiment of the shielding area. In practice, it may be further subdivided, or reduced to one or two. An important point is that a shielding area is placed in all paths until one Sensing Signal Line 202 reaches the Signal Detector 410 through the layout inside the Semiconductor IC 400, and the shielding area is connected to the "Driving Signal Line of Shielding area" to be connected to the Driving unit 420, and the Driving unit 420 applies a driving voltage according to the driving method shown in FIG. 14, which will be described later.

As described above, a certain Sensing Signal Line 202 is connected to the input pin 401 of the Semiconductor IC 400 and a shielding area is provided above, below, or left and right of all paths input to the Signal Detector 410, but, when no signal is detected, a stable DC voltage is supplied to the shielding area to block noise, when a signal is detected, a driving voltage is applied to the shielding area so that the term of Shielding Capacitor is located in the molecule of [Equation 1]. At this time, in [Equation 1], the internal parasitic capacitor Cprs, which is the cause of the deviation of the detection value, is removed, and instead, the deviation of the voltage detected in the Sensing Signal Line 202 is reduced due to the driving of the Shielding Capacitor. This has the advantage of improving the resolution of the ADC.

In the embodiment of FIG. 10 and FIG. 11A, the column first shielding area covers all Sensing Signal Lines 200-1 to 200-3 included in the shielding area and drives the shielding area with one shielding area Driving Signal Line. However, it is possible to place an individual shielding area for each Sensing Signal Line, such as a dedicated shielding area for Sensing Signal Line 200-1 and a dedicated shielding area for Sensing Signal Line 200-2, and to apply a driving voltage for each individual shielding area. In this case, there is a disadvantage in that the number of Driving Units driving the individual shielding area increases. However, since only the required shielding capacitor is driven, the area of the shielding area for driving is reduced. Therefore, the current capacity of the driving element of the driving unit is decreased due to the decrease in capacitive loading, thereby reducing current consumption.

In the previous embodiment, it has been described that the layout inside the Semiconductor IC is modified and shielding areas are placed on the upper and lower surfaces and left and right of the Sensing Signal Lines 200-1,210-240,250-1/250-2. Between the upper and lower shielding areas facing the Sensing Signal Line 200-1,210-240,250-1/250-2 and the shielding layout on the left and right of the Sensing Signal Line 200-1,210-240,250-1/250-2, a capacitor is formed. The sum of these capacitors is called a Shielding Capacitor Cin_sd.

Since the Shielding Capacitor Cin_sd is formed between the Sensing Signal Line 202 and the shielding area, the Shielding Capacitor Cin_sd may be changed into an equivalent circuit in which one side is connected to the Sensing Signal Line 202 and the other side is connected to the voltage supplied to the shielding area. In addition, since the Shielding Capacitor Cin_sd is connected in parallel with the common electrode capacitor Ccm and the inter-line capacitor Cd in the configuration of the Sensing Signal Line 202, one side is connected to the point P and a voltage Vcin is applied to the other side as shown in FIG. 12B.

Referring to [Equation 1], when the object capacitor Cobj is added to the denominator of [Equation 1], the amplitude of the capacitance decreases as the value of the capacitance located in the denominator increases. In order to improve the sensitivity of the object capacitor, the amplitude of the capacitance present in the denominator must be reduced.

The present invention is to detect the Object Capacitor Cobj when the Object Capacitor Cobj is added. In order to achieve this purpose, since it is necessary to improve the sensitivity of the Object Capacitor Cobj, a method of reducing the size of the common electrode capacitor Ccm by the empty space 150 has been proposed, and a method of adjusting the line width d_pad of Sensing Signal Lines has been proposed to reduce the size of the interline capacitance Cd. Since the Shielding Capacitor Cin_sd also affects the detection sensitivity of the object capacitor Cobj, the smaller the shielding capacitance, the better, and the following is a method for reducing the size of the shielding capacitance Cin_sd.

Since The smaller the opposite area of the two conductors, the smaller the amplitude of the capacitor formed between the two conductors, narrow the width of the Sensing Signal Line 200-1,210-240,250-1/250-2 that forms the shielding capacitor (minimize the opposing area S, and the Sensing Signal Line 200-1,210-240,250-1/250-2) and shielding area by thickening the thickness of the insulator 462 (minimization of the opposing distance d) and increasing the distance between the shielding layout on the left and right of the Sensing Signal Line (minimizing the opposing distance d), the size (or, amplitude) of the shielding Capacitance Cin_sd decreases.

In the process of the Semiconductor IC 400, the minimum width of the metal constituting the Sensing Signal Lines 200-1, 210-240, 250-1/250-2 and the minimum thickness of the insulator 462 may not be changed.

When the size of the shielding capacitance Cin_sd formed according to the minimum width of the metal and the minimum thickness of the insulator 462 is not satisfactory, there is a limit to reducing the size of the shielding capacitance Cin_sd.

In order to solve this problem, the present invention places the Sensing Signal Line 200-1,210-240,250-1/250-2 on the top layer of the Semiconductor IC 400 so that there is no signal layer on the upper side of the Sensing Signal Line and placed the shielding area only on the lower side of the Signal Line 200-1,210-240,250-1/250-2.

Figure 11B:
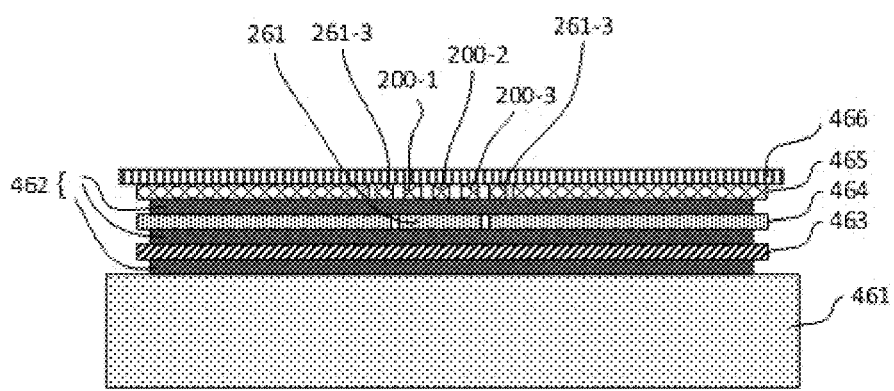
FIG. 11B is another embodiment of the present invention related to the implementation of the shielding area.

FIG. 11B is another embodiment of the present invention related to an implementation of a shielding area. Referring to FIG. 11B, the three Pin Input Signal Lines 200-1 to 200-3 inside the Semiconductor IC 400 are disposed on the uppermost layer 465 of the metal layers of the Semiconductor IC 400, and there is no metal layer for disposing "other signal lines" on the upper layer of the Pin Input Signal Lines 200-1 to 200-3.

A column 1 first shielding area 261 is disposed under the Pin Input Signal Line 200-1 to 200-3, and a shielding area 261-3 electrically connected to the column 1 first shielding area 261 is also placed on the left and right sides of the CDA signal line. This kind of structure is also applied to the column Sensing Signal Line 210 to 240 and the group Sensing Signal Line 250, and all Sensing Signal Lines.

In this structure, compared to the embodiment of FIG. 11A in which the shielding areas are disposed on the upper and lower sides and left and right of the Sensing Signal Line 200-1,210-240,250-1/250-2, since the shielding areas are disposed only on the lower side and the left and right sides, it has the effect of reducing the size of the Shielding Capacitance Cin_sd by about half.

Since the Sensing Signal Line 200-1,210-240,250-1/250-2 disposed on the uppermost layer sometimes uses the lower metal layers 463 and 464 in order to be connected to the Signal Detector 410, it is desirable to keep the ratio of the Sensing Signal Line placed at the top to 50% or more regarding the total Sensing Signal Line ratio.

As described so far, in this invention, 1 common electrode capacitor Ccm, 2 inter-line composite capacitor Cd, and 3 Shielding capacitor Cin_sd are coupled at one CDA signal line 200. if the resistance of the CDA signal line 200 is not considered, the CDA signal line 200 is equivalent to one point P of FIG. 1, which is equivalent to one point P as if the common electrode capacitor Ccm, the inter-line composite capacitor Cd, and the shielding capacitor Cin_sd are connected in parallel.

In the conventional embodiment, the shielding capacitor Cin_sd is located in the denominator of [Equation 1] in the form of an uncontrollable internal parasitic capacitor Cprs and serves as an unnecessary dummy to lower the sensitivity. And in some cases, a specially manufactured capacitor is introduced to apply a driving voltage, and the capacitor is added to the denominator of [Equation 1] to degrade sensitivity. However, in this invention, the internal parasitic capacitor, which used to serve as an unnecessary dummy, is converted into a shielding capacitor to apply a driving voltage, and additional charges are supplied to improve sensitivity.

FIG. 12A is an embodiment of the present invention for applying a driving voltage to a shielding capacitor Cin_sd. Referring to FIG. 12A, iin_sd=id+icm. Here, iin_sd is the current flowing in the shielding capacitor Cin_sd, icm is the current flowing in the common electrode capacitor Ccm, and id is the current flowing in the inter-line capacitor Cd. And Vd is a constant voltage applied to one side of the inter-line capacitor Cd, and Vcm is a common electrode constant voltage applied to one side of the common electrode capacitor Ccm. Also, two driving voltages divided into Vcin1 and Vcin2 are applied to one side of the shielding capacitor Cin_sd.

At this time, iin_sd=Cin_sd*(Vcin−Vp), id=Cd*(Vp−Vd), and icm=Ccm*(Vp−Vcm).

Since iin_sd=id+icm, Cin_sd*(Vcin−Vp)=Cd*(Vp−Vd)+Ccm*(Vp−Vcm).

When this equation is summarized for Vp, it can be seen that $$Vp = \frac{Cd * Vd + Cin\_sd * Vcin + Ccm * Vcm}{Cd + Cin\_sd + Ccm}.$$

When applying Vcin1 to the Shielding Capacitor Cin_sd, Vp1, which is the voltage of point P, is $$Vp1 = \frac{Cd * Vd + Cin\_sd * Vcin1 + Ccm * Vcm}{Cd + Cin\_sd + Ccm},$$

when applying Vcin2 to the Shielding Capacitor Cin_sd, Vp2, which is the voltage of point P, is $$Vp2 = \frac{Cd * Vd + Cin\_sd * Vcin2 + Ccm * Vcm}{Cd + Cin\_sd + Ccm},$$

The shielding capacitor Cin_sd is driven with two different voltages, Vcin1 and Vcin2, and the difference between Vp1 and Vp2 detected in P is shown in [Equation 3] below.

$$Vp2 - Vp1 = \frac{(Vcin2 - Vcin1) * Cin\_sd}{Cd + Cin\_sd + Ccm} \qquad \text{[Equation 3]}$$

FIG. 12B is an embodiment of applying a driving voltage to the inter-line capacitor Cd and the shielding capacitor Cin_sd, respectively, and applying a driving voltage to a capacitor excluding the common electrode capacitor Ccm.

In the embodiment of FIG. 1, the driving voltages Vd1, Vd2 were applied only to the inter-line capacitor Cd to induce [Equation 1], and in the embodiment of FIG. 12A, the driving voltages Vcin1, Vcin2 are applied only to the shielding capacitor Cin_sd to induce [Equation 3].

Referring to FIG. 12B, a driving voltage is applied to the inter-line capacitor Cd and the shielding capacitor Cin_sd. The inter-line capacitor Cd is driven by Vd1 and Vd2, and the shielding capacitor Cin_sd is driven by Vcin1 and Vcin2. When a driving voltage is applied to two capacitors, a voltage Vp of the point P may be obtained by a superposition theory with reference to [Equation 1] and [Equation 3].

When the driving voltages are applied to the inter-line capacitor Cd and the shielding capacitor Cin_sd, the voltage Vp of the point P is represented as [Equation 4].

$$Vp2 - Vp1 = \frac{(Vd2 - Vd1) * Cd + (Vcin2 - Vcin1) * Cin\_sd}{Cd + Cin\_sd + Ccm} \qquad \text{[Equation 4]}$$

FIG. 13A is a virtual data for verifying [Equation 4] and is the same data as in FIG. 2. is a simulation result value for Vp2–Vp1 and data for One Direction Driving in which only inter-line capacitor Cd is driven. FIG. 13A is a simulation result value of Vp2–Vp1 for Bi-Direction Driving that simultaneously drives two capacitors, such as inter-line capacitor Cd and shielding capacitor Cin_sd and includes a simulation result value for One Direction Driving.

When the data of FIG. 13A is applied to [Equation 1] and One Direction Driving is performed with only the inter-line capacitor Cd with Vd1 and Vd2 driving voltages, the difference between the maximum and minimum values of Vp2–Vp1 is 1.429V. And in the case of Bi-Direction Driving, where inter-line capacitor Cd except for common electrode capacitor Ccm is driven by Vd2 and Vd1 and Shielding Capacitor Cin_sd is driven by Vcin2 and Vcin1, the difference between the maximum and minimum voltage of Vp2–Vp1 is 0.271V.

When a 10-bit ADC having a detection range of 1.6V is used to detect 1.429V, which is Vp2–Vp1 of the point P when One Direction Driving, the resolution is 1.56 mV/bit. And, when 0.271V, which is detected at the point P during Bi-Direction Driving, is detected as a 10 bit ADC with a detection range of 300 mV, the resolution is about 0.3 mV/bit, and thus the resolution is improved by about 5 times or more even if the driving method is different in the same capacitor configuration.

This phenomenon is because the capacitor to which the driving voltage is not applied operates as a load capacitor that shares charge by the charge supplied by the capacitor to which the driving voltage is applied, but the driven capacitor operates as a source of charge and. the larger the size of the capacitance supplying electric charges within a predetermined size of the capacitance connected to each other in common, the smaller the size of the load capacitance, resulting in less voltage difference for the same driving voltage. In addition, as the driving capacitor increases, the charge sharing capacity in the added object capacitor Cobj increases, and thus sensitivity is improved.

Since the voltage difference Vp2–Vp1 due to the driving voltage is caused by the deviation of the load capacitor not driven among the total capacitor, the deviation of Vp2-Vp1 occurs smaller as the proportion of the non-driving capacitor in the total capacitor (capacitor located in the denominator of [Equation 1]). According to this principle, the present invention provides a method for reducing the capacitance of capacitor located in the denominator of [Equation 1], modifies the internal parasitic capacitor Cprs to which the driving voltage may not be applied to apply the driving voltage, and applies the driving voltage to the common electrode capacitor Ccm. Accordingly, since the deviation of the voltage detected in the Sensing Signal Line 202 is reduced before and after the driving voltage is applied, the resolution of the ADC is improved by narrowing the detection range of the ADC, and the detection sensitivity of the added Object Capacitor Cobj is improved.

Figure 13B:
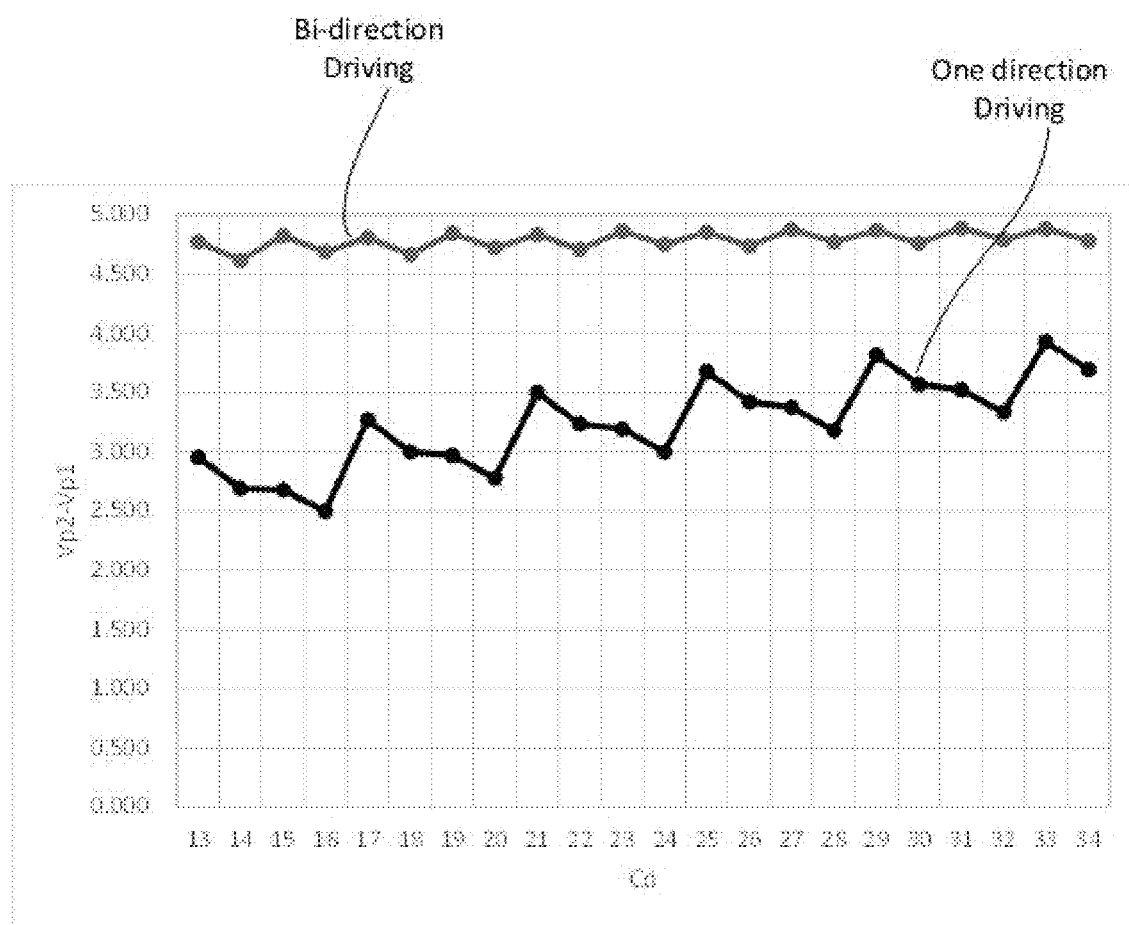
FIG. 13B is a result graph of [Equation 1] and [Equation 4] calculated based on the data of FIG. 13A.

Meanwhile, FIG. 13B is a result graph of [Equation 1] and [Equation 4] calculated based on the data of FIG. 13A.

FIG. 13B illustrates Vp2−Vp1 for One Direction Driving based on [Equation 1] and Bi-Direction Driving based on [Equation 4] under the same conditions. In the case of One Direction Driving, the common electrode capacitor Ccm and the internal parasitic capacitor Cprs operate at the load capacitor, resulting in a large deviation of Vp2−Vp1. But, In the case of Bi-Direction Driving, only the common electrode capacitor Ccm operates as the load capacitor, and most of the common electrode capacitor Ccm causes a deviation of Vp2−Vp1, so that the fluctuation range of Vp2−Vp1 is stable with respect to the relatively small common electrode capacitor Ccm.

Referring back to FIG. 13A and FIG. 13B, it may be expected that when the size of the shielding capacitance Cin_sd is almost constant, the variation range of the voltage detected at the point P will be further reduced. Shielding Capacitance Cin_sd is mainly determined by the width of the Sensing Signal Line 200-1,210-240,250-1/250-2 inside the Semiconductor IC 400, so adjusting the signal line width, it is possible to set the size of the shielding capacitance by line to be almost similar for each signal line.

In one embodiment, a signal line with a long length of the Sensing Signal Line narrows the width to a minimum line width to reduce the shielding capacitance Cin_sd, and a signal line with a short length of the Sensing Signal Line increases the size of the Shielding Capacitance Cin_sd by making the line width wider. Since the length of the Sensing Signal Line can be calculated in the Semiconductor IC 400, it is possible to maintain a constant size of the shielding capacitance Cin_sd for each Sensing Signal Line by designing and manufacturing the same area as all Sensing Signal Lines.

As described above, in this invention, the line width of the internal Sensing Signal Line 200-1, 210-240, 250-1/250-2 of the Semiconductor IC 400 is adjusted, and the width of the long signal line is narrower than that of the short signal line, so that the area between the Sensing Signal Lines is similarly adjusted. And the areas of the Sensing Signal Lines are similarly adjusted, and the size of the shielding capacitance Cin_sd formed by the Sensing Signal Lines 200-1, 210-240, 250-1/250-2 may be similarly generated for each signal line, thereby reducing the deviation of Vp2−Vp1 by [Equation 4].

So far, the expression "Forcing (or applying) the Driving Voltage" has been used for applying Vd1 and Vd2 to the inter-line capacitor Cd of [Equation 1] or [Equation 4], or applying Vcin1 and Vcin2 to the Shielding Capacitor Cin_sd, applying the driving voltage is to apply two voltages having different amplitudes to the capacitor.

Figure 14:
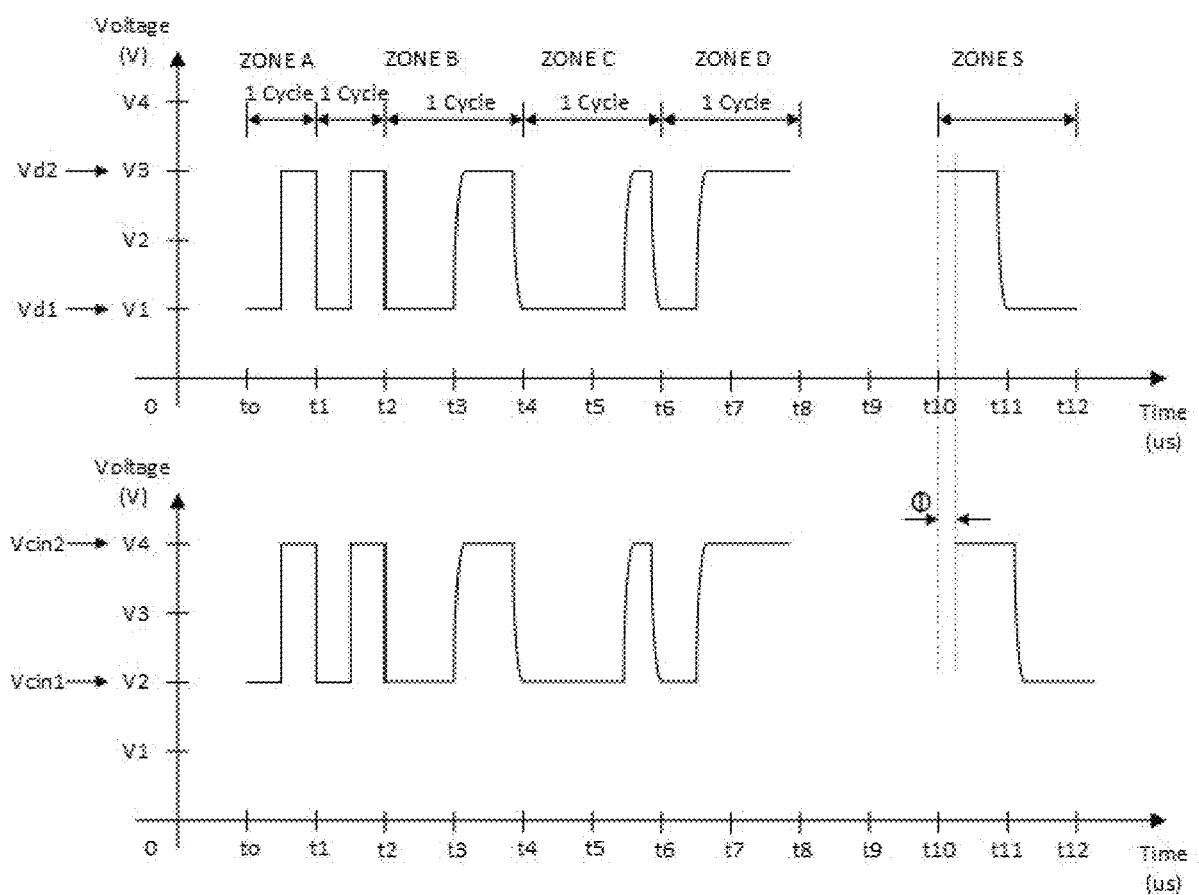
FIG. 14 is an embodiment of the present invention for applying a driving voltage.

FIG. 14 is an embodiment of the present invention for applying a driving voltage.

Referring to FIG. 14, the upper drawing is an embodiment of a method of applying the driving voltages Vd2, Vd1 to the inter-line capacitor Cd, and the lower drawing is an embodiment of applying the driving voltages Vcin2, Vcin1 to the shielding capacitor Cd, and the driving voltage has the following characteristics.

1. The driving voltage consists of High Voltage and Low Voltage, and a combination of High Voltage and Low Voltage constitutes one Cycle Time.

As charge increases or decreases in a capacitor driven by a change in a driving voltage, and as the charge increases or decreases, a voltage change generated in a non-driving capacitor may be detected using a charge sharing phenomenon generated in the non-driving capacitor.

2. A different cycle time may be applied according to the location of the CDA 100 placed in the display part 10.

For example, the line resistance and the interline capacitance Cd of the CDA signal line 201 in the long-distance of the Semiconductor IC 400 are bigger than the line resistance and the interline capacitance Cd of the CDA signal line 203 in the short-distance of the Semiconductor IC 400, more time is required for the signal to be in a stable state (Saturation Status). Therefore, the cycle timer of the driving voltage supplied to the long-distance CDA signal line should be longer than the cycle time supplied to the short-distance CDA.

Referring to ZONE A of FIG. 14, the cycle time is 50% compared to ZONE B to ZONE D. The cycle time of ZONE A may be applied to the CDA 103 located near the Semiconductor IC 400, and a cycle having a width twice or three times or more than the cycle time of ZONE A may be applied to the CDA 101 in the long-distance of the Semiconductor IC 400.

3. In order to apply the driving voltage, when changing the voltage from Low Voltage to High Voltage or changing from High Voltage to Low Voltage, there is a method of driving with a pulse wave as in the embodiment of ZONE A of FIG. 14, and as in the embodiment of ZONE B to ZONE D, there is a way to gently drive the rising edge and the falling edge like a sine wave. If the edge is driven with a sharp pulse wave, EMC or EMI problem may be caused by voltages with sharp rising or falling edges, such as the first, 3rd, or 5th harmonic of the pulse wave. Accordingly, it is desirable to drive gently in the form of sine wave.

4. The driving voltage may be driven as "from Low Voltage to High Voltage" as in the embodiment of ZONE A to ZONE D of FIG. 14 and may be driven as "from High Voltage to Low Voltage" as in the embodiment of ZONE S of FIG. 14. However, a low voltage or a high voltage shall be simultaneously applied to a capacitor connected to one Sensing Signal Line.

For example, it means that you should not drive "from Low Voltage to High Voltage" for inter-line capacitor Cd and "from High Voltage to Low Voltage" for Shielding Capacitor Cin_sd, simultaneously. This is to induce a charge sharing phenomenon in the load capacitor, and when voltages of different polarities are applied at the same time, the amount of increased or decreased charges may be similar, and the charge sharing phenomenon may not be generated. High Voltage and Low Voltage are relative concepts. Since the driving voltage has two states of low voltage and high voltage, it should be understood that one of them is low voltage and one is high voltage. This idea also applies to all voltages having two states of Low Voltage and High Voltage in the present invention. In the case of a plurality of voltages, the meaning of Low Voltage and High Voltage means that one of the two voltages being compared is low and one is high.

5. The duty of the First Stage Driving Voltage and the duty of the Second Stage Driving Voltage differ in the driving voltage Cycle. The First Stage Driving Voltage is the driving voltage supplied first, and it is a voltage with a difference in voltage level from the Second Stage Driving Voltage supplied second. For example, if the First Stage Driving Voltage is Low Voltage, the Second Stage Driving Voltage is High Voltage and, if First Stage Driving Voltage is High Voltage, Second Stage Driving Voltage is Low Voltage.

Since the time constant of the CDA signal line placed in the long-distance in the display part 10 is larger than that of the short-distance CDA signal line, the time for the signal of the long-distance line to be saturated and stabilized is longer than that of the short-distance CDA signal line. For this reason, as shown in ZONE D of FIG. 14, the forcing time of the High Voltage Vd2, Vcin2 which is the Second Stage Driving Voltage is longer than the Low Voltage Vd1, Vcin1 which is the First Stage Driving Voltage supplied to the long-distance.

In addition, in the CDA signal line in the short distance, the time of the First Stage Driving voltage is long and the time of the Second Stage Driving voltage is short like ZONE C. However, in the case of a short-distance CDA signal line, it is more preferable to shorten the cycle time as in the embodiment of ZONE A because the detection time can be reduced.

6. A phase difference of a Second Stage Driving Voltage supplied to an individual capacitor connected to the same Sensing Signal Line may occur for each length of the Sensing Signal Line (or per CDA position) in one column.

Referring to FIG. 12B and FIG. 14, Vd2 is supplied to the inter-line capacitor Cd as a Second Stage Driving Voltage, and Vcin2 is supplied to the Shielding Capacitor Cin_sd as a Second Stage Driving Voltage. The size of the interline capacitance Cd of the long-distance CDA signal line may be bigger than the size of the shielding capacitance Cin_sd of the same CDA signal line. If the Second Stage Driving voltage is applied to both capacitors at the same time, even after the voltage of the shielding capacitor Cin_sd with a small-time constant is first stabilized, the inter-line capacitor with a large time constant may be in the process of continuously increasing the voltage. According to the superposition principle, the shielding capacitor Cin_sd, which first reached a stable state, starts to discharge after it is stabilized, and the discharge continues until the voltage of the inter-line capacitor is stabilized and a signal is detected. Since an error of a signal detected by the Sensing Signal Line 202 may occur due to the discharge, the driving voltage applied to the shielding capacitor Cin_sd may preferably be applied late at a different application time.

ZONE S is a diagram explaining these technical ideas. After a time of "Φ" after the Second Voltage Vd2 of the upper Figure is applied, Vcin2, which is a Second Stage Driving Voltage, is supplied to the shielding capacitor Cin_sd.

Since the size of the interline capacitance Cd of the CDA signal line in the short-distance may be smaller than the Shielding Capacitance Cin_sd, after the Second Stage Driving Voltage for shielding capacitor is first applied to the signal line in the short-distance, the Second Stage Driving Voltage can be applied to the inter-line capacitor Cd.

Since the driving voltage is applied to the capacitor, an instantaneous overcurrent flows in the capacitor due to a sharp voltage such as the first harmonic and the third harmonic of the transition voltage such as the initial rising or falling of the driving voltage, and this changes the amplitude of the driving voltage or, a component of a switch that applies a driving voltage from the Driving Unit 420 may be continuously damaged, and if this situation continues, the component may be damaged. A method of avoiding this problem is to use different driving units 420 for each capacitor to have different driving timings.

7. The amplitude of the driving voltage supplied to the inter-line capacitor Cd and the amplitude of the driving voltage supplied to the shielding capacitor Cin_sd may be different from each other.

Figure 15:
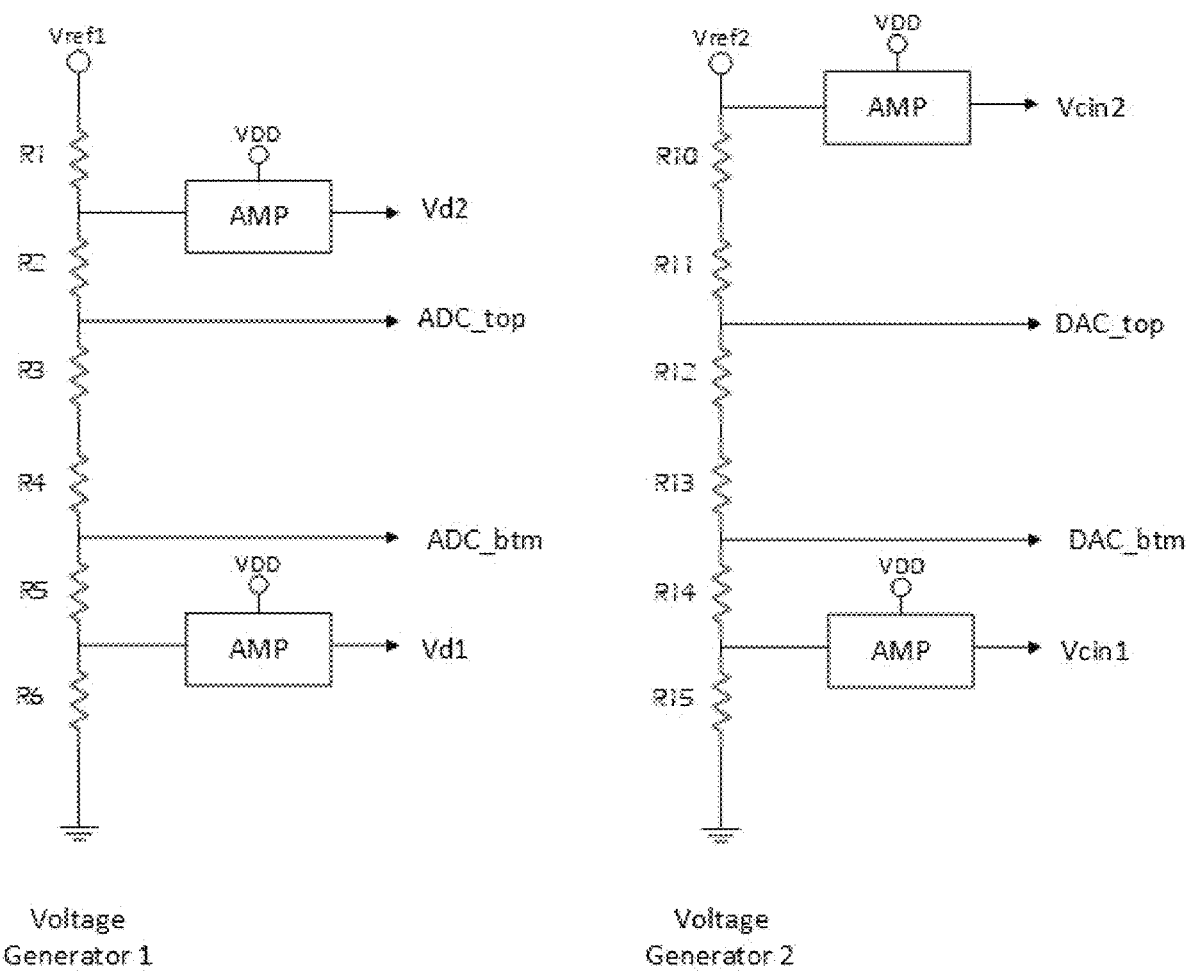
FIG. 15 is an embodiment of the present invention for applying a driving voltage in the driving unit.

FIG. 15 is an embodiment of the present invention for applying a driving voltage in the driving unit 420, and referring to FIG. 15, there are Voltage Generators (hereinafter, referred to as VG) VG1 and VG2. There are a reference voltage Vref1 supplied to the resistor string of the VG1 and a reference voltage Vref2 supplied to the VG2.

The reference voltages Vref1 and Vref2 are voltages having a precise amplitude generated by a Band Gap Reference (BGR), and the two reference voltages Vref1 and Vref2 may have different voltages.

The driving voltage is generated by the AMP. The amplitude of the AMP output voltage is determined using the reference voltage quoted from the resistor string, and the current is supplied from the power supply VDD supplied to the AMP. The part that generates the driving voltage composed of the reference voltage and the AMP is called the Driving Voltage Generator.

In single Voltage Generator, several reference voltages and driving voltages are generated. For example, Vd1/Vd2, which is the driving voltage of the present invention, and ADC_top and ADC_btm, which are the reference voltages applied to the ADC, are generated in VG1, and Vcin1/Vcin2 and DAC_top or DAC_btm, which are the DAC reference voltages, may be generated in VG2.

By the driving voltages Vd1/Vd2 and Vcin1/Vcin2 separately generated from the separated Voltage Generator, voltage drop or damage to parts due to the above-described peak current is prevented.

As described above, in this invention, the driving voltages generated by different voltage generators can be used as driving voltages for different capacitors. For example, Vd1/Vd2, which is a driving voltage generated in VG1, may be used for inter-line capacitor connected to the same point P, and Vcin1/Vcin2 generated in VG2 may be used for a shielding capacitor.

Referring to [Equation 4] and FIG. 13A, in the case of Bi-Direction Driving, Vp2-Vp1 detected by the Sensing Signal Line 200 is 4.615V to 4.886V. In general, OPAMP is widely used in processing analog signals and outputting digital signals using ADC, and in the case of general OPAMP other than Rail to Rail type OPAMP, when Vdd of single power is supplied to the power voltage, sufficient output is not generated. For example, when the power of the OPAMP used as the buffer is a 5V single power source with 0V as the ground, if the input signal of the OPAMP is 5V, the same output voltage should be output 5V, but only about 4.5V may be output. Therefore, in the case of the OPAMP using a single power of 5V in this device as well, the voltage of 4.615V to 4.886V in FIG. 13A may not be normally output, but only 4.5V may be output.

Referring to [Equation 4], by varying the amplitude of the driving voltage Vd2-Vd1 or the driving voltage Vcin2-Vcin1, the value of Vp2-Vp1 during the Bi-Direction Driving of FIG. 13A may be adjusted to be 4.5V or less instead of in the range of 4.615-4.886V.

For example, you could adjust Vd2-Vd1=5V, Vcin2-Vcin1=3V. For this, the inter-line capacitor driving voltage is Vd2=5V, Vd1=0V, and it is possible to design the shielding capacitor driving voltage Vcin2=4V, Vcin1=1V. As in the embodiment of FIG. 15, the inter-line capacitor driving voltages Vd2 and Vd1 may be finely adjusted through a resistance string of VG1, and the shielding capacitor driving voltage generated in VG2 may be adjusted to have various voltages, thereby setting an operating point of OPAMP as a safe region.

As described above, in the present invention, the high voltage or low voltage of the driving voltage supplied to different capacitors may use the same voltage or different voltages, and use different driving voltages, it is possible to adjust the voltage level being formed. In addition, the device of the present invention provides a plurality of power supplies (Voltage Reference) for generating these different driving voltages.

The embodiment of FIG. 15, which is a device for generating a driving voltage, is an embodiment using a resistor string, and it is possible to generate a driving voltage in a method different from the method of FIG. 15. For example, all driving voltages may be independently supplied one by one using a regulator, and several independent driving voltages may be generated using a Band Gap Reference (BGR), and only the current capacity thereof may be amplified and used. Therefore, the method of generating the driving voltage is not limited to the method using the resistor string as in the embodiment of FIG. 15, and various methods may be used.

As in the embodiment of FIG. 3, one CDA 100 and the Sensing Signal Line 202 connected thereto have a plurality of capacitors, that is, common electrode capacitor Ccm and inter-line capacitor Cd and Shielding Capacitor Cin_sd is formed. This invention induces [Equation 4] for detecting Vp2−Vp1 at the point P, which is a Sensing Signal Line 202 or an equivalent circuit, by driving inter-line capacitor Cd and shielding capacitor Cin_sd excluding a common electrode capacitor Ccm.

When the Ccm driving layer 6 of FIG. 6 is also driven with driving voltages having different amplitudes of Vcm1 and Vcm2, another equation in which a term "(Vcm2−Vcm1)*Ccm" may be added to a molecule of [Equation 4] may be generated, this will contribute to lower the variation value of Vp2−Vp1 due to the common electrode capacitor Ccm of various sizes generated by the CDA 100 and the signal line connected thereto.

As discussed above, one Sensing Signal Line 202 can be equivalent to one point P as shown in FIG. 1 or FIG. 12 if resistance is not considered, and one side of the plurality of capacitors generated by the Sensing Signal Line 202, that is, common electrode capacitor Ccm and inter-line capacitor Cd and Shielding Capacitor Cin_sd, is commonly connected in parallel to the point P, and by applying a driving voltage to the other end of the remaining capacitors except for the common electrode capacitor Ccm, The process of detecting Vp1, Vp2, or Vp2−Vp1 at the point P has been described. In addition, the process of detecting Vp1, Vp2, or Vp2−Vp1 at the point P was also used as another term, "detecting a signal".

Hereinafter, an embodiment of the present invention for detecting an object by applying a driving voltage will be described with reference to FIG. 12B.

$$\text{is } Vp2 - Vp1 = \frac{(Vd2 - Vd1)*Cd + (Vcin2 - Vcin1)*Cin\_sd}{Cd + Cin\_sd + Ccm}. \quad \text{[Equation 4]}$$

If we qualitatively analyze [Equation 4], in FIG. 12B, Vd1, which determines Vp1, is applied to the inter-line capacitor, and Vcin1 is applied to the shielding capacitor, and a predetermined time is waited until the voltage at the point P is stabilized. Then, when the voltage at the point P is detected by the Signal Detector 410 at this time, it becomes Vp1. After that, after applying Vd2 and Vcin2 to detect Vp2, a predetermined time is waited until the signal at the point P reaches saturation (or target value), and then the voltage at the point P is detected with the Signal Detector 410. [Equation 4] is the difference between Vp1 and Vp2 detected in this way.

The present invention aims to find out whether the object 20 appears or not and the position (Coordinate) of the object 20 as the amount of change in the object capacitor Cobj when the object 20 is located on the upper surface of the display part 10.

Referring to FIG. 4, when the object 20 is positioned on the upper surface of the CDA 100, an object capacitor Cobj is formed between the CDA 100 and the object 20, and the size of the object capacitor is "Cobj=ed/S".

Here, "d" is the distance between the object 20 and the CDA 100, and "S" is the opposing area between the object 20 and the CDA 100.

The elements determining the gap "d" are a protective layer 7 composed of protective glass or a protective film between the CDA 100 and Object 20, and transparent adhesive (not shown) such as Adhesive that bonds the CDA 100 with the protective layer 7, and when the object 20 does not touch the upper surface of the protective layer 7, it is an air layer or the like.

The size of the Object Capacitor Cobj is composed of the following three elements based on the opposing areas of the object 20 and the CDA 100, which are 1) the capacitance Cair formed by the thickness of the air layer and the dielectric constant (e) of the air, 2) the capacitance Cgls formed by the thickness of the protective layer, 3) Capacitance Cadh formed based on the thickness of the transparent adhesive and the dielectric constant (e) of the transparent adhesive element. And finally, the size of the Object Capacitance Cobj is determined by the combined capacitance of Cair and Cgls and Cadh in series.

In the case of a general embodiment, when an object 20 with a part of 4 mm×4 mm contacts a protective glass having a thickness of 0.5 mm, which is a protective layer 7 on the upper surface of the CDA 100, according to the calculation, a capacitance of about 0.5 pF~1 pF is formed between the CAD 100 and the object 20.

The Object Capacitor Cobj formed on the upper surface of the CDA 100 may be equivalent to that one side is connected to the point P equivalent to the CDA signal line 200, and the other side is connected to Vobj, which is the voltage level of the object. If the object 20 is a human finger, the voltage level Vobj of the object 20 is 0 V, which is an Earth Ground, and in the case of Pen, the output voltage of the pen.

FIG. 12B is an embodiment of this invention for applying a driving voltage to an inter-line capacitor Cd and a shielding capacitor Cin_sd excluding a common electrode capacitor Ccm and is a method of detecting a voltage in the Sensing Signal Line 200 when an Object Capacitor Cobj generated by the appearance of an object is added. Referring to FIG. 12B and [Equation 4], when the object 20 is a human finger, since the potential Vobj of the object 20 is constant, [Equation 4] is derived as [Equation 5] by the principle of superposition.

$$Vp2 - Vp1 = \frac{(Vd2 - Vd1)*Cd + (Vcin2 - Vcin1)*Cin\_sd}{Cd + Cin\_sd + Ccm + Cobj} \quad \text{[Equation 5]}$$

Since the existence of the object 20 is determined by the size of the Object Capacitor Cobj, it is possible to know the existence or contact area of the object 20 by knowing the difference between [Equation 4] which is the voltage of point P when object 20 is not present, and [Equation 5] which is the voltage of point P when the object 20 is present. [Equation 6] is defined as [Equation 4]–[Equation 5] and is as follows.

$$[\text{Equation 4}] - [\text{Equation 5}] = \frac{(Vd2-Vd1)*Cd + (Vcin2-Vcin1)*Cin\_sd}{Cd+Cin\_sd+Ccm} - \frac{(Vd2-Vd1)*Cd + (Vcin2-Vcin1)*Cin\_sd}{Cd+Cin\_sd+Ccm+Cobj} \quad [\text{Equation 6}]$$

Referring to [Equation 6], the difference between [Equation 4] and [Equation 5] is the difference in the presence or absence of Object Capacitor Cobj of the denominator. Therefore, if the amount of change of [Equation 4] is detected based on the value of [Equation 4], it is possible to detect the amplitude of the Object Capacitor Cobj as a voltage.

When a signal detected by [Equation 4] is referred to as a "First Sensing Signal" when there is no object, and a signal detected by [Equation 5] is referred to as a "Second Sensing Signal" when there is an object, it is possible to detect the size of the Object Capacitor Cobj due to the difference between the First Sensing Signal and Second Sensing Signal.

In order to know the amount of change of "Second Sensing Signal" with respect to "First Sensing Signal", "First Sensing Signal" which is the standard, is preserved and recalled. In order to identify a difference from the regularly detected second signal, the First Sensing Signal must be recorded and preserved in the memory.

FIG. 16A to FIG. 16D are one embodiment of the present invention related to the use of a "Operational Amplifier", and the Operational Amplifier is included in the Signal Detector 410. The Operational Amplifier is a device that amplifies the difference between the voltage input to the positive input terminal and the voltage input to the negative input terminal, and the amplification factor is determined by the ratio between the feedback resistor and the resistors connected to the positive input terminal. (In this embodiment, the connection of the resistor that determines the amplification factor is omitted).

Figure 16A:
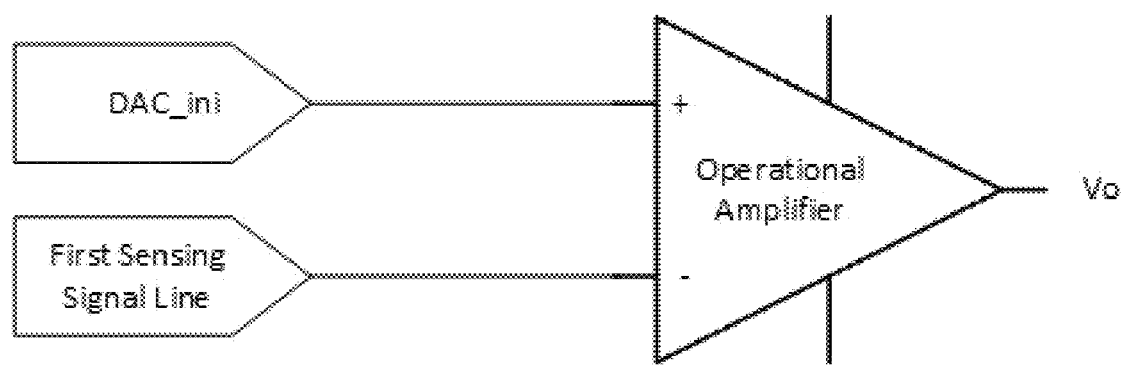
FIG. 16A is an embodiment of the present invention relating to the process of extracting the same duplicated DAC code as the First Sensing Signal.

FIG. 16A is an embodiment of the present invention relating to the process of extracting the same duplicated DAC code as the First Sensing Signal.

A DAC (Digital to Analog Converter) outputting analog voltage is connected to the positive input terminal, and "First Sensing Signal" is connected to the negative input terminal. Since the First Sensing Signal is detected by the Sensing Signal Line 200, the Sensing Signal Line is connected to the Negative Input terminal of the Operational Amplifier. The DAC is a device that outputs an analog voltage when a digital code is given, and since the DAC output is connected to the positive input terminal of the Operational Amplifier, two analog voltages are connected to the Operational Amplifier. And the Operational Amplifier amplifies the difference between the two voltages with an amplification factor according to a preset resistance ratio.

The output voltage Vo of the Operational Amplifier is a voltage according to the following [Equation 7].

$$Vo = \text{Gain}*(DAC_{ini} - \text{First Sensing Signal}) \quad [\text{Equation 7}]$$

DAC_ini is the initial output value of the DAC and is an arbitrary value. Or it may be a duplicated DAC value used before that. The circuit element characteristics of the Semiconductor IC 400 are changed according to the temperature change, so the First Sensing Signal detected by the Sensing Signal Line is changed frequently, and the duplicated DAC value that follows the First Sensing Signal must also be changed frequently.

Therefore, in the case of obtaining a corrected new DAC value by calling the old DAC value stored in the memory to correct the changed DAC, the DAC value stored in the memory may be used for the purpose of DAC_ini.

Since the new DAC value does not differ significantly from the old DAC value, it is possible to extract the new DAC in a short time. However, when power is applied to the device and there is no DAC value stored in the memory, an arbitrary DAC value must be set to DAC_ini and the value of DAC_ini must be changed while monitoring the output of the Operational Amplifier. Gain is the amplification factor of the Operational Amplifier.

In [Equation 7], if the amplitude of the voltage of DAC_ini is the same as the voltage of the First Sensing Signal, Vo becomes 0V (Zero Volt). That is, based on [Equation 4], when there is no object, the DAC_ini value is the same as the "First Sensing Signal" value when the Vo value detected by the Operational Amplifier becomes 0V by applying a driving voltage to the inter-line capacitor Cd and the shielding capacitor Cin_sd of FIG. 12B, and the extracted DAC Code is represented by DAC_copy, which is a duplicated value of the First Sensing Signal. (DAC_copy may mean a duplicated voltage output from DAC)

In the same way, the DAC code duplicated from the First Sensing Signal of all CDAs 100 is extracted and stored in the memory of the Semiconductor IC 400 for each CDA.

FIG. 17 is an embodiment of the present invention related to a memory for storing the DAC.

The First Sensing Signal detected in all CDAs 100 by [Equation 7] is stored in a memory as a DAC Code, and the DAC_rxcy stored in the memory is a duplicated DAC code detected in the CDA 100 located in Row x and Column y of FIG. 3. For example, DAC_r2C1 is the same DAC code as the First Sensing Signal detected in the A1 CDA 100 of FIG. 3.

The "First Sensing Signal" stored in the form of a DAC duplicated in the memory is recalled whenever the "Second Sensing Signal" of the corresponding CDA 100 is sensed. And it is connected to the positive or negative input terminal of the Operational Amplifier according to the embodiment of FIG. 16B to FIG. 16D or used in the embodiment of FIG. 16A to obtain a corrected DAC value.

Figure 16B:
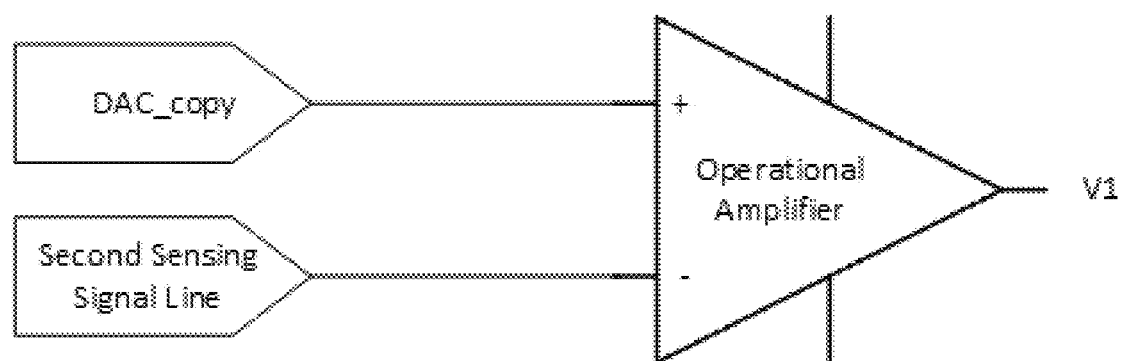
FIG. 16B is an embodiment of the present invention for the process of detecting the output signal V1 of the Operational Amplifier using the duplicated DAC.

FIG. 16B is an embodiment of the present invention for the process of detecting an output signal V1 of an Operational Amplifier using a duplicated DAC.

To the negative input terminal of the Operational Amplifier, the Sensing Signal Line 202, which forms a Second Sensing Signal based on [Equation 5] by the appearance of an object, is connected, and the duplicated DAC voltage of the First Sensing Signal is connected to the Positive Input terminal.

By this connection method, the output of the Operational Amplifier in accordance with the embodiment of FIG. 16B outputs a V1 voltage of [Equation 4]–[Equation 5] which is the same as [Equation 6] or "First Sensing Signal"–"Second Sensing Signal". In the embodiment of FIG. 16B, the transfer equation forming the output voltage V1 of the operational amplifier is the following [Equation 8].

$$V1 = Gain*(DAC\_copy - Second\ Sensing\ Signal) \quad [Equation\ 8]$$

Referring to [Equation 8], "V1" is an output from the Operational Amplifier by the difference between DAC_copy, which is the First Sensing Signal, and the Second Sensing Signal. Since the Second Sensing Signal is a signal that changes according to the Object Capacitor Cobj, the Operational Amplifier output V1 is a voltage that only the Object Capacitor Cobj acts as a variable, and its amplitude changes according to the Object Capacitor Cobj.

Figure 16C:
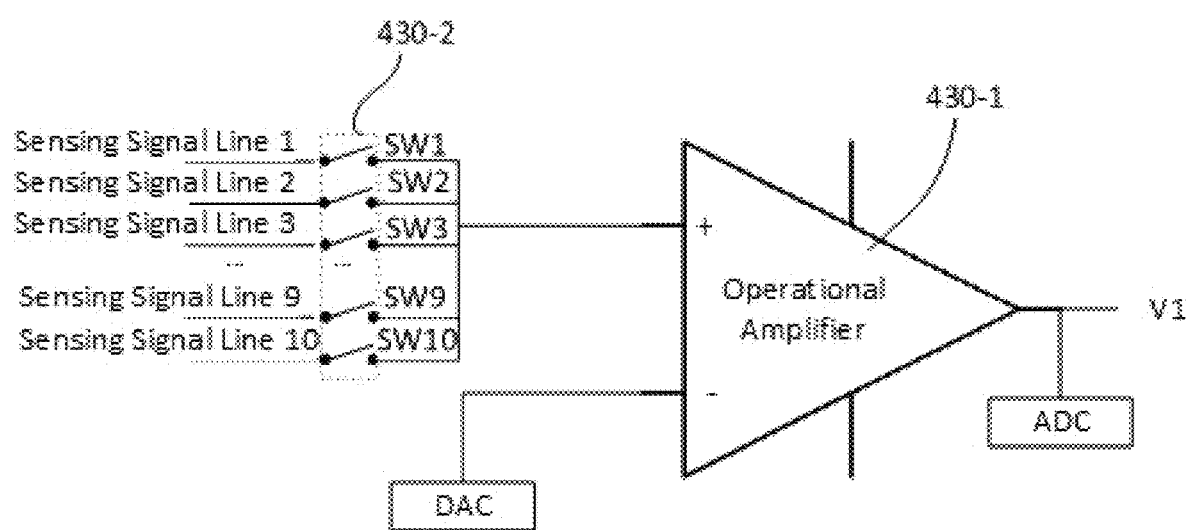
FIG. 16C is an embodiment of the present invention relating to a method of connecting a plurality of signal lines to one Operational Amplifier.

FIG. 16C is an embodiment of the present invention relating to a method of connecting a plurality of signal lines to one Operational Amplifier.

An embodiment of the present invention uses DAC to store the First Sensing Signal in memory as digital data. The DAC is sequentially recalled from the memory, and the output voltage of the recalled DAC is connected to an input terminal on one side of the Operational Amplifier, and the CDA's Sensing Signal Line 202 which is the master of the duplicated DAC is sequentially connected to the other input terminal of the Operational Amplifier, and the voltage difference is sequentially output.

In an embodiment of this invention, two or more DAC devices may be used, but when a large number of DACs is used, a part of the Semiconductor IC 400 is increased, a design and configuration of a logic circuit for controlling DAC is complicated, and a consumption current is increased, preferably one DAC is used.

In addition, the present invention may use an ADC device having two or more numbers. But if, using many ADCs increases the area of the Semiconductor IC 400, complicates the design and configuration of the Logic circuit that controls the ADC, and increases the consumption current, preferably only one ADC is used. And the ADC is connected to the output terminal of the Operational Amplifier to perform a process of changing the output voltage V1 into a digital code by a time division method.

There are three methods for configuring an Operational Amplifier for using DAC and ADC as a time division method.

Example of the First Method for Configuring an Operational Amplifier Using DAC and ADC This is a method of using one Operational Amplifier for each Sensing Signal Line 200, and an Operational Amplifier is required as many as the number of columns included in one group.

A DAC outputs only one voltage corresponding to one input code, and thus, the DAC is sequentially connected to an Operational Amplifier placed by the number of columns included in one group in a method in which processing is completed and reconnected to the next Operational Amplifier.

The ADC moves in the same position as the DAC and is sequentially connected to a plurality of Operational Amplifiers in the same manner as the DAC.

When V1 is sequentially output from the plurality of Operational Amplifiers, the voltage V1 is converted to a digital value by processing of the ADC and temporarily stored in a memory, and necessary information is extracted by the CPU 460.

When the processing of the first column group is completed, the processing proceeds in the second column group. If there is a third or fourth group, processing for all groups is sequentially performed according to a predefined order.

In the case of the first method embodiment, since an Operational Amplifier is connected to each Sensing Signal Line 202, there is an advantage that the signal formed in the Sensing Signal Line is stable. Alternatively, since it has to be connected to the output, wiring becomes complicated, current consumption increases due to an increase in the number of Operational Amplifiers, and the area of the Semiconductor IC 400 increases.

Example of the Second Method for Configuring an Operational Amplifier Using DAC and ADC An embodiment of the second method is a method in which one Operational Amplifier is used for each column group and all Sensing Signal Lines in the column group are connected to one Operational Amplifier. Since the number of Operational Amplifiers is only required as many as the number of groups, there are advantages in terms of current consumption and layout as the number of Operational Amplifiers decreases compared to the embodiment of the first method.

The AMP Input Signal Line Selection Unit 430-2 of FIG. 16C is a switch that selects one of the Sensing Signal Lines inputs to the Operational Amplifier. Since it is assumed that one group has 10 columns, 10 Sensing Signal Lines are input to an Operational Amplifier, and only one of the switches of the AMP Input Signal Line Selection Unit 430-2 is selectively turned on by CPU 460 or Logic of the Semiconductor IC 400.

The remaining switches except for the turned-on switch are turned off, and when the replicated DAC of the CDA 100 connected to the turned-on switch is recalled from the memory and connected to the Operational Amplifier, the difference between the two voltages is output and processing proceeds by ADC operating as a pair with DAC.

Example of the Third Method for Configuring an Operational Amplifier Using DAC and ADC The third embodiment is a method in which Sensing Signal Lines for each column output from each group use one Operational Amplifier in common and is a method in which only one Operational Amplifier is used.

The Loader 450 is placed for each column group, and the signal line output from each Loader placed in a plurality of groups is connected to the "same output components" to operate as one Loader 450, and it is possible to process all CDAs with one Operational Amplifier if only the Loader 450 of the column group that needs processing is activated.

When the Loader 450 is placed in the display part, and the AMP Input Signal Line Selection Unit 430-2 and the Operational Amplifier 430-1 are located ed in the Semiconductor IC 400, the output of the Loader is input to the AMP Input Signal Line Selection Unit 430-2 through the connecting material 300 connected to the display part 10.

Since the Sensing Signal Line 202 of a plurality of column quantities constituting the column group is input and output to the Loader 450, the number of Sensing Signal Lines transmitted to the AMP Input Signal Line Selection Unit 430-2 through the connecting material 300 is at least the same as the number of columns included in the column group.

In general, the number of columns in a column group is about 10ea, and the signal line input from the Semiconductor IC 400 to the Decoder for control of the Sensing/Driving Switch Group 437 of the Decoder 436 and signal line input to Decoder for driving voltage, etc. is about 10ea. Accordingly, the number of pads of the attached part 301 of the connecting material 300 that is connected to the Semiconductor IC 400 and the display part 10 through the connecting material 300 is about 20ea. Accordingly, the width of the connecting material 300 is narrowed, and the module type is simplified when the device of this invention is placed in the display part 10, and thus the attached part 301 may be simply located at the left or right corner of the display part where there is no output signal line of Source IC.

Figure 18A:
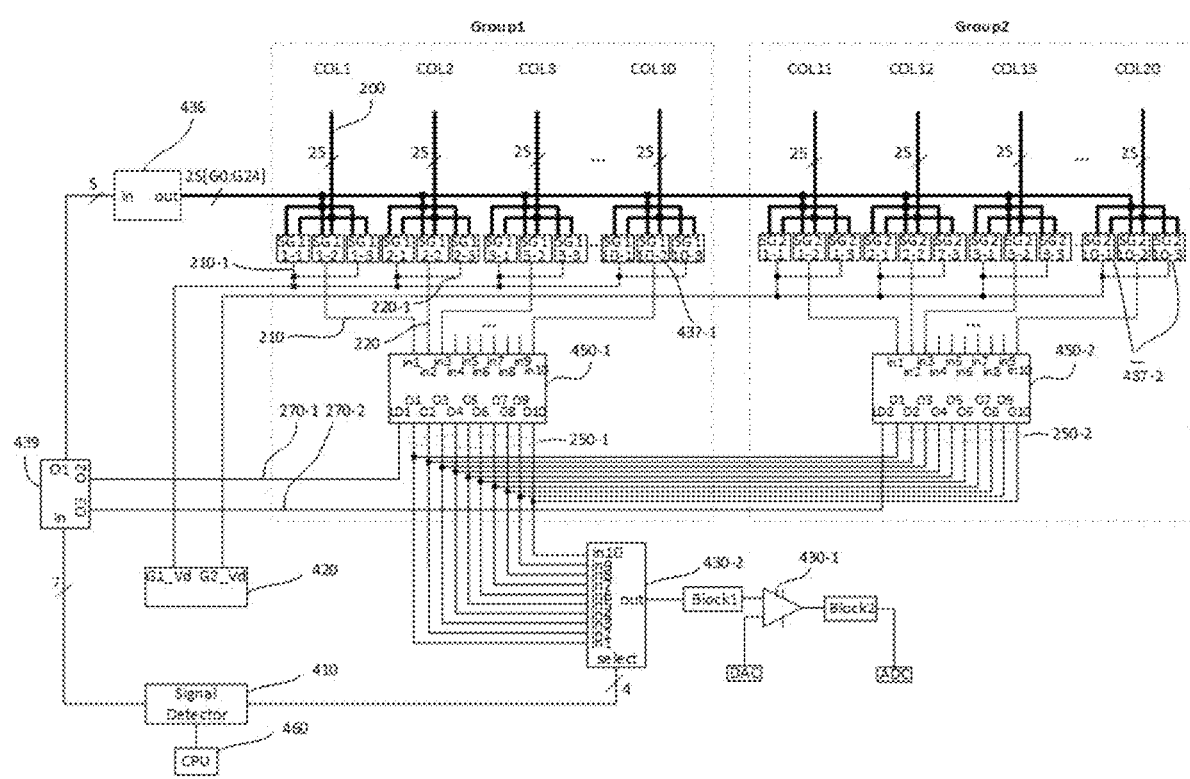
FIG. 18A is an embodiment of the present invention to reduce the number of Sensing Signal Lines output from a plurality of Loaders.
Figure 18B:
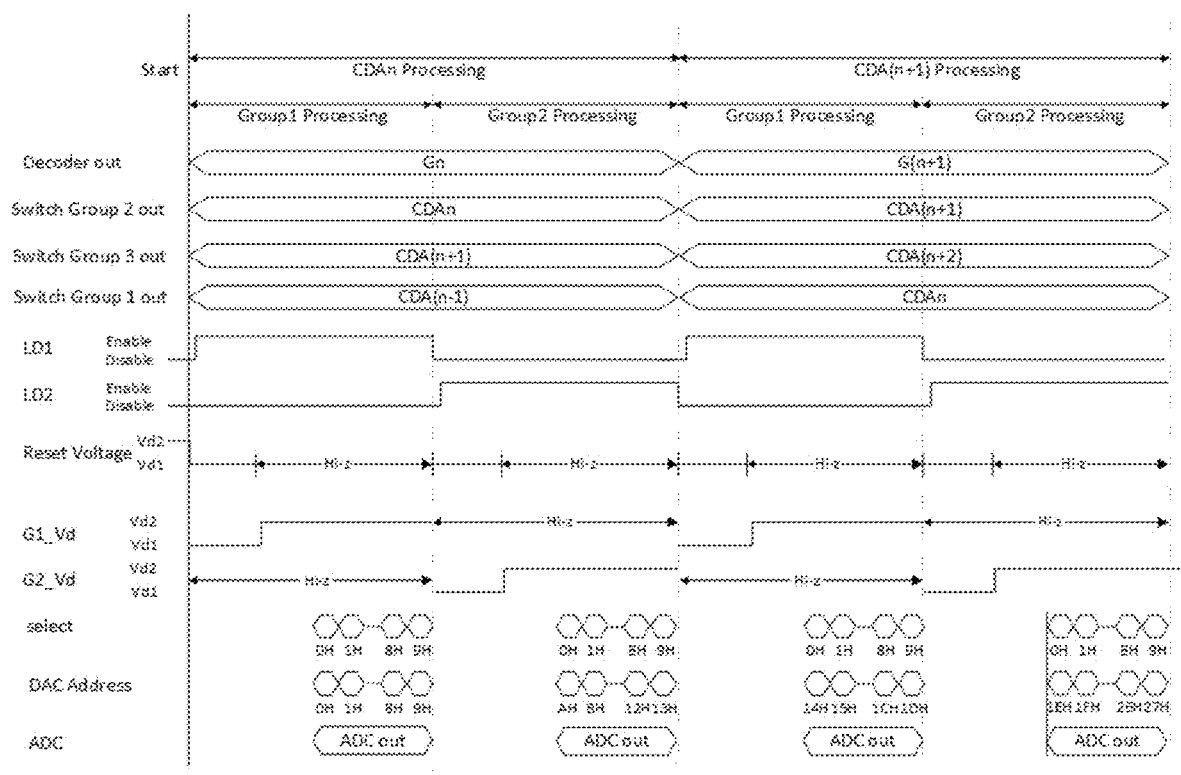
FIG. 18B is an embodiment of the present invention apparatus for signal flow.

FIG. 18A is an embodiment of the present invention to reduce the number of Sensing Signal Lines output from a plurality of Loaders 450-1, 450-2 in order to use one Operational Amplifier, and FIG. 18B is an embodiment of the present invention apparatus for signal flow between the devices used in FIG. 18A. Hereinafter, a signal flow between various components and an embodiment using only one Operational Amplifier 430-1 will be described with reference to FIG. 18A and FIG. 18B.

Figure 20:
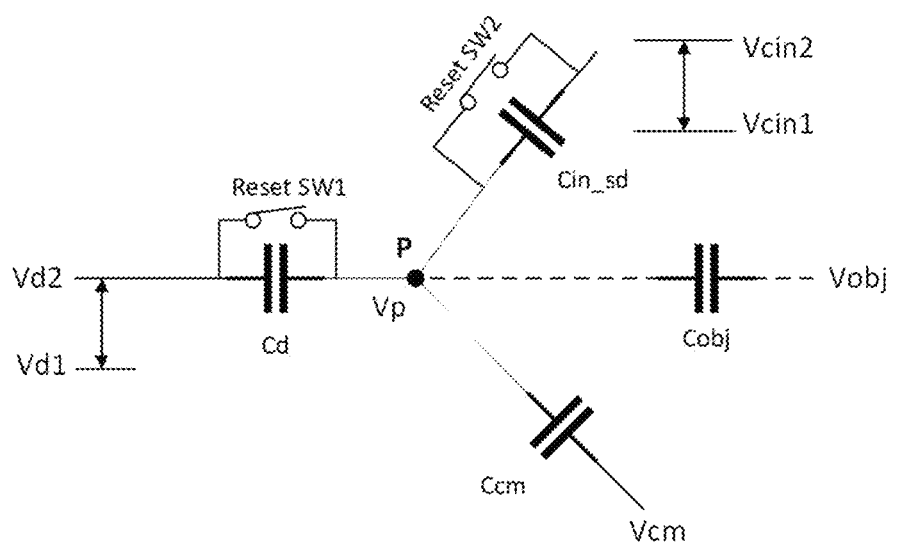
FIG. 20 is an embodiment of the present invention for applying a reset voltage to a Sensing Signal Line.

In the embodiment of FIG. 18A, 20 columns were divided into two groups, such as a left group and a right group, and the group including 10 columns from COL1 to COL10 on the left was called Group 1, and the group including 10 columns from COL11 to COL20 on the right was called Group 2.

In an embodiment of FIG. 18A, 25 CDAs 100 such as No. 1 CDA located in long-distance to No. 25 CDA located in a short-distance, and 25 CDAs signal lines 200 connected to each CDA are placed in one column. In the present invention, CDA is sequentially selected from among 25 CDAs included in one column in a predetermined order, and Object Capacitor Cobj is detected in the selected CDA 100. The position (or, number) of the detection CDA 100 selected in each column may be different from column to column, but desirably, the position of the detection CDA 100 selected in each column is the same, and thus all CDA 100 in the same row in one group operates as a detection CDAs.

In the present invention, a Sensing Signal Line 202 connected to one detection CDA and a plurality of Driving Signal Lines 201 adjacent to the Sensing Signal Line are selected, the "Detection CDA" detects an object, and a driving voltage is applied to the Driving Signal Line.

When the nth Sensing Signal Line is selected, one pair or a plurality of Driving Signal Line pairs can be selected. When the nth Sensing Signal Line and a pair of Driving Signal Lines are selected, a pair of [n−1, n+1] is selected for the Driving Signal Line.

If the nth CDA is selected as the detection CDA in one column, the Driving Signal Line of the pair can be selected by the number of m. That is, "CDA (n, ±m), 1, 2, . . . , m. m is a positive integer", CDAn is the row number of the Sensing Signal Line, the row number of the Driving Signal Line is (CDA(n±m), m=1 to m), and m is the number of pairs of Driving Signal Lines.

For example, when the Sensing Signal Line and Driving Signal Line are displayed as 10, ±3 in one column, the CDA in the 10th row is the detection CDA, three pairs of Sensing Signal Lines are selected, and the row numbers of the three pairs of Sensing Signal Lines are 9, 11/8, 12/7, 13.

In the apparatus of the present invention having a plurality of groups, when processing of all CDAs included in the nth row is completed in the first group, all CDAs included in the same nth row are selected and processing is performed in the remaining group. In another embodiment, the CDA in a row at another location may be processed by a preset method. In an embodiment, in the apparatus of the present invention having four groups, the first group may be processed in the 10th row, the second group may be processed in the first row, the third group may be processed in the 5th row, and the fourth group may be processed in the first row.

It is assumed that the embodiment of FIG. 18A is divided into two groups, and after the processing of the left group is performed, the processing of the right group is performed, and the processing is performed in the CDA 100 located in the same row of all columns.

Referring to FIG. 18B, when the processing of the nth row is completed, the processing of the n+1th row proceeds, the processing of the n+2th row is performed, and the processing proceeds until the last row or a preset row.

Although processing may be carried out in a plurality of groups simultaneously, there may be problems such as inrush current during driving and discharge from the Sensing Signal Line or adding ADC or DAC, and desirably, processing should be carried out in only the other group after processing is completed in one group.

In the embodiment of FIGS. 18A and 18B, it is assumed that processing proceeds in Group 2 after processing proceeds in Group 1.

There may be several methods for selecting the detection CDA 102 even in one column. For example, only odd-numbered CDAs may be processed, and only even-numbered CDAs may be processed. Alternatively, the row number of the CDA may be determined by an equation such as 2C+1 (C=0, 1, 2 . . . a positive integer), such as skipping two CDAs and processing the third CDA based on the CDA of the selected row. Also, it may be set as 3C+1 (C=0, 1, 2 . . . a positive integer) in the same way. Partially scanning the CDA rather than scanning the entire CDA is for determining only the presence or absence of an object, and since the scan time is shortened, current consumption is reduced. If an object is detected, the entire CDA is scanned to obtain precise positional coordinates of the object.

In SG1 and SG2 of FIG. 18A, numbers are group numbers, and SG1,1-1 means switch group 1 of column 1 of group 1. In FIG. 18A, three switch groups are placed for each column. This is for "(n, ±m), m=1", and since a pair of Sensing Signal Lines is selected around the nth Sensing Signal Line, three switch groups are required. In case of "(n, +m), m=1, 2", 5 switch groups will be needed for each column.

One of the pluralities of switch groups is the Detection Switch Group 437-1 for selecting a Sensing Signal Line, and the rest is the Driving Switch Group 437-2. In the embodiment of FIG. 18A, the central switch group was assumed to be the Detection Switch Group 437-1, and the left and right switch groups were assumed to be the Driving Switch Group 437-2.

All CDAs included in one column are input to all switch groups of the corresponding column, and one CDA is output for each switch group. In the embodiment of FIG. 18A, 25 CDAs 100 and 25 CDA signal lines 200 included in one column are input to all three switch groups.

One CDA signal line 200 is connected to each input terminal of the inner switch 438, and one inner switch 438 is turned on for each switch group to output one CDA signal line for each switch group 437.

When the CDA of this invention is placed in the display part 10 and the Sensing/Driving Switch Group 437 is also placed in the display part, the inner switch 438 may preferably use the same device as the switching device outputting pixel data of the display part 10.

The switching device outputting pixel data of the display part 10 is turned on or off by on/off control signal output from the "Gate Drive IC" of the display part 10 and serves to transmit pixel data output from the "Source Drive IC" of the display part 10, and inner switch 438 functions the same. Therefore, when the inner switch 438 included in the switch group 437 of this invention is manufactured using the same mask in the process of manufacturing the switching device for pixels of the display part 10, the inner switch 438 may be manufactured without a dedicated process.

In addition, when the inner switch 438 is the same as the switching device for pixels of the display part 10, the turn-on and turn-off voltages used in the inner switch 438 may use turn-on and turn-off voltages output from the Gate Drive IC of the display part. Therefore, when the Decoder 436 output of the present invention is set to be the same as the output voltage of the Gate Drive IC, it is possible to stably perform the turn-on or turn-off operation of the inner switch 438.

When the switch group 437 and the Decoder 436 are located in the display part, the level of the signal output from the Decoder is preferably the same as the high and low voltages output from the Gate Drive IC of the display part 10. In addition, when the Gate Drive IC is embedded in the display part 10, the switching device used in the Decoder 436 may be the same switching device used in the Gate Drive IC and may be manufactured by the same process as the switching device of the Gate Drive IC. In addition, in order for the Decoder 436 to output the same voltage as the high and low voltages output from the Gate Drive IC of the display part 10, the Decoder 436 must be supplied with the same voltage as the high and low voltages used by the Gate Drive IC of the display part 10. According to an embodiment, when the device responsible for outputting the Decoder is CMOS, a high voltage used in the Gate Drive IC is connected to the "SOURCE" terminal of the CMOS, and a low voltage used in the Gate Drive IC is applied to the "DRAIN" terminal of the CMOS.

In general, the one Gate Drive IC used in the display part 10 outputs only turn-on voltage out of hundreds of outputs, and the remaining output is a turn-off voltage. In the Decoder 436 of the present invention, only one of dozens of outputs is a turn-on voltage for turning on the inner switch 438, and the rest is a turn-off voltage of the inner switch 438. In the embodiment of FIG. 18A, since 25 CDAs 100 are located in one column, at least 25 Decoder outputs are required, and "Output Signal Line Address" to which the turn-on voltage is output among 25 Decoder 436 outputs G0 to G24 is indicated as "Gn" in the Decoder out of FIG. 18B. Since Decoder out is "Gn", it means that the voltage output from the nth line among the 25 Decoder outputs is the turn-on voltage.

The turn-on voltage level of the switching device 438 configured with NMOS is high voltage, but the turn-on voltage of the switching device 438 configured with PMOS is low voltage level. Therefore, one turn-on voltage output from Decoder 436 may be a high voltage or a low voltage.

An input control signal for controlling the output of the Decoder 436 is output from the CPU 460 or the Logic unit of the Semiconductor IC 400 and input to the Decoder 436. If the Decoder 436 is located on the display part 10, the high and low voltage levels output from the Semiconductor IC 400 may not control the Decoder 436, so the voltage level from the Semiconductor IC 400 is changed from the level shifter 439 placed inside the display part 10 to the High and Low Levels of the switching device used in the display part 10.

The high voltage output from the Semiconductor IC 400 is changed to the high voltage level for the switching device used in the display part 10 by the Level Shifter 439, and the low voltage output from the Semiconductor IC 400 is changed to the low-level voltage for the switching device used in the display part 10 by the Level Shifter 439. For example, 0V, which is a low voltage output from the Semiconductor IC 400 is changed to −6V, which is the low level voltage of the switching device used in the display part 10 in the level shifter 439, and 3V, which is a high voltage output from the Semiconductor IC 400 is changed to 10V, which is a high level voltage of a switching device used in the display part 10 in the level shifter 439.

Since the switch group 437 of FIG. 18A requires 25 Decoder outputs, 5 Decoder input control signals are required, and the number n of input control signals is determined such that the number of signals output from the Decoder does not exceed "$2^n$".

Meanwhile, the input control signal provided to the Decoder 436 may be replaced with two signals. In general, a shift register type circuit is used in the Gate Drive IC of the display part 10, and the shift register is an element that outputs only one signal among a plurality of output signals generated based on two input signals as high.

Shift Register consists of two signal lines: Start Clock and Clock. When one High signal is given to the first "Start Clock", the first output signal G0 of the shift register is output as High when the "Clock", which continuously repeats High and Low, changes from Low to High. Subsequently, even if "Start Clock" remains in the Low state, the Shift Register output is sequentially output to High whenever "Clock" becomes High.

As a result of this, among the outputs from G0 to Gn of the shift register, G0 becomes High first, then G1 output becomes Hi, and thereafter, High is sequentially output from G2 to the last signal.

As an embodiment of the shift register, the shift register is used as a Gate Drive element of the display part 10. When the number of gate lines of the display part 10 is 256, when the "T-Con" (Time Controller) outside the display part 10 sets the "Start Clock" to a high state and applies 256 "Clocks", only one of the 256 Shift Register outputs the High signal sequentially from G0 to G255.

If the switch turn-on signal used in the display part is a low signal, it is possible to reverse the state by adding Inverter to all signals output from the Gate IC. When the Decoder 436 is located in the display part, the output of the Decoder 436 may also be applied in the same manner as in the embodiment of the Shift Register of the Gate Drive IC of the display part 10. Therefore, Decoder 426 is designed in the structure of the Shift Register and has two input control signals, Start Clock and Clock, and output signal lines as many as the number of CDAs included in the column.

In addition, by Logic of Start Clock and Clock, one of the output signal lines is sequentially output with a high voltage. The Gate Drive IC is placed on the left or right side of the display part 10 and may be configured as a switching device used for an LCD or an OLED.

In this case, the Decoder circuit may have the same configuration as the shift register circuit applied to the Gate Drive IC of the display part, and the Decoder circuit may be manufactured in the same process using the same mask when the Gate Drive IC of the display part is manufactured.

In the embodiment of FIG. 18A, when the output of the Detection Switch Group 437-1 is CDAn, that is, when the nth CDA is selected from the Detection Switch Group 437-1, similarly to the embodiment of FIG. 7D, the Driving Signal Line selected from the Driving Switch Group 3 is a Driving Signal Line corresponding to the CDA(n+1), and the Driving Signal Line selected from the Driving Switch Group 1 is assumed to be a Driving Signal Line corresponding to the CDA(n−1).

In addition, in the embodiments of FIG. 18A and FIG. 18B, it is assumed that the Row processed in Group 1 proceeds the same in Group 2.

The Sensing Signal Line 210 of column 1 selected from the Detection Switch Group 437-1 by the on/off control signal of the Decoder 436 is input to the First Group Loader 450-1, and all Column Sensing Signal Lines selected one by one from column 2 COL2 to column 10 COL10 are also input to the first group Loader 450-1. Similarly, in Group 2, the Sensing Signal Lines selected one by one from the Detection Switch Group 437-1 in column 11 COL11 to column 20 COL20 are input to the Second Group Loader 450-2.

The Loader 450 is a device of the present invention having a characteristic in which an input signal is output as it is and has a characteristic in which all input signals are output simultaneously when a control signal called "LD" is in an enable state. The Loader 450 is composed of a combination of switches and has a characteristic of outputting the input signal without loss.

Since these characteristics are the same as TFT of LCD or switching device of OLED, when Loader is placed in the display part, it is preferable to use the same switch used in the display part, and when the same mask is used in the process of manufacturing the switch of the display part, the same characteristics as the display part may be ensured and manufacturing costs may be reduced.

In addition, when the Loader 450 is placed in the display part, the "LD" signal, which is a control signal of the Loader 450 given by the Semiconductor IC 400, is also changed in Level Shifter 439 to suit "on/off characteristics" to be connected to the "LD" terminal of the Loader 450.

When the switch used for Loader 450 and the switch used for Decoder are the same switch, the High and Low levels of "LD" and Decoder 436 input signals passing through the Level Shift are the same.

The Loader 450 of FIG. 18A includes 10 output elements and ranges from out1 to out10. In an embodiment of the present invention, the same output components originating from the Loader are connected to each other.

Referring to the embodiment of FIG. 18A, out1 of the First Group Loader 450-1 is connected to out1 of the Second Group Goader 450-2, and out2 of the First Group Loader 450-1 is connected to out2 of the Second Group Loader 450-2 in this way, the Output Component of the first group Loader and the Output Component of the second group Loader are connected to each other.

When the "Output Components" of the Loader 450 are connected to each other and the control signal "LD" of the Loader 450 is selectively enabled by only one of the plurality of Loaders, the signal is output only from the Enable Loader 450 and, the switches of the other Loaders 450 are all turned off, interference between the Sensing Signal Lines does not occur.

Referring to the embodiments of FIG. 18A and FIG. 18B, CDA 100 of the same row is selected from Group 1 and Group 2 by output of the same Decoder 436, and input to first group Loader 450-1 and second group Loader 450-2. Initially, since only "LD1" of the first group Loader 450-1 is in the enabled state, all input signals of the first group Loader 450-1 are output, Input signals of the second group Loader 450-2 cannot be output because "LD2" is in the disabled state. In this case, signals of the "Same Output Component" of the second group Loader 450-2 do not affect the first group Loader 450-1.

When processing of group 1 is completed and processing is performed in group 2, only the signal of the second group Loader 450-2 should be output, so that "LD1" becomes the disabled state and "LD2" becomes the enabled state. Output signals of the first group Loader 450-1 and the second group Loader 450-2 should not interfere with each other, and even when more groups Loader 450 exist, only "LD", which is a control signal of the group Loader in which processing proceeds, should be enabled. And the "LD" that controls the output of the Loader of the group whose processing is not in progress should not be enabled at the same time.

Multiple Driving Signal Lines selected at the same time as the Sensing Signal Line in one column are interconnected to apply the same driving voltage, and in order to simplify the driving unit 420, it is connected to all Driving Signal Lines of other columns in the same group and connected to the driving unit 420. Column 1 Driving Signal Line 210-1 of FIG. 18A shows that two Driving Signal Lines output from Driving Switch Group 1 and Driving Switch Group 3 are interconnected. In addition, all of the Driving Signal Lines of Group 1 were connected to the Driving Unit 420 as one Driving Signal Line with the name of "G1_Vd", and all Driving Signal Lines of Group 2 were connected to the Driving Unit 420 as one Driving Signal Line with the name of "G2_Vd".

For the processing of group 1, it is desirable that the driving voltage is applied only to group 1, and the driving voltage is not applied to group 2, which is a group in which the processing is not carried out. In addition, the driving voltage of the group in which processing is not performed may be in a High Impedance (Hi-z) state to reduce the current consumption, and only First Stage Driving Voltage or Second Stage Driving Voltage may be applied. Accordingly, the driving unit has three states: the High voltage Vd2, the Low voltage Vd1, and Hi-z.

In order to distinguish water, coin, etc. from fingers, a driving voltage may also be applied to the Driving Signal Line of the group in which processing is not performed. In this case, the group 1 driving voltage G1_Vd and the group 2 driving voltage G2_Vd of FIG. 18B have the same level of driving voltage, and G1_Vd and G2_Vd may be interconnected in the driving unit 420.

Referring to FIG. 18B, a First Stage Driving Voltage Vd1 is applied through G1_Vd which applies a driving voltage of the group 1 together with a Reset voltage to be described later at a processing time point of the group 1. After a time elapses for applying a predetermined Reset Voltage, the Reset Voltage is cut off, and then Vd2, which is a Second Stage Driving Voltage, is applied. At the processing time of the group 1, the driving voltage of the group 2 maintains the Hi-z state. In addition, a driving voltage having the same level as the driving voltage of the group 1 may be applied, Vd1 may be applied, or Vd2 may be applied.

When the processing of group 1 is completed, as in group 1, First Stage Driving Voltage Vd1 and Second Stage Driving Voltage Vd2 are applied through G2_Vd of Driving Unit 420 that applies a driving voltage to group 2.

In the embodiment of FIG. 18B, when a predetermined time elapses after the high voltage, which is the Second Stage Driving Voltage, is applied, the AMP Input Signal Line Selection Unit 430-2 outputs the input signals one by one in a predetermined order. "Select", which controls the AMP Input Signal Line Selection Unit 430-2, is a signal to select and output one of the 10 input signals, and selects one of the 10 input signals according to the logic of the 4 signal lines.

In the embodiment of FIG. 18B, the HEX Code is input, and an output signal is determined according to the input HEX code. For example, if the HEX code of the input Select signal is 0H, a signal of "in1", which is the first input signal line, is output, and if the HEX code of the select signal is 9H, "in10" is selected and a signal of "in10" is output.

Referring to FIG. 18B, "Select" controlling the AMP Input Signal Line Selection Unit 430-2 is sequentially given from 0H to 9H, and the AMP Input Signal Line Selection Unit sequentially outputs 10 signals from in1 to in10 in response thereto.

The signal output from the AMP Input Signal Line Selection Unit 430-2 passes through "Block1". Block1 may be a low-pass filter (LPF), an analog buffer, an Amplifier, or a switch, and may be composed of various circuit materials by a combination of OPAMP, resistance, capacitance, CMOS, and the like. Alternatively, the output of the AMP Input Signal Line Selection Unit may be directly connected to the input of the Operational Amplifier without going through Block1.

In the embodiment of FIG. 18B, the given code, such as 0H or 1H of the DAC, is the address of the duplicated DAC stored in the memory. When the DAC code stored in the address is applied to the DAC connected to the Operational Amplifier, the DAC is converted to an analog voltage, and the voltage difference from the Sensing Signal Line is amplified and output by the Operational Amplifier.

The signal output from the Operational Amplifier passes through Block2, and Block2 is a circuit composed of a filter or amplifier or buffer, or an element composed of OPAMP or CMOS, similar to Block1. The signal passing through Block2 is processed by the ADC and stored in the memory.

When processing for 10 Sensing Signal Lines is completed by the ADC, the first group Loader 450-1 is disabled by the LD1, and an enable signal is given to the LD2 of the second group Loader 450-1 for processing of the group 2. Thereafter, the signal from column 11 to column 20 of group 2 is detected through the same process as group 1, but the address of the DAC stored in the memory is different because the location of the CDA is different. In the embodiment of FIG. 18B, for convenience, the address of the DAC corresponding to the nth CDA in the 11th column was determined to be AH 11th, and the last DAC address was determined to be 13H, which is the 20th.

For each column, in order to proceed with the processing of CDA(n+1), which is the second CDA, the G(n+1) output of the Decoder 436 is the output voltage in the turn-on state, so that the Detection Switch Group 437-1, CDA(n+1) is selected, and CDA(n) and CDA(n+2) are selected in the Driving Switch Group.

After that, a driving voltage is applied to the Driving Signal Line and the "LD" signal of the Loader 450 is controlled for each group to be processed, the output signal is sequentially selected from the AMP Input Signal Line Selection Unit 430-2, and the duplicated DAC is also sequentially calling from the memory, detecting the difference between the "First Signal" and the "Second Signal" using an Operational Amplifier, converting it into a digital code through the ADC, and storing it in the memory is continuously repeated.

Meanwhile, referring again to an embodiment of FIG. 18A, the output of the Decoders 436 supplied to each column is laid out in the horizontal direction, and the connection lines for each "Output Component" of "The First Group Loader 450-1" and "The Second Group Loader 450-2" are laid out in the horizontal direction. In addition, signal lines output from the Loader 450 and connected to the AMP Input Signal Line Selection Unit 430-2 are laid out in the longitudinal direction.

When the components of this invention's device, such as Decoder 436, Switch Group 437, Loader 450, Level Shift 439, AMP Input Line Selection Unit 430-2, etc., are embedded and placed in the display part 10, since interference with the "signal line for pixel data of display part 10 and gate signal line" should not happen, it should be wired carefully.

The signal line for transferring the pixel data of the display part 10 is mainly laid out using source metal in the longitudinal direction, and the gate signal line is mostly laid out in the horizontal direction, and gate metal of a layer different from the source metal is used to avoid interference with pixel data signal lines using source metal.

In the present invention, the signal line laid out in the horizontal direction uses the metal used for the Gate Signal Line, but preferably the gate metal is used, and the signal line laid out in the longitudinal direction is the same as the vertical layout of the pixel data transmission signal line, but preferably Source Metal is used. At the intersection of the longitudinal wiring and the horizontal wiring, use Short Point to connect the source metal and the gate metal.

According to this principle, the output of Decoder 436 delivered to all switch groups uses Gate metal to avoid interference with the pixel signal line, and the connection signal line for each Output Component of Loader also uses Gate Metal in the horizontal direction to avoid interference with the pixel signal line. In addition, it is desirable that multiple signal lines output from the Loader and input to the AMP Input Signal Line Selection Unit 430-2 use longitudinal metal or Source Metal to avoid interference with Gate Metal of the horizontal pixel switching device.

On the other hand, when the AMP Input Signal Line Selection Unit 430-2 is located in the display part 10, since there is only single Sensing Signal Line input to the Operational Amplifier 430-1 of the Semiconductor IC 400, the number of signal line input pin 401 is greatly reduced, the size of the Semiconductor IC 400 is further reduced, and at least does not belong to the pad limit in which the size of the Semiconductor IC is determined by the number of pads. In addition, the above-described problem caused by the deviation of the shielding capacitor Cin_sd according to the difference in length for each Sensing Signal Line is solved, and the performance of the device is further improved, such as wiring is simplified.

As described above, in the present device, all elements in the path from the CDA 100 to the AMP Input Signal Line Selection Unit 430-2 are placed in the display part 10 to improve the performance of the device, and these elements are the switch group 437 and Loader 450 and the AMP Input Signal Line Selection Unit 430-2 and the Level Shifter 439 and Decoder 436 connected to the CDA signal line placed in display part 10.

These elements are placed on one side of the display part 10, and it is possible to be positioned at a corner of the display part where there is no output line of the source drive IC of the display part, or between the source signal lines so as not to overlap the source signal line. Also, it can be placed in an area where there is no gate signal line by avoiding interference with the gate signal line output from the gate IC. In addition, it may be located in the BM (Black Matrix) area where the source data line of the display part, the gate driving line, etc. are located, or it may be located in the invisible area of the display part where the image is not displayed.

Some display parts 10 folds the screen once in an "In Folding" manner that does not show the screen or uses "Out Folding" that folds the screen once so that the screen comes out. Some displays are a mixture of In-Folding and Out-Folding methods, which fold the screen twice, making it look like three displays stacked, and when you look at the entire screen, they are commercialized as displays that spread out the folded screen and see one.

If both in-folding and out-folding methods are used by folding the screen twice in Z-shape, the display part outside of the folding screen operates as a sub display to display the time or display the other party's information when a call is made.

When making an object detection device for a display part that is folded multiple times with the device of the present invention, when the display part 10 is in a folded state and a part of the folded display part 10 is used as a sub display, only the Loader 450 of the group in which the CDA 100 placed in the display part used as the sub display is located is activated, and a driving voltage is applied only to the CDA 100 used in the display part 10 used as a sub display to detect an object signal, since only a small portion of the CDA 100 and the device are operated, there is an effect of reducing the current consumption. The signal that the screen has been folded is received from an external host CPU, and the sub display detects the object only when the screen is folded.

Figure 16D:
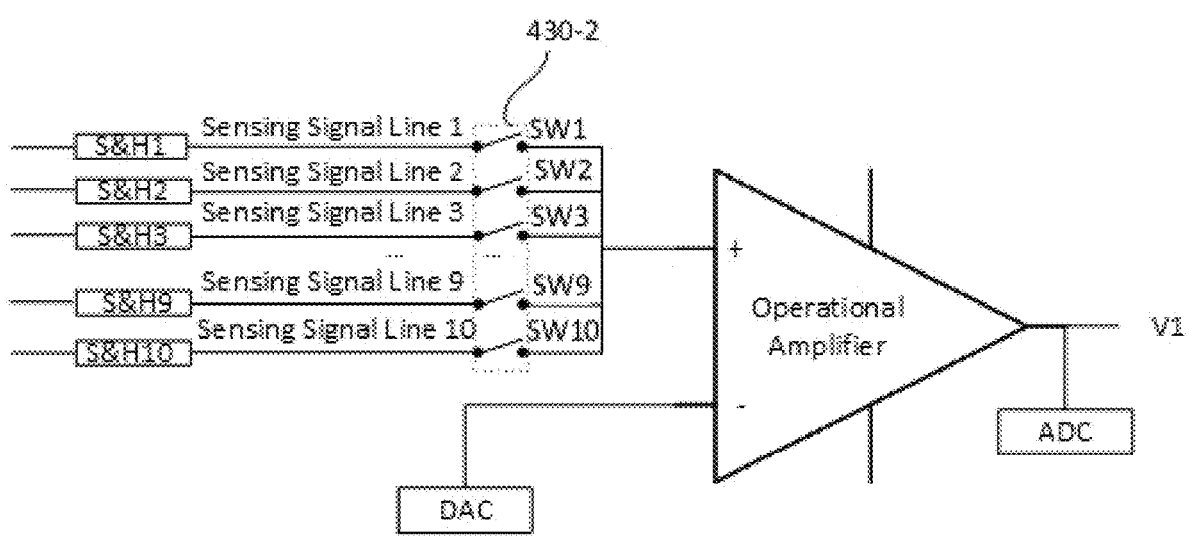
FIG. 16D is an embodiment of the present invention for a method of connecting Sample & Hold to a Sensing Signal Line.

Meanwhile, in the embodiment of FIG. 18A, in the process of connecting the Sensing Signal Lines selected in the AMP Input Signal Line Selection Unit 430-2 to the Operational Amplifier one by one sequentially, a voltage of the Sensing Signal Line 202 not selected in the AMP Input Signal Line Selection Unit 430-2 is gradually discharged, and an error may occur in the detected voltage V1. To solve this problem, all signal lines connected to the AMP Input Signal Line Selection Unit 430-2 connect the analog voltage memory Sample & Hold (hereinafter S&H). FIG. 16D is an embodiment of the present invention for a method of connecting S&H to a Sensing Signal Line and solves the problem of discharge.

S&H serves to preserve stored signals. Therefore, for all Sensing Signal Line 202 input to AMP Input Signal Line Selection Unit 430-2, use S&H as shown in FIG. 16D to store (Sampling) signals formed in Sensing Signal Line 202 to prevent discharge (Hold), since there is no discharge of the Sensing Signal Line waiting for processing in the AMP Input Signal Line Selection Unit 430-2, stable signal detection is possible.

Thereafter, as in the embodiment of FIG. 16C, if you turn on the switches sequentially and detect V1 output from the Operational Amplifier using DAC and ADC, the signal is preserved in S&H, so the Detection Signal Distortion caused by the signal leaking from the line is prevented.

In the case of the third embodiment as described above, since the positions of the DAC and ADC are fixed using only one Operational Amplifier, the wiring of the DAC and ADC is simplified, and only one Operational Amplifier is used, a current consumption is reduced, and an area of the Semiconductor IC 400 is reduced.

The CPU 460 analyzes the digital code transmitted from the ADC to determine 1 whether an object appears, or 2 the position of the object in the display part, that is, the coordinate calculation of the object, or 3 the distance between the object and the CDA 200 is calculated and transmitted to a host outside the device (not shown).

Referring to FIG. 14, which is an embodiment of the present invention relating to the application of driving voltage, the First Stage Driving Voltages Vd1 and Vcin1 in Zones A to D are lower voltage than the Second Stage Driving voltages Vd2 or Vcin2. For this reason, the amplitude of Vd2−Vd1 or Vcin2−Vcin1 in [Equation 4] has a positive value.

Based on [Equation 4], the size of [Equation 5] with the Object Capacitor Cobj term added to the denominator is always smaller than that of [Equation 4]. In order for the output of the Operational Amplifier of FIGS. 16A to 16D using a single power source to be normal, the amplitude of the output value must always be positive. Therefore, the DAC, which is a duplicated value of [Equation 4], should be connected to the positive input terminal of the Operational Amplifier, the Sensing Signal Line 202 having the information of [Equation 5] that is equal to or smaller than the DAC value should be connected to the negative input terminal of the Operational Amplifier.

ZONE S of FIG. 14 is an embodiment in which the First Stage Driving Voltage is High Voltage Vd2, and the Second Stage Driving Voltage is Low Voltage Vd1. In this case, [Equation 6] is transformed into the following [Equation 9].

$$V1 = \frac{(Vd1 - Vd2)*Cd + (Vcin1 - Vcin2)*Cin\_sd}{Cd + Cin\_sd + Ccm} - \frac{(Vd1 - Vd2)*Cd + (Vcin1 - Vcin2)*Cin\_sd}{Cd + Cin\_sd + Ccm + Cobj} \quad \text{[Equation 9]}$$

Vd1−Vd2 in [Equation 9] is a negative value, and Vcin1−Vcin2 is also a negative value. For this reason, the First Sensing Signal and the Second Sensing Signal in [Equation 9] have negative values.

Since a signal with a negative value should not be connected to an Operational Amplifier using a single power source of 0V (zero Volt) as a Ground, a high voltage reset voltage is applied to the Sensing Signal Line 202 in advance so that the potential of the Sensing Signal Line is a reset voltage of the high voltage. After that, when the driving voltage according to [Equation 9] is applied and the reset voltage is selected so that the voltage of the Sensing Signal Line does not become less than 0V even if the voltage drops as much as a negative value, a normal signal is obtained even using an Operational Amplifier of a single power supply. In an embodiment, when the first sensing signal of [Equation 9] is −4V, when the Sensing Signal Line is reset to a reset voltage of Vd2 (for example, 5V), the first sensing signal becomes 1V (5V-4V).

The amplitude of the absolute value of the Second Sensing Signal in [Equation 9] is equal to or smaller than the absolute value of the First Sensing Signal in [Equation 9]. Therefore, when the reset voltage is 5V, the amplitude of the Second Sensing Signal is 1V or greater than 1V.

The results of these calculations indicate that if the First Stage Driving Voltage is High Voltage and the Second Stage Driving Voltage is Low Voltage, the size of the Second Sensing Signal is equal to or bigger than the amplitude of the First Sensing Signal. Therefore, in an Operational Amplifier using a single power source, when the First Stage Driving Voltage is High Voltage and the Second Stage Driving Voltage is Low Voltage, in order to maintain the output of the Operational Amplifier as a positive value, the Sensing Signal Line 202 should be connected to the positive input terminal of the Operational Amplifier, and the duplicated DAC should be connected to the negative input terminal. In consideration of these results, FIG. 16A and FIG. 16B are a connection method of the DAC and the Sensing Signal Line when the First Stage Driving Voltage is Low, and the Second Stage Driving Voltage is High. And FIG. 16C and FIG. 16D are a connection method of the DAC and the Sensing Signal Line when the First Stage Driving Voltage is High, and the Second Stage Driving Voltage is Low.

As described above, in the present invention, the method of connecting the Sensing Signal Line 202 and the DAC to the Operational Amplifier varies according to the amplitude of the First Stage Driving Voltage and the Second Stage Driving Voltage.

When the First Stage Driving Voltage is Low Voltage and the Second Stage Driving Voltage is High Voltage, the Sensing Signal Line 202 is connected to the negative input terminal of the Operational Amplifier, the DAC is connected to the positive input terminal, and the First Stage Driving Voltage is High Voltage. and the Second Stage Driving Voltage is Low Voltage, the Sensing Signal Line 202 is connected to the positive input terminal of the Operational Amplifier and the DAC is connected to the negative input terminal.

So far, with reference to the embodiment related to the application of the driving voltage of FIG. 14, as in the embodiments of ZONE A to ZONE D of FIG. 14, the First Stage Driving Voltage is Low Voltage and the Second Stage Driving Voltage is High Voltage, or as in the embodiment of ZONE S, the case where the First Stage Driving Voltage is High Voltage, and the Second Stage Driving Voltage is Low has been described. If a method in which the amplitudes of the First Stage Driving voltage and the Second Stage Driving voltage are always constant is defined as "one direction driving", the object detection method by one direction driving requires a lot of time.

Referring back to ZONE A to ZONE D of FIG. 14, when First Stage Driving Voltage is applied and a reset voltage (as an embodiment, 0V) is applied to point P (or Sensing Signal Line) of FIGS. 12A and 12B, due to the line resistance of the Sensing Signal Line 202 and capacitor connected in parallel to the Sensing Signal Line 202, it takes a lot of time for the reset voltage to reach the target value. In the case of an RC circuit, after an arbitrary signal is applied to the resistor R and about three times of the time constant R*C elapses, the voltage detected from the capacitor is 95% of the input voltage, and in general, it is desirable to use the capacitor voltage after waiting for about three times of the time constant.

If the size of the line resistance of a certain Sensing Signal Line is 400 Kohm and the sum of the amplitudes of the capacitors connected in parallel to the Sensing Signal Line is 40 pF, the time constant R*C is 16 us, and three times the time constant is 48 us. This means that after applying the reset voltage to the Sensing Signal Line, it is necessary to wait 48 us to reach the target value (reset voltage). In addition, it means that the Second Stage Driving Voltage is applied to the capacitor of the Sensing Signal Line, which has a line resistance of 400 Kohm and a capacitance of 40 pF, and almost the same 48 us time must be waited to extract the Second Sensing Signal.

As in the above embodiment, when about 96 us is consumed to detect a signal after the reset voltage is applied and the driving voltage is applied in single Sensing Signal Line, when the number of groups is large or the number of CDAs included in one column is large, A problem arises that a large amount of current is consumed due to a long processing time. Therefore, in order to reduce current consumption, it is necessary to reduce the time required for signal detection, and one embodiment of a method for reducing the time required for signal detection is to perform "Bi-Direction driving".

All of the driving methods of ZONE A to ZONE S in FIG. 14 are a one direction driving method, and the Bi-Direction driving method is a mixture of the one direction driving method of ZONE A to ZONE D in FIG. 14 and the one direction driving method of ZONE S.

Bi direction driving detects the signal from the Operational Amplifier using ADC after 96 us as in the case of one direction driving of Zone A to Zone D. After that, the state of the point P, where the current Second Stage Driving voltage is applied and maintains the high state, is considered as the First Stage Driving voltage in the high state has already been applied like in ZONE S, and the reset voltage is also applied with a high voltage.

Bi-direction driving reuses the state by the Second Stage Driving Voltage as the state in which the First Stage Driving Voltage has already been applied and uses it as a condition for applying the reset voltage of the High or Low state equal to the First Stage Driving Voltage, the time required for charging the reset voltage is reduced, thereby reducing the overall processing time.

As in the above embodiment, in the Bi direction driving, the amplitudes of the First Stage Driving Voltage and the Second Stage Driving Voltage alternate between the Low Voltage and the High Voltage in turn whenever a driving voltage is applied. Also, the reset voltage is applied according to the potential of the First Stage Driving voltage. For example, if the First Stage Driving Voltage is Low Voltage, the reset voltage is also Low Voltage, and if the First Stage Driving Voltage is High Voltage, the reset voltage is also High Voltage. At this time, Low Voltage and High Voltage mean high and low in two voltages of First Stage Driving Voltage and Second Stage Driving Voltage and mean high and low among the two reset voltages.

As described above, in this invention, in the Bi direction driving, the amplitude of the First Stage Driving Voltage applied to the capacitor connected to the Sensing Signal Line alternates the Low Voltage and the High Voltage sequentially whenever the driving voltage is applied.

In addition, when the First Stage Driving Voltage is applied, a reset voltage is applied to the Sensing Signal Line 202. At this time, the reset voltage is Low Voltage when the First Stage Driving Voltage is Low Voltage, and when the First Stage Driving Voltage is High Voltage, the reset voltage is also high voltage.

In Bi direction driving, if the Second Stage Driving Voltage is High Voltage, the First Sensing Signal and Second Sensing Signal are detected in the High Voltage Region, and if the Second Stage Driving Voltage is Low Voltage, the sensing signal is detected in the Low Voltage Region. Therefore, in the case of Bi-direction operation, the voltage range of the DAC that replicates the First Sensing Signal must also be managed by dividing it into a high voltage area and a low voltage area.

In this case, a method of outputting a low voltage DAC voltage and a high voltage DAC voltage using one DAC device may be used, and a low voltage DAC region and a high voltage DAC region may be respectively in charge using two DAC devices.

The following embodiment is a case of outputting a low voltage region DAC voltage and a high voltage region DAC voltage using one DAC. In order to output voltages of two regions with one DAC, there may be a method in which one DAC covers the entire low voltage and high voltage regions, but this embodiment has a problem in that the resolution of the DAC is significantly lowered. For example, when the range of 0-5V is covered with a 10-bit DAC, the resolution of the DAC is 5 mV/bit, which is significantly lower than the resolution described above.

Referring to the virtual data of FIG. 13A, the signal detection range is located in the high voltage range of about 4.615V to 4.886V by the 0V reset voltage and the 5V driving voltage during Bi-Direction Driving, and, when the First Stage Driving voltage Vd1=5V and the Second Stage Driving voltage Vd2=0V, if the reset voltage is 5V, it can be calculated that the signal detection range is in the range of 0.114 to 0.385V.

According to the result of the above calculation, when the sensing signal of the Operational Amplifier is formed in the high voltage region or when the sensing signal is formed in the low voltage region, it can be expected that the detection range is about 0.3V. Accordingly, it is possible to set DAC_top=4.9V, DAC_btm=4.6V for extracting the duplicated DAC from the sensing signal range formed at high voltage, and DAC_top=0.4V, DAC_btm=0.1V to extract the duplicated DAC from the signal range formed in Low Voltage.

When detecting an object in the Low Voltage area, the duplicated DAC for each CDA is extracted based on DAC_top=0.4V and DAC_btm=0.1V and stored in memory. When detecting an object in the High Voltage area, the duplicated DAC values are extracted and stored in memory based on DAC_top=4.9V and DAC_btm=4.6V, but the DAC value in the Low Voltage area and the DAC value in the High Voltage area are stored in different memory areas. And when detecting a signal in the Low Voltage area, the DAC value in the Low Voltage area is recalled and used, and when detecting a signal in the High Voltage area, the DAC value in the memory is recalled and used.

As described above, in the case of Bi direction driving, the present invention stores the DAC value of the low voltage region and the DAC value of the high voltage region in different memory regions.

In addition, when detecting a signal in the low voltage region, the DAC value of the low voltage region of the memory is recalled and used, and when detecting a signal in the high voltage region, the DAC value of the high voltage region of the memory is recalled and used.

As in the above embodiment, when one DAC is used for Bi direction driving, when the sensing signal range is Low Voltage, the DAC bias voltage is Low Voltage, and when the sensing signal range is High Voltage, the DAC bias voltage is High voltage.

On the other hand, when two DACs are used, one DAC always operates as a dedicated DAC in the high voltage area, and the other DAC is used exclusively when the sensing signal is low voltage.

Because the Operational Amplifier outputs only the difference between the First Sensing Signal and the Second Sensing Signal regardless of one direction or Bi-direction driving, the output of the Operational Amplifier is the same regardless of whether one direction or Bi-direction driving, for this reason, only single ADC that detects the output of the Operational Amplifier may be used.

When the First Stage Driving Voltage is Low Voltage and the Second Stage Driving Voltage is driving with the High Voltage configuration, and when the First Stage Driving Voltage is High Voltage and the Second Stage Driving Voltage is driving with the Low Voltage configuration, the reason and the connection method of the DAC and the Sensing Signal Line in the Operational Amplifier should be different are as described above.

Since the First Stage Driving Voltage and the Second Stage Driving Voltage are sequentially changed during Bi direction driving, the connection method of the DAC and Sensing Signal Line in the Operational Amplifier must also be changed in the connection method of the Operational Amplifier according to the change in the driving voltage.

Figure 19:
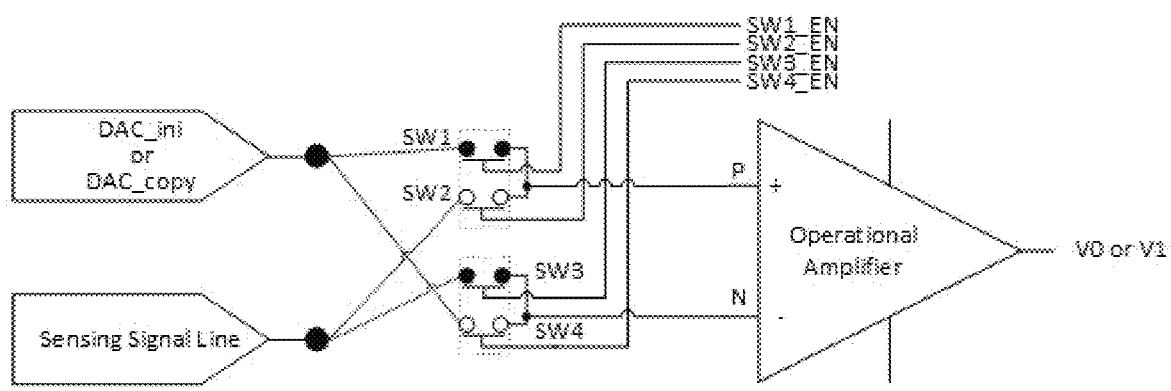
FIG. 19 is an embodiment of the present invention for a method of connecting the DAC and the signal line to the Operational Amplifier.

FIG. 19 is an embodiment of the present invention for a method of connecting a DAC and a signal line of an Operational Amplifier.

When the First Stage Driving Voltage is Low Voltage and the Second Stage Driving Voltage is High Voltage, the object signal is detected from High Voltage range, and as described above, the analog voltage of the duplicated DAC is connected to the positive input terminal of the Operational Amplifier and the Sensing Signal Line should be connected to the negative input terminal of the Operational Amplifier. This is a connection line connected to SW1 and SW3 of FIG. 19, and the SW1 and the SW3 are turned on by enable signals applied to the on/off terminals of the SW1 and the SW3. In addition, High Voltage is used for the Bias voltage of the DAC.

In addition, when the First Stage Driving Voltage is High Voltage and the Second Stage Driving Voltage is Low Voltage, that is, when a signal is detected at low voltage, the analog voltage of the duplicated DAC is connected to the negative input terminal of the Operational Amplifier and the Sensing Signal Line is connected to the positive input terminal of the amplifier. This is a connection line indicated by the SW2 and SW4 in FIG. 19, and SW2 and SW4 are turned on and executed by the enable signal applied to the on/off terminals of SW2 and SW4. Also, low voltage is applied to the bias voltage of the DAC.

As described above, in the present invention, when the Second Stage Driving Voltage is High Voltage, the DAC output voltage for detecting the object signal is connected to the positive input terminal of the Operational Amplifier during Bi-direction driving, and when the Second Stage Driving Voltage is Low Voltage, the DAC output voltage is connected to the negative input terminal of the Operational Amplifier. The Sensing Signal Line 202 is connected to the other terminal to which the DAC output voltage is not connected.

In addition, the enable signal connected to the on/off control terminals of SW1 to SW4 controls the turn-on or turn-off operation by the control operation of the CPU 460 or the logic unit of the Semiconductor IC.

The method of driving a single capacitor and the improvements in the case of driving the dual capacitor of the present invention are as follows.

Referring to the virtual data and calculated results in FIG. 13A, in the case of One Direction Driving, the Min-Max of Vp2−Vp1 is 1.429V, and an ADC to which a bias voltage of at least 1.5V is applied should be used. At this time, the resolution is about 1.5 mV/bit. In addition, in the case of Bi-Direction Driving, Vp2−Vp1 is 0.271V, and ADC to which a Bias voltage of 0.3V is applied may be used, and at this time, the resolution is 0.5 mV/bit.

Referring to the lowest worst case of the virtual data when the Object Capacitance Cobj is 0.2 pF, in the case of One Direction Driving, the voltage detected by the Operational Amplifier is 16 mV. This is about 10.6 code considering the resolution of 1.5 mV/bit. This is a sensitivity corresponding to about 1% of the total resolution and considering that the range of general noise is 2% to 3%, it is not suitable for use as a signal.

On the other hand, for Bi-Direction Driving, the voltage detected by the Operational Amplifier is 21 mV, which is 42 codes considering the resolution of 0.5 mV/bit. This is 4 times increase in sensitivity compared to One Direction Driving, and the sensitivity corresponds to about 4% of the total resolution, which is suitable for use as a signal.

As described above, the method of driving a plurality of capacitors including the Shielding Capacitor Cin_sd of the present invention is not affected by noise caused by interference with "other signal lines", conventionally, the sensitivity of the sensing signal is increased by at least four times by modifying and driving the internal capacitor that adversely affects the dispersion of the sensing signal by acting only as Dummy included in the denominator.

Meanwhile, referring to [Equation 4], the driving voltage is not applied only to the common electrode capacitor Ccm among the components of the denominator constituting the First Voltage before the object 20 appears. If a driving voltage is also applied to the Ccm driving layer 6, the voltage Vp2–Vp1 detected by [Equation 4] performing Bi-Direction Driving shows a more stable deviation, and at this time, the equation is as shown in [Equation 6-1] below.

$$V1 = \frac{(Vd2 - Vd1)*Cd + (Vcin2 - Vcin1)*Cin_{sd} + (Vcm2 - Vcm1)*Ccm}{Cd + Cin_{sd} + Ccm} - \frac{(Vd2 - Vd1)*Cd + (Vcin2 - Vcin1)*Cin\_sd + (Vcm2 - Vcm1)*Ccm}{Cd + Cin\_sd + Ccm + Cobj}$$ [Equation 6–1]

In order to detect object 20, the size of the first sensing signal of the Sensing Signal Line must always be constant. If for some reason, the size of the First Sensing Signal of any CDA 100 changes frequently, it is impossible to configure the device of the present invention.

In order not to change the amplitude of the First Sensing Signal formed by [Equation 4] in any CDA 100, the potential of the Sensing Signal Line 202, that is, the point P, must always be constant at the time when the First Stage Driving Voltage of the driving voltage is applied. In order to keep the potential of the point P constant at all times, the potential of the point P is always maintained the same by applying a known voltage to point P.

FIG. 20 is an embodiment of the present invention for applying a reset voltage to a Sensing Signal Line.

In the embodiment of FIG. 20, Reset switch1 Reset SW1 and Reset switch2 Reset SW2 are switches applying a Reset Voltage, one side of the reset switch is connected to the driving voltage, and the other side is connected to the point P, that is, a CDA signal line 200.

The Reset SW1 is connected to the inter-line capacitor Cd driving voltage, and the Reset SW2 is connected to the shielding capacitor Cin_sd. When the reset voltage is applied, only one of the Reset switch1 and the Reset switch2 is operated, and only one of the Reset switch1 and the Reset switch2 may be placed.

Assuming that only the Reset switch1 is placed, the Reset switch1 becomes a turn-on state when the First Stage Driving Voltage is applied, and the First Stage Driving Voltage Vd1 or Vd2 is applied to the Sensing Signal Line. If the driving voltage is operated in accordance with the type of ZONE A to ZONE D of FIG. 14, a low voltage of Vd1 is applied to the Sensing Signal Line 202 at the time when the First Stage Driving Voltage is applied, and the point P is charged with a voltage of Vd1.

In the embodiment of FIG. 18B, a Vd1 voltage which is a low voltage is applied to the Reset Voltage, and the applying of the reset voltage should be stopped before the Second Stage Driving Voltage is applied, and for this purpose, the Reset Switch 1 is turned off. Thereafter, after a predetermined time elapses after applying the Second Stage Driving Voltage, a voltage based on [Equation 6] is detected in the Operational Amplifier. [Equation 4] is an equation assuming that the initial voltage of the point P is 0V, and if the point P is charged with a reset voltage having an amplitude of Vd1 rather than 0V, [Equation 4] is represented by the following [Equation 10].

$$Vp2 - Vp1 = Vd1 + \frac{(Vd2 - Vd1)*Cd + (Vcin2 - Vcin1)*Cin\_sd}{Cd + Cin\_sd + Ccm}$$ [Equation 10]

Referring to [Equation 10], since the values of all factors are fixed values without change, the voltage detected according to equation always has a constant value. In addition, since [Equation 5] includes only Object Capacitor Cobj in the denominator of the above equation, and Object Capacitor Cobj is always sized according to the facing area and the facing distance with CDA 100, we can accurately detect the amount of change in Object Capacitor Cobj.

On the other hand, as in the embodiment of ZONE S of FIG. 14, in case First Stage Driving Voltage is High Voltage and Second Stage Driving Voltage is Low Voltage, the Reset voltage Vd2, which is a high voltage, is applied to the Sensing Signal Line through the switch 1, [Equation 4] is transformed into the following [Equation 11].

$$Vp2 - Vp1 = Vd2 + \frac{(Vd1 - Vd2)*Cd + (Vcin1 - Vcin2)*Cin\_sd}{Cd + Cin\_sd + Ccm}$$ [Equation 11]

Looking at [Equation 11], since Vd1–Vd2 and Vcin1–Vcin2 have negative values, it is a falling voltage based on the reset voltage Vd2. This voltage may be less than 0V, and since a negative signal should not be input to an Operational Amplifier using a single power supply, a voltage higher than the value of equation should be used for Vd2 in consideration of this point. In the case of a general embodiment, Vd2, which is the First Stage Driving voltage, satisfies this condition.

Therefore, in the present invention, the First Stage Driving Voltage is used as the reset voltage, and the reset voltage is applied by turning on the reset switch existing between the First Stage Driving Voltage and the Sensing Signal Line 202 and before the Second Stage Driving Voltage is applied, the reset switch is turned off to stop applying the reset voltage.

Also, according to the present invention, a reset voltage of the same amplitude is supplied to the Sensing Signal Lines of all columns in the group in which processing is performed to detect an object among a plurality of groups consisting of columns composed of a plurality of CDA 100.

In addition, if the First Stage Driving Voltage is High Voltage, the reset voltage is Vd2, which is High Voltage, and if the First Stage Driving Voltage is Low Voltage, the reset voltage is Vd1, which is Low Voltage, is used.

On the other hand, the second sensing signal based on [Equation 10] including the reset voltage is given by the following [Equation 12].

$$Vp2 - Vp1 = Vd1 + \frac{(Vd2 - Vd1)*Cd + (Vcin2 - Vcin1)*Cin\_sd}{Cd + Cin\_sd + Ccm + Cobj}$$ [Equation 12]

Since the Operational Amplifier detects only the difference between the First Sensing Signal and the Second Sensing Signal, the voltage output from the Operational Amplifier by [Equation 10] and [Equation 12] when the reset voltage is applied is the same as [Equation 6].

In addition, when a high reset voltage is applied based on [Equation 11], the second sensing signal is [Equation 13] below.

$$Vp2 - Vp1 = Vd2 + \frac{(Vd1 - Vd2)*Cd + (Vcin1 - Vcin2)*Cin\_sd}{Cd + Cin\_sd + Ccm + Cobj} \quad \text{[Equation 13]}$$

Based on [Equation 11] and [Equation 13], the First Stage Driving Voltage is High Voltage and the Second Stage Driving voltage is Low Voltage,
the output voltage V1 of the Operational Amplifier based on the Object Capacitor Cobj when the reset voltage Vd2 of the High Voltage is applied is [Equation 14] below.

$$V1 = \frac{(Vd1 - Vd2)*Cd + (Vcin1 - Vcin2)*Cin\_sd}{Cd + Cin\_sd + Ccm} - \frac{(Vd1 - Vd2)*Cd + (Vcin1 - Vcin2)*Cin\_sd}{Cd + Cin\_sd + Ccm + Cobj} \quad \text{[Equation 14]}$$

It can be seen that in [Equation 14], as in [Equation 6], the reset voltage is erased from the Operational Amplifier and has no effect on V1.

Referring to [Equation 6] and [Equation 14], the reset voltage does not affect the voltage V1 output from the Operational Amplifier. Since the purpose of applying the reset voltage is to always make the voltage of the Sensing Signal Line constant when the driving voltage is applied, using the driving voltage as the reset voltage does not require a separate reset voltage, so the circuit is simplified.

On the other hand, referring to the Data for the Bi-Direction Driving of FIG. 13A, when the reset voltages Vd1 and Vcin1 are 0V, the amplitude of Vp2–Vp1 is 4.615V to 4.886V, which has a variation range of 0.271V. If, among the values of Vd2–Vd1 detected by Bi-Direction Driving in FIG. 13A, the values of 4.615V, 4.688V, and 4.667V at the top can all be changed to about 4.7V, the variation range of Vp2–Vp1 is reduced to 0.186V, so higher-performance ADC resolution can be expected.

Figure 21:
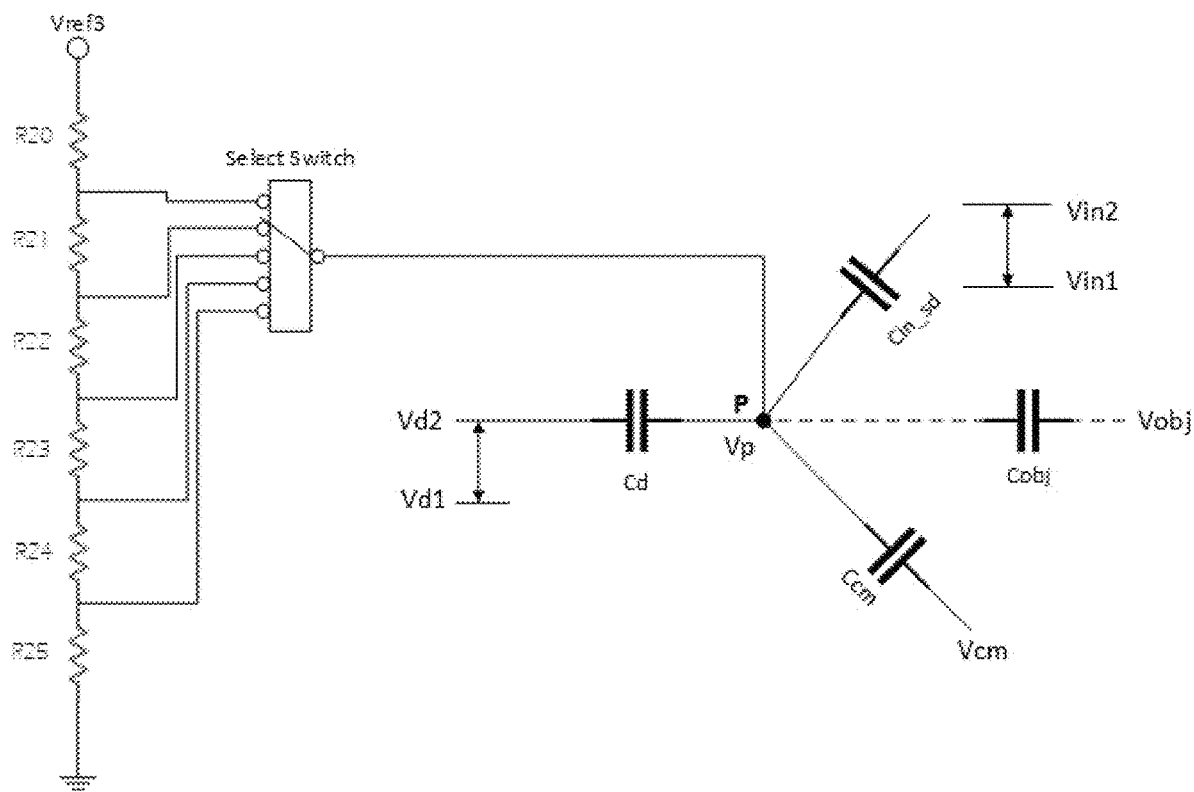
FIG. 21 is another embodiment of the present invention relating to a method for applying a reset voltage.

FIG. 21 is another embodiment of the present invention relating to a method for applying a reset voltage.

Referring to FIG. 21, the reference voltage Vref3 is connected to a Resistor String connected by a plurality of resistors. Vref3 is generated by an element having a bandgap reference (BGR) or a separate reference voltage. The Vref3 has a means capable of adjusting to have a predetermined voltage level, and an output level of the Vref3 is generally determined by a resistance ratio.

Another device for applying a reset voltage of the present invention can be easily implemented with a resistor string as in the embodiment of FIG. 21, and it is possible to output a precise output value and a large number of output values by using the resistance ratio.

The "Select Switch" that outputs one of the pluralities of reset voltages output through the resistor string is used as a reset switch.

In the embodiment of FIG. 21, "Select Switch" is a switch for selecting one of five inputs, and the reset voltage selected in the switch is connected to the point P of the Sensing Signal Line 200 to fix the point P to the reset voltage. When all five switches are turned off, the reset voltage output from the Resistor String is not connected to the point P, and all Select Switches are turned off before the Second Stage Driving Voltage is applied.

The reset voltage generated by the Resistor String may be supplied at voltages of different amplitudes for each CDA 100. Alternatively, a reset voltage of the same amplitude may be applied to all Sensing Signal Lines to which the driving voltage is applied at the same time. Also, a reset voltage having a different amplitude may be applied to each row.

For example, in a group of 10 columns consisting of 25 CDAs, a reset voltage of amplitude RST1 is applied to 10 CDAs included in the first row of the 10 columns, and when the second row is processed, the reset voltage may be different for each row, such as applying an RST2 reset voltage having a different amplitude from that of RST1.

According to this method, when a reset voltage of about 0.1V is used instead of a reset voltage of 0V in the CDA outputting 4.615V, 4.688V, or 4.667V among the values of Vd2–Vd1 detected by Bi-Direction Driving of FIG. 13A, the above values move an operating point of about 4.7V range, so, based on [Equation 4], the range of the voltage of Vp2–Vp1 detected using the virtual data of FIG. 13A is further reduced to about 0.2V, thereby further increasing the resolution of ADC.

Even if the amplitude of the reset voltage is different, the amplitude of the voltage V1 detected based on the object capacitor does not change.

Therefore, if the reset voltage is changed for each CDA so that the voltage levels of the First Sensing Signal having various levels determined for each CDA are located in the narrow range as possible, the resolution of the ADC may be further improved.

In the embodiment of FIG. 21, showing only five reset voltages is only one embodiment, and there are cases where the number of reset voltages output from the Resistor String is 8 or 16 or more, and the selection switch is also increased by the same quantity.

Figure 22:
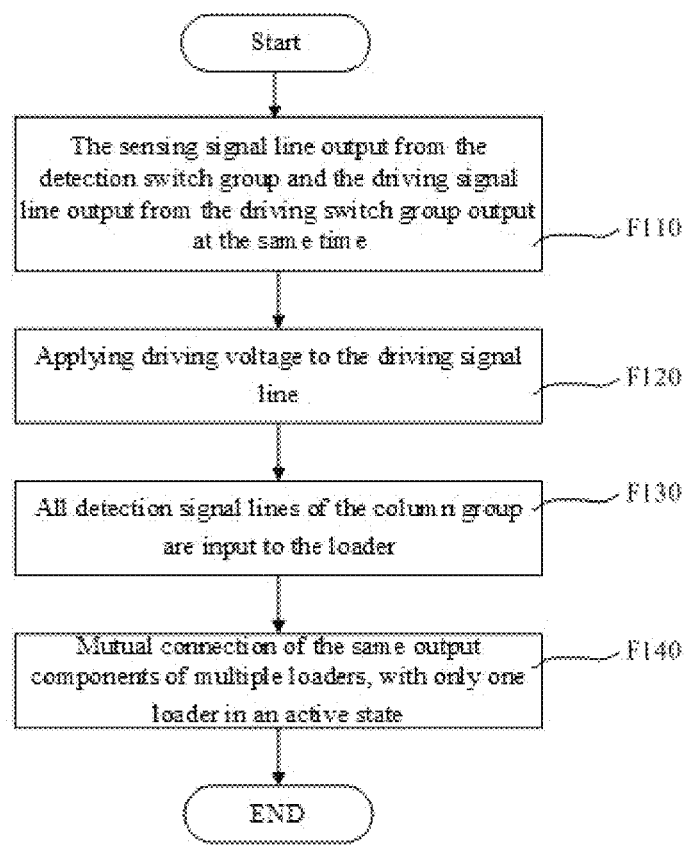
FIG. 22 is a flowchart representing an embodiment of the present invention related to a method for detecting capacitance.

The following is an embodiment of the present invention pertaining to a method for detecting capacitance. FIG. 22 represents an embodiment of the present invention in a flowchart illustrating the capacitance detection method.

Referring to FIG. 22, the initial step (F110) is a step where, by a turn-on signal formed on one of the multiple on/off control signal lines output from the decoder (436), a detection signal line is selected in the detection switch group (437-1), and multiple driving signal lines adjacent to the selected detection signal line are selected in the driving switch group (437-2), and the selected detection signal line and multiple driving signal lines are output simultaneously.

The second step (F120) is a step of applying a driving voltage to the multiple driving signal lines selected in the first step (F110) to detect the additional capacitance applied to the selected detection signal line; a driving voltage can also be applied to the shielding capacitance.

The third step (F130) is a step in which a detection signal line is selected for each column belonging to the column group where processing to detect the additional capacitance is being carried out, and the multiple selected detection signal lines are input to loaders (450) installed one for each column group.

The fourth step (F140) is a step where only one of the multiple loaders interconnected by identical output components is supplied with an enable signal, and all detection signal lines input to the loader supplied with the enable signal are output.

The effects of the present invention are not limited to the above-described effects, and it should be understood to include all effects that can be inferred from the configuration of the invention described in the detailed description or claims of the present invention.

The above description of the present invention is for illustration, and those of ordinary skill in the art to which the present invention pertains can understand that it can be easily modified into other specific forms without changing the technical spirit or essential features of the present invention. Therefore, it should be understood that the embodiments described above are illustrative in all respects and not restrictive. For example, individual devices described as a single type may be combined with each other to be implemented as a comprehensive device, and likewise, a comprehensive device may be implemented as a combined form of individual devices not described. The scope of the present invention is indicated by the following claims, and all changes or modifications derived from the meaning and scope of the claims and their equivalents should be construed as being included in the scope of the present invention.

DETAILED DESCRIPTION OF MAIN ELEMENTS

3: Common electrode
4: Color Layer
5: Color Filter Glass
6: Ccm Driving Layer
7: protective layer
10: Display part.
20: Object
100: CDA (Capacitor Detect Area)
101: Long-distance CDA
103: Short-distance CDA
150: Empty Area
200: CDA signal line
200-1: Pin Input Signal Line
201: Long-distance CDA signal line
202: Mid-distance CDA signal line
203: Short-distance CDA signal line
210: Column 1 Sensing Signal Line
210-1: Column 1 Driving Signal Line
220: Column 2 Sensing Signal Line
220-1: Column 2 Driving Signal Line
230: Column 3 Sensing Signal Line
230-1: Column 3 Driving Signal Line
240: Column 4 Sensing Signal Line
240-1: Column 4 Driving Signal Line
250-1: Group 1 Sensing Signal Line
250-2: Group 2 Sensing Signal Line
251: Column 1 First shielding area Driving Signal Line
261: Column 1 first shielding area
261-1: Column 1 first upper shielding area
261-2: Column 1 first lower shielding area
261-3: Column 1 first left and right shielding area.
262: Column 2 first shielding area
263: Column 1 second shielding area
264: Column 2 second shielding area
265: Group 1 third shielding area
266: Group 2 third shielding area
270-1: Group 1 Loading Signal Line (LD Signal Line)
270-2: Group 2 Loading Signal Line (LD Signal Line)
300: Connecting material
301: Attached part
302: Connection part
400: Semiconductor IC
401: Signal line input Pin
410: Signal Detector
420: Driving Unit
430-1: Operational Amplifier
430-2: AMP Input Signal Line Selection Unit
436: Decoder
437: Sensing/Driving Signal Line switch group
437-1: Sensing Signal Line switch group (Sensing Signal Line Switch Group, SSL SG)
437-2: Driving Signal Line switch group (Driving Signal Line Switch Group, DSL SG)
438: Switch group inner switches
450: Loader
450-1: The First Group Loader
450-2: The Second Group Loader
460: CPU
461: Substrate
462: Insulator
463: First Metal Layer
464: Second Metal Layer
465: 3rd Metal Layer
466: Passivation
490: Level Shifter

What is claimed is:

1. A capacitive detection device, comprising:
capacitor detect areas (CDAs) installed in a display device and extended in a horizontal direction and a vertical direction,
a) signal lines connected to the CDAs;
b) CDA columns composed of the CDAs extended in the vertical direction among the CDAs and the signal lines connected to the CDAs extended in a vertical direction;
c) a detection switch group and driving switch groups installed in each CDA column of b);
d) sensing signal lines output from the detection switch group of c) and driving signal lines output from the driving switch groups of c);
e) a decoder outputting on/off control signal lines and on/off control signals; and
a driver detecting an additional capacitance added to the CDA connected to the sensing signal line by applying a driving voltage to the driving signal lines when the sensing signal lines of d) and driving signal lines adjacent to the sensing signal lines simultaneously output by a turn-on signal formed on one of on/off control signal lines output from the decoder of e),
wherein in one CDA column of b), the signal lines of a) are connected to all the detection switch group and the driving switch groups of c).

2. The capacitive detection device of claim 1,
wherein the detection switch group and the driving switch groups of c) comprise internal switches,
wherein on/off control terminals of the internal switches selected from each of the detection switch group and the driving switch groups of c) are connected in series.

3. The capacitive detection device of claim 1,
wherein the on/off control signal lines of e) are sequentially connected to the on/off control terminals of the internal switches.

4. The capacitive detection device of claim 1,
wherein the driving signal line of d) is an output according to a following relationship, when an n-th CDA from the detection switch group of d) is an output as the sensing signal line,
"CDA(n, ±m), 1, 2, . . . m, m is a positive integer"
wherein CDAn is the number of the sensing signal line located on an n-th row, and the row number of a pair of the driving signal lines is [CDA(n+m), m=1 to m], and m is the number of pairs of the driving signal lines.

5. The capacitive detection device of claim 1,
wherein the signal lines of a) are connected to an input terminal of the detection switch group of c) with a leftward shift of one sequential position based on a sequence in which the signal lines of a) are connected to an input terminal of the detection switch group of c), and
wherein the signal lines of a) are connected to another one input terminal of the driving switch groups of c) with a rightward shift of one sequential position.

6. The capacitive detection device of claim 1,
wherein the signal lines of a) are connected to one input terminal of an operational amplifier installed in a semiconductor IC, and
wherein the driving voltage is applied to a shielding area formed on an upper or lower layer of the semiconductor IC where the signal lines of a) is arranged and facing the signal lines of a) to detect an additional capacitance added to the CDA.

7. The capacitive detection device of claim 1,
wherein loaders are installed for each of column groups composed of the CDA columns of b), and the sensing signal lines output one by one from the CDA columns within same column groups are input to the loaders installed for each of the column group.

8. The capacitive detection device of claim 7,
wherein outputs of the loaders installed in the column groups are connected for same output components, and an enable signal is applied to only one of the loaders, and the sensing signal line input to the loader with the enabled signal applied is only output.

9. The capacitive detection device of claim 8,
wherein the on/off control signal lines of e) are output from a single decoder and are connected to on/off control terminals of all switch groups of the column groups.

10. The capacitive detection device of claim 8,
wherein the sensing signal lines output from the loaders are connected to an AMP input signal line selection part and are sequentially selected one by one to be input to one input terminal of an operational amplifier.

11. The capacitive detection device of claim 10,
wherein a digital-to-analog converter (DAC) output is connected to other input terminal of the operational amplifier, and the operation amplifier outputs a voltage difference between the DAC output and a voltage formed on the sensing signal line.

12. The capacitive detection device of claim 11,
wherein the DAC output is identical in magnitude to the voltage detected on the sensing signal line when no additional capacitance is added to the CDAs connected to the sensing signal line.

13. The capacitive detection device of claim 1,
wherein the driving signal lines of e) are connected to one another, and same driving voltage is applied.

14. The capacitive detection device of claim 1,
wherein a magnitude the driving voltage applied to the driving signal lines and a magnitude of the driving voltage applied to a shielding area are different.

15. The capacitive detection device of claim 1,
wherein the decoder of e) receives inputs of "Start Clock" and "Clock", and one of the on/off control signals outputted in a manner identical to an operation of a shift register in response to "the Start Clock" and "the Clock" signals sequentially outputs a turn-on state voltage.

16. The capacitive detection device of claim 1,
wherein the detection switch group, the driving switch groups, loaders, an AMP input signal line selection part, or the decoder is installed inside the display device.

17. The capacitive detection device of claim 16,
wherein the detection switch group, the driving switch groups, the loaders, or the AMP input signal line selection part includes internal switches, and the internal switches use a switching element identical to a switching element outputs pixel data of the display device.

18. The capacitive detection device of claim 17,
wherein a magnitude of turn-on and turn-off voltages for on/off control terminals of the internal switches included in the detection switch group, the driving switch groups, the loaders, or the AMP input signal line selection part are identical to the magnitude of the turn-on voltage and turn-off voltage outputted from a Gate Drive IC of the display device.

19. The capacitive detection device of claim 1,
wherein decoder input control signal of e) or the signal provided to an enable terminal of loaders is input to a level shifter output from a semiconductor IC and installed in the display device, the level shifter converts an input signal to a high level or low level voltage of same magnitudes as used for a switching element of the display device and outputs it, and a converted output of the level shifter is input to the decoder of e) or the enable terminal of the loaders.

20. The capacitive detection device of claim 19,
wherein the high level voltage and the low level voltage output from the decoder are identical to the high level voltage and the low level voltage output from a Gate Drive IC of the display device.

21. The capacitive detection device of claim 8,
wherein when the loaders are installed inside the display device and an AMP input signal line selection part is installed inside a semiconductor IC, the output of the loaders are transferred to the AMP input signal line selection part through a connection part, and the number of output signals of the loaders passing through the connection part is at least equal to the number of columns included in the column groups.

22. The capacitive detection device of claim 16,
wherein the on/off control signal line output from the decoder or an output component-specific connection signal line of the loaders are patterned using a horizontal metal or gate metal of the display device, and the signal lines output from the loaders and input to the AMP input signal line selection part use vertical metal or source metal of the display device.

23. A capacitive detection method, the method comprising:
a) a step of selecting sensing signal lines by a turn-on signal formed on one of on/off control signal lines output from a decoder, selecting driving signal lines adjacent to the sensing signal lines selected from driving switch groups, and simultaneously outputting the selected sensing signal lines and driving signal lines;
b) a step of applying a driving voltage to the driving signal lines selected in the a) step to detect an additional capacitance to the selected sensing signal lines;
c) a step of selecting one of the sensing signal lines for each column in the column group where the processing of detecting additional capacitance is proceeded, and inputting the selected sensing signal lines to loaders each installed for the column group; and d) a step of applying an enable signal to only one of the loaders interconnected for the same output component, and outputting only the sensing signal lines input to the loaders where the enable signal is applied.

\* \* \* \* \*